United States Patent
Tanaka et al.

(10) Patent No.: US 7,851,877 B2
(45) Date of Patent: Dec. 14, 2010

(54) LOGIC CIRCUIT AND SINGLE-ELECTRON SPIN TRANSISTOR

(75) Inventors: Masaaki Tanaka, Saitama (JP); Satoshi Sugahara, Kanagawa (JP); Hai Nam Pham, Tokyo (JP)

(73) Assignee: Japan Science and Technology Agency, Kawaguchi-Shi (JP)

( * ) Notice: Subject to any disclaimer, the term of this patent is extended or adjusted under 35 U.S.C. 154(b) by 492 days.

(21) Appl. No.: 11/886,564

(22) PCT Filed: Feb. 2, 2006

(86) PCT No.: PCT/JP2006/301744

§ 371 (c)(1),
(2), (4) Date: Dec. 28, 2007

(87) PCT Pub. No.: WO2006/100835

PCT Pub. Date: Sep. 28, 2006

(65) Prior Publication Data

US 2009/0039401 A1  Feb. 12, 2009

(30) Foreign Application Priority Data

Mar. 24, 2005  (JP) .............................. 2005-085260

(51) Int. Cl.
*H01L 29/82* (2006.01)
(52) U.S. Cl. .................. 257/421; 257/30; 257/295; 257/E29.323
(58) Field of Classification Search .................. 257/30, 257/295, 421, 422, E29.323
See application file for complete search history.

(56) References Cited

U.S. PATENT DOCUMENTS

| 5,838,021 | A | * | 11/1998 | Ancona | 257/30 |
| 5,877,511 | A | * | 3/1999 | Tanamoto et al. | 257/30 |
| 6,066,867 | A | * | 5/2000 | Nakamura | 257/295 |
| 6,787,795 | B2 | * | 9/2004 | Uchida et al. | 257/30 |
| 2004/0238808 | A1 | * | 12/2004 | Fraboulet et al. | 257/9 |

FOREIGN PATENT DOCUMENTS

| JP | A-11-168205 | 6/1999 |
| JP | A-2004-281548 | 10/2004 |

OTHER PUBLICATIONS

Tomohiro Matsuno et al.; "Novel Reconfigurable Logic Gates Using Spin Metal-Oxide-Semiconductor Filed-Effect Transistors"; *Japanese Journal of Applied Physics*; vol. 43; No. 9A, 2004; pp. 6032-6037.

(Continued)

*Primary Examiner*—Victor A Mandala
*Assistant Examiner*—Scott Stowe
(74) *Attorney, Agent, or Firm*—Oliff & Berridge, PLC

(57) ABSTRACT

A logic circuit that can reconfigure its functions in a nonvolatile manner and a single-electron transistor to be used in the logic circuits are provided. The logic circuit has a single-electron spin transistor that includes: a source; a drain; an island that is provided between the source and the drain, and has tunnel junctions between the island and the source and drain; and a gate that is capacitively coupled to the island. In this logic circuit, at least one of the source, the drain, and the island includes a ferromagnetic material having a variable magnetization direction.

44 Claims, 33 Drawing Sheets

OTHER PUBLICATIONS

Masaaki Tanaka, "Semiconductor spin-electronics—Current Status and future prospects-"; *Applied Physics*; vol. 73, No. 4 2004; pp. 514-515.

Marc Pirmann et al.; "Asymmetric tunable tunneling magnetoresistance in single-electron transistors"; *Journal of Magnetism and Magnetic Materials*; 219; 2000; pp. 104-108.

* cited by examiner

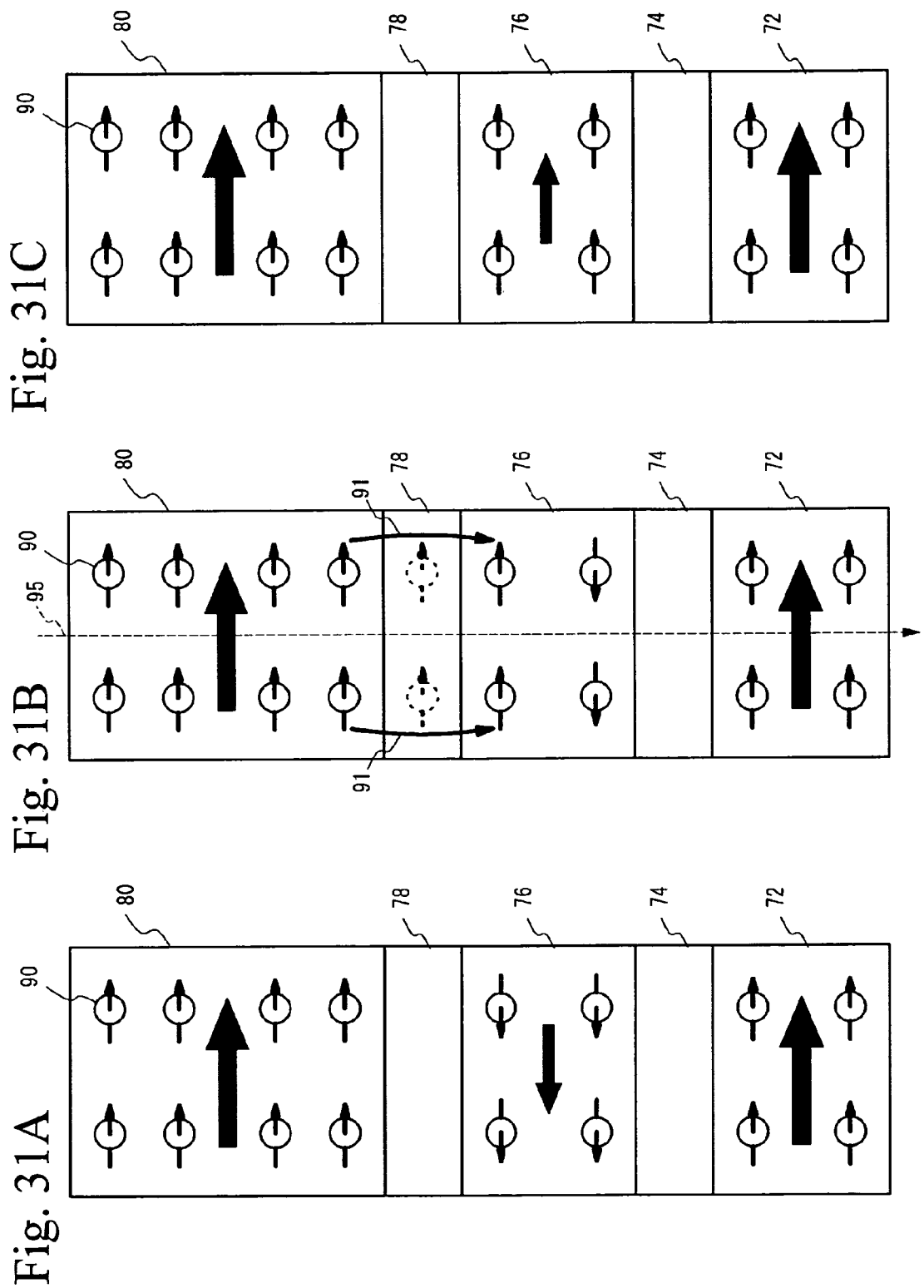

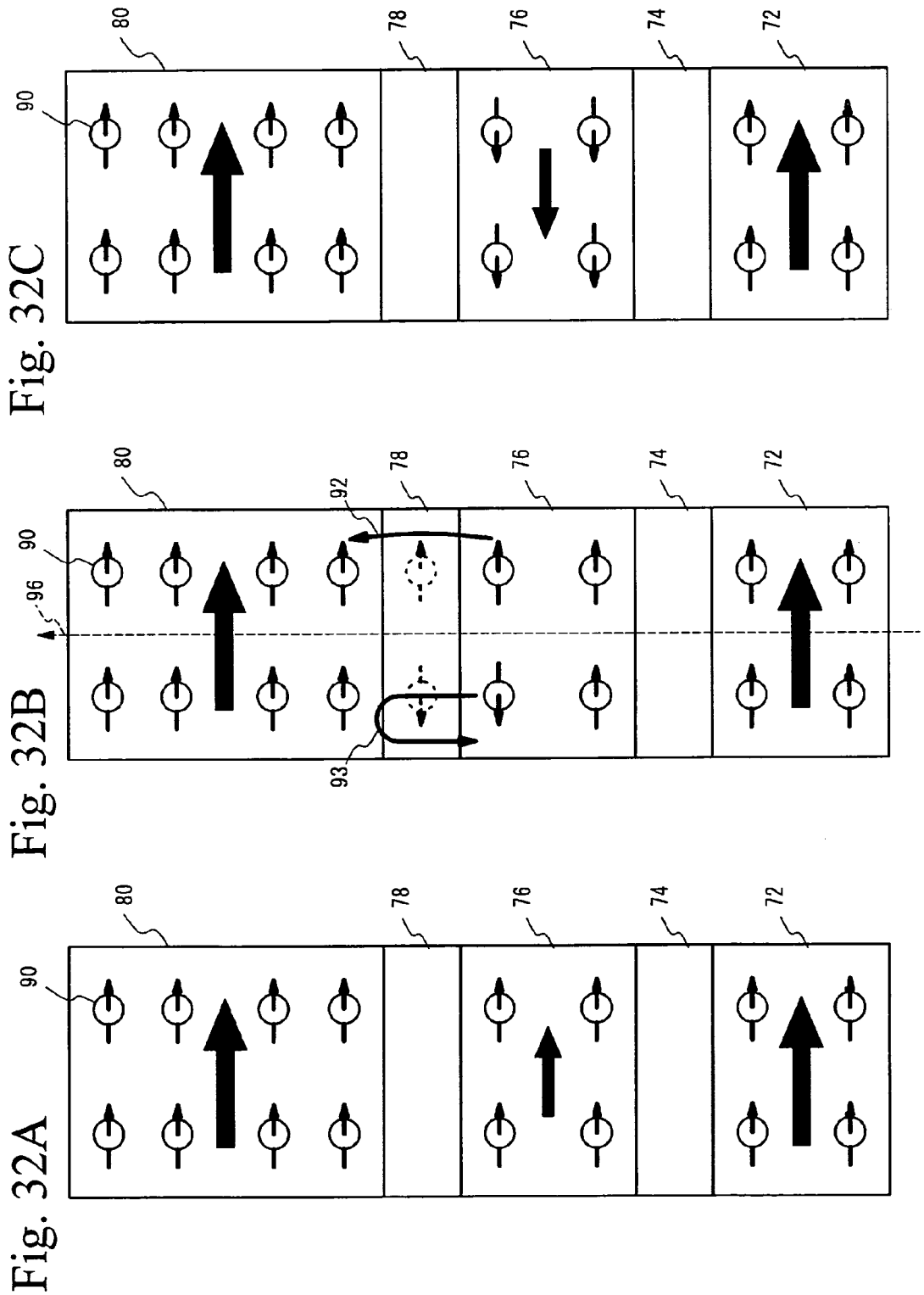

LOGIC CIRCUIT AND SINGLE-ELECTRON SPIN TRANSISTOR

FIELD OF THE INVENTION

The present invention relates to logic circuits and single-electron spin transistors, and more particularly, to a logic circuit that can reconfigure its functions and single-electron spin transistors

BACKGROUND OF THE INVENTION

Having short development cycles, logic circuits that can reconfigure functions according to programs have been used for mobile devices such as portable telephone devices. Also, such logic circuits have been studied as the key devices of information systems with reprogrammable hardware. Reconfigurable logic circuits include circuits having FPGAs (Field Programmable Logic Arrays) of the LUT (Look Up Table) type or vMOS circuits. However, those circuits have the problems of being volatile and having a large number of elements.

To solve those problems, a circuit including spin transistors having spin-dependent conductivity, such as spin MOSFETs, is disclosed in Non-Patent Reference 1. The structure of a spin MOSFET is shown in FIG. 1(a) of Non-Patent Reference 1. A spin MOSFET has the same structure as a MOSFET, except that the source and the drain contain a conductive ferromagnetic material. In a case where the magnetization directions of the source and the drain are parallel to each other (parallel arrangement), the output current is different from the output current observed in a case where the magnetization directions of the source and the drain are antiparallel to each other (antiparallel arrangement) (FIG. 1(b) of Non-Patent Reference 1).

A logic circuit that utilizes the variable conductance by changing the magnetization directions to control the logic threshold value of an inverter circuit is disclosed (FIG. 8 of Non-Patent Reference 2: Conventional Technique 1). This inverter circuit has a spin MOSFET as one of the FETs. The magnetization arrangement of the spin MOSFET is switched between the parallel arrangement and the antiparallel arrangement, so as to control the logic threshold value of the inverter circuit.

A logic circuit that has an AND circuit function and an OR circuit function by changing the magnetization arrangement of the spin MOSFET with the use of the above inverter circuit is also disclosed (FIG. 2(a) of Non-Patent Reference 1: Conventional Technique 2). Further, a logic circuit that has all-symmetric Boolean functions (AND, OR, XOR, NAND, NOR, XNOR, ALL0, and ALL1) with the use of four spin MOSFETs and three inverter circuits is disclosed (FIG. 4(a) of Non-Patent Reference 1: Conventional Technique 3).

In this specification, the low level of a logic circuit is represented by "0", the high level is represented by "1", and the intermediate level between the low level and the high level is represented by "0.5". "Analog inputs" are inputs of the intermediate level "0.5 " as well as the inputs "0" and "1" to be input to a logic circuit (or an inverter circuit, for example), in response to a two-input "0" or "1" that is input to input terminals of the logic circuit. Also, "weighting of an analog input" is the rate at which the input of an input terminal is input to a transistor in a case where the logic circuit includes two or more transistors connected to the input terminals. By each conventional technique, a floating gate formed with a capacitance is used to make an analog input to the logic circuit of the conventional technique from a two-input input terminal. "Reconfiguring a logic circuit function in a nonvolatile manner" is being able to change the logic threshold value in a nonvolatile manner in a case of an inverter circuit, for example, and is being able to switch between an AND circuit function and an OR circuit function in a nonvolatile manner in a case of a Boolean logic circuit, for example, where the same circuits are used.

[Non-Patent Reference 1]
Tomohiro Matsuno, Satoshi Sugahara, and Masaaki Tanaka, "Novel Reconfigurable Logic Gates Using Spin Metal-Oxide-Semiconductor Field-Effect Transistors", Japanese Journal of Applied Physics, Japan Society of Applied Physics, 2004, Vol. 43, No. 9A, p.p. 6032-6037

[Non-Patent Reference 2]
Masaaki Tanaka, "Semiconductor Spin Electronics", Applied Physics, Japan Society of Applied Physics, 2004, Vol. 73, No. 4, p.p. 514-515

A spin MOSFET, however, is based on a MOSFET and involves a large charge amount. Therefore, to make an analog input to a logic circuit including a spin MOSFET, it is necessary to use a large-area floating gate. For example, it is necessary to prepare a floating gate having an area 100 or more times as large as the area of one MOSFET. As a result, the area of the logic circuit becomes large. Moreover, since a spin MOSFET is based on a MOSFET, the current consumption and the area of each transistor are large.

DISCLOSURE OF THE INVENTION

It is therefore an object of the present invention to provide a logic circuit that can reconfigure the functions of a logic circuit in a nonvolatile manner and has a small circuit area and small power consumption, and to provide single-electron spin transistors to be used in the logic circuit.

The present invention provides a logic circuit that includes a single-electron spin transistor that has a source, a drain, an island that is provided between the source and the drain, and a gate that is capacitively coupled to the island, a tunnel junction being provided between the source and the island, another tunnel junction being provided between the drain and the island. In this logic circuit, at least one of the source, the drain, and the island includes a ferromagnetic material having a reversible magnetization direction. In accordance with the present invention, the conductance between the source and the drain can be controlled by changing the magnetization direction of the single-electron spin transistor. By doing so, a logic circuit that can reconfigure functions in a nonvolatile manner can be provided. Further, as the single-electron spin transistor is employed, a logic circuit that has a small circuit area and small power consumption can be provided.

In this logic circuit, the source and the drain of the single-electron spin transistor may include ferromagnetic materials magnetized in the same direction, and the island may include the ferromagnetic material having the variable magnetization direction. With this arrangement, the conductance between the source and the drain can be certainly controlled, and a logic circuit that is suitable for reconfiguring the functions of a logic circuit in a nonvolatile manner can be provided.

In this logic circuit, the single-electron spin transistor may further include a substrate, the island, the source, the drain, and the gate may be formed on the substrate, the source, the drain, and the gate may be formed on sides of the island, and the gate may be capacitively coupled to the island via a space existing between the gate and the island. With this arrangement, the area of the gate capacitance can be made smaller, and the circuit area can be made smaller.

In this logic circuit, the single-electron spin transistor may further include a substrate, the source, the drain, and the island may be stacked on the substrate, the gate may be formed on a side of the island, and the gate may be capacitively coupled to the island via a space existing between the gate and the island. With this arrangement, the area of the gate capacitance can be made smaller, and the circuit area can be made smaller.

In this logic circuit, a logic circuit function may be reconfigured in a nonvolatile manner by changing the variable magnetization direction of the ferromagnetic material of the single-electron spin transistor. In accordance with the present invention, a logic circuit that can reduce the circuit area and the power consumption can be provided by employing the single-electron spin transistor.

In this logic circuit, the logic circuit function is a logic threshold value of an inverter circuit or a function of a Boolean logic circuit.

This logic circuit may include: a plurality of input terminals; and a plurality of single-electron spin transistors, each of the single-electron spin transistors being the above described single-electron spin transistor. In this logic circuit, the weighting of analog inputs from the plurality of input terminals to the plurality of single-electron spin transistors may be performed with a plurality of gate capacitances of the respective single-electron spin transistors connected to the respective input terminals. In accordance with the present invention, analog inputs can be formed with the gate capacitances between the gates and the islands. Thus, a logic circuit that does not require a floating gate and has a small circuit area can be provided.

This logic circuit may further include a first inverter circuit that includes: a first single-electron spin transistor that has a source connected to an output terminal, a gate connected to an input terminal, and a drain connected to a first power supply terminal; and a second single-electron spin transistor that has a drain connected to the output terminal, a gate connected to the input terminal, and a source connected to a second power supply terminal. In this first inverter circuit, each of the first single-electron spin transistor and the second single-electron spin transistor is the above described single-electron spin transistor.

In this logic circuit, when "0" is input to the input terminal, the first single-electron spin transistor is switched on, and the second single-electron spin transistor is switched off. When "1" is input to the input terminal, the first single-electron spin transistor is switched off, and the second single-electron spin transistor is switched on.

In this logic circuit, the first inverter circuit controls the logic threshold value in a case where a magnetization arrangement of the first single-electron spin transistor is a parallel arrangement while a magnetization arrangement of the second single-electron spin transistor is an antiparallel arrangement, and in a case where the magnetization arrangement of the first single-electron spin transistor is an antiparallel arrangement while the magnetization arrangement of the second single-electron spin transistor is a parallel arrangement.

In the first inverter circuit of this logic circuit, the input terminal may include a first input terminal and a second input terminal, and the combination of an input to the first input terminal and an input to the second input terminal may be analog inputs to the first inverter circuit.

In the first inverter circuit of this logic circuit, the first input terminal may be connected to a first gate of the first single-electron spin transistor and to a first gate of the second single-electron spin transistor, and the second input terminal may be connected to a second gate of the first single-electron spin transistor and to a second gate of the second single-electron spin transistor.

In the first inverter circuit of this logic circuit, the weighting of an analog input of an input from the first input terminal to the first single-electron spin transistor may be substantially the same as the weighting of an analog input of the input from the first input terminal to the second single-electron spin transistor, and the weighting of an analog input of an input from the second input terminal to the first single-electron spin transistor may be substantially the same as the weighting of an analog input of the input from the second input terminal to the second single-electron spin transistor.

In the first inverter circuit of this logic circuit, the capacitance value of a first gate capacitance of the first single-electron spin transistor may be substantially the same as the capacitance value of a first gate capacitance of the second single-electron spin transistor, and the capacitance value of a second gate capacitance of the first single-electron spin transistor may be substantially the same as the capacitance value of a second gate capacitance of the second single-electron spin transistor.

In the first inverter circuit of this logic circuit, the weighting of the analog inputs of the input from the first input terminal to the first single-electron spin transistor and the second single-electron spin transistor may be substantially the same as the weighting of the analog inputs of the input from the second input terminal to the first single-electron spin transistor and the second single-electron spin transistor. With this arrangement, a logic circuit that can reconfigure all-symmetric Boolean functions in a nonvolatile manner can be provided.

In the first inverter circuit of this logic circuit, the capacitance values of the first gate capacitance of the first single-electron spin transistor may be substantially same as the first gate capacitance of the second single-electron spin transistor, and the capacitance values of the second gate capacitance of the first single-electron spin transistor may be substantially same as the second gate capacitance of the second single-electron spin transistor. With this arrangement, a logic circuit that can reconfigure a symmetric Boolean function in a nonvolatile manner can be provided.

In the first inverter circuit of this logic circuit, the weighting of the analog inputs of the input from the first input terminal to the first single-electron spin transistor and the second single-electron spin transistor may be different from the weighting of the analog inputs from the second input terminal to the first single-electron spin transistor and the second single-electron spin transistor. With this arrangement, a logic circuit that can reconfigure a asymmetric Boolean function in a nonvolatile manner can be provided.

In the first inverter circuit of this logic circuit, the capacitance values of the first gate capacitance of the first single-electron spin transistor and the first gate capacitance of the second single-electron spin transistor may be different from the capacitance values of the second gate capacitance of the first single-electron spin transistor and the second gate capacitance of the second single-electron spin transistor. With this arrangement, a logic circuit that can reconfigure a asymmetric Boolean function in a nonvolatile manner can be provided.

In this logic circuit, the first inverter circuit may have the function of a two-input NOR circuit in a case where the magnetization arrangement of the first single-electron spin transistor is the antiparallel arrangement while the magnetization arrangement of the second single-electron spin transistor is the parallel arrangement, and the first inverter circuit may have the function of a two-input NAND circuit in a case where the magnetization arrangement of the first single-electron spin transistor is the parallel arrangement while the magnetization arrangement of the second single-electron spin transistor is the antiparallel arrangement. With this arrangement, a logic circuit that can reconfigure a two-input NOR circuit function and a two-input NAND circuit function in a nonvolatile manner can be provided.

In this logic circuit, the output terminal of the first inverter circuit may be connected to an input terminal of a second inverter circuit, to form a two-input OR circuit function and a two-input AND circuit function. With this arrangement, a logic circuit that can reconfigure a two-input OR circuit function and a two-input AND circuit function in a nonvolatile manner can be provided.

In this logic circuit, the second inverter circuit may be an inverter circuit including a single-electron transistor. With this arrangement, the logic circuit can function as a logic circuit with higher accuracy, even if the output from the first inverter circuit is small.

This logic circuit may further include: a third single-electron spin transistor that has a source connected to the output terminal of the first inverter circuit and a drain connected to a third power supply terminal; and a fourth single-electron spin transistor that has a drain connected to the output terminal of the first inverter circuit and a source connected to a fourth power supply terminal. In this logic circuit, each of the third single-electron spin transistor and the fourth single-electron spin transistor is the above described single-electron spin transistor.

In this logic circuit, when "0" is output from the first inverter circuit, the third single-electron spin transistor is switched on, and the fourth single-electron spin transistor is switched off. When "1" is output from the first inverter circuit, the third single-electron spin transistor is switched off, and the fourth single-electron spin transistor is switched on.

This logic circuit may further include: a third inverter circuit that has an input terminal connected to the first input terminal and the second input terminal of the first inverter circuit, an output terminal connected to a gate of the third single-electron spin transistor, and has a logic threshold value greater than 0.5; and a fourth inverter circuit that has an input terminal connected to the first input terminal and the second input terminal of the first inverter circuit, an output terminal connected to a gate of the fourth single-electron spin transistor, and has a logic threshold value smaller than 0.5.

In this logic circuit, the weighting of analog inputs from the first input terminal and the second input terminal to the third inverter circuit, and the weighting of analog inputs from the first input terminal and the second input terminal to the fourth inverter circuit may be substantially the same as the weighting of analog inputs from the first input terminal and the second input terminal to the first inverter circuit. With this arrangement, a logic circuit that can reconfigure all symmetric Boolean functions in a nonvolatile manner can be provided.

In this logic circuit, each of the third inverter circuit and the fourth inverter circuit may be an inverter circuit including a single-electron transistor. With this arrangement, the circuit area and the power consumption can be made smaller.

This logic circuit may further include a fifth inverter circuit that has an input terminal connected to the output terminal of the first inverter circuit. With this arrangement, a logic circuit that can reconfigure all symmetric Boolean functions in a nonvolatile manner with higher accuracy can be provided.

In this logic circuit, the fifth inverter circuit may be an inverter circuit including a single-electron transistor. With this arrangement, the logic circuit can function as a logic circuit with higher certainty, even if the output from the first inverter circuit is small.

This logic circuit may have a circuit that can realize all symmetric Boolean functions by switching the magnetization arrangement of each of the first single-electron spin transistor, the second single-electron spin transistor, the third single-electron spin transistor, and the fourth single-electron spin transistor, between the parallel arrangement and the antiparallel arrangement.

The present invention also provides a single-electron spin transistor that includes: a substrate; a source that is formed on the substrate; an island that is formed on the source and has a tunnel junction between the source and the island; a drain that is formed on the island and has a tunnel junction between the island and the drain; and a gate that is formed on a side of the island, and is capacitively coupled to the island via a space existing between the island and the gate. In this single-electron spin transistor, at least one of the source, the drain, and the island includes a ferromagnetic material having a variable magnetization direction. In accordance with the present invention, the film thickness of each layer can be controlled with precision. Accordingly, the degree of freedom in transistor design is increased, and desired characteristics can be readily obtained. Also, as a transistor is formed in the vertical direction, the transistor area is made smaller, and the higher integration can be achieved.

The present invention also provides a single-electron spin transistor that includes: a substrate; a drain that is formed on the substrate; an island that is formed on the drain and has a tunnel junction between the drain and the island; a source that is formed on the island and has a tunnel junction between the island and the source; and a gate that is formed on a side of the island, and is capacitively coupled to the island via a space existing between the island and the gate. In this single-electron spin transistor, at least one of the source, the drain, and the island includes a ferromagnetic material having a variable magnetization direction. In accordance with the present invention, the film thickness of each layer can be controlled with precision. Accordingly, the degree of freedom in transistor design is increased, and desired characteristics can be readily obtained. Also, as a transistor is formed in the vertical direction, the transistor area is made smaller, and the higher integration can be achieved.

In this single-electron spin transistor, the source and the drain include ferromagnetic materials magnetized in the same direction, and the island includes the ferromagnetic material having the variable magnetization direction. In accordance with the present invention, a variation in threshold current caused by applying the spin injection magnetization reversal method can be restrained.

In this single-electron spin transistor, the magnetization direction of the island may be changed by injecting carriers from the source or the drain into the island. In accordance with the present invention, the power consumption for changing the magnetization direction of the island can be reduced.

In this single-electron spin transistor, one of the source and the drain may have a greater film thickness than the other one of the source and the drain. In accordance with the present invention, the magnetization direction of the island can be changed from the antiparallel arrangement to the parallel arrangement by injecting carriers from one of the source and the drain that has the greater film thickness, to the other one of the source and the drain. The magnetization direction of the island can be changed from the parallel arrangement to the antiparallel arrangement by injecting carriers from one of the source and the drain that has the smaller film thickness, to the other one of the source and the drain.

In this single-electron spin transistor, one of the source and the drain may have a higher spin polarization rate than the other one of the source and the drain. In accordance with the present invention, the magnetization direction of the island can be changed from the antiparallel arrangement to the parallel arrangement by injecting carriers from one of the source and the drain that has the higher spin polarization rate, to the other one of the source and the drain. The magnetization direction of the island can be changed from the parallel arrangement to the antiparallel arrangement by injecting carriers from one of the source and the drain that has the lower spin polarization rate, to the other one of the source and the drain.

In this single-electron spin transistor, the island may be a single-electron spin transistor that is a carrier-induced ferromagnetic semiconductor film. In accordance with the present invention, the carrier density in the island is changed by adjusting the electric field applied on the island, so that the magnetization of the island can be more easily changed.

In this single-electron spin transistor, the gate is provided on either side of the island; and the magnetization direction of the island is changed by applying a voltage between the gates and injecting carriers from the source or the drain into the island. In accordance with the present invention, the power consumption for changing the magnetization direction of the island can be further reduced.

In this single-electron spin transistor, the voltage applied between the gates is such a voltage as to reduce carrier density in the island. In accordance with the present invention, the carrier density in the island is reduced, and the magnetization of the island becomes smaller. Accordingly, the power consumption for changing the magnetization direction of the island can be further reduced.

As described above, in accordance with the present invention, the conductance of a single-electron spin transistor can be controlled by changing the magnetization direction of the single-electron spin transistor. With this arrangement, a logic circuit that can reconfigure a logic circuit function in a nonvolatile manner can be provided. Further, as the charge amount to be controlled in a single-electron spin transistor, analog inputs can be made by combining the small gate capacitances between the gates and the island. Accordingly, there is no need to employ a floating gate having a large area. With this arrangement, a very small circuit area can be realized. Also, as a single-electron spin transistor deals with single electrons, the power consumption is small, and the area of the transistor can be made small. Thus, a logic circuit and a single-electron spin transistor that can reconfigure logic circuit functions in a nonvolatile manner and have small circuit areas and small power consumption can be provided.

BRIEF DESCRIPTION OF THE DRAWINGS

FIGS. 31A through 31C are cross-sectional views (1) illustrating the method of changing the magnetization arrangement of the island of the SEST in accordance with the fifth embodiment;

FIGS. 32A through 32C are cross-sectional views (2) illustrating the method of changing the magnetization arrangement of the island of the SEST in accordance with the fifth embodiment;

DESCRIPTION OF THE PREFERRED EMBODIMENTS

First, a single-electron spin transistor (hereinafter referred to as a SEST) that is a component of the present invention is described.

Figure 1:
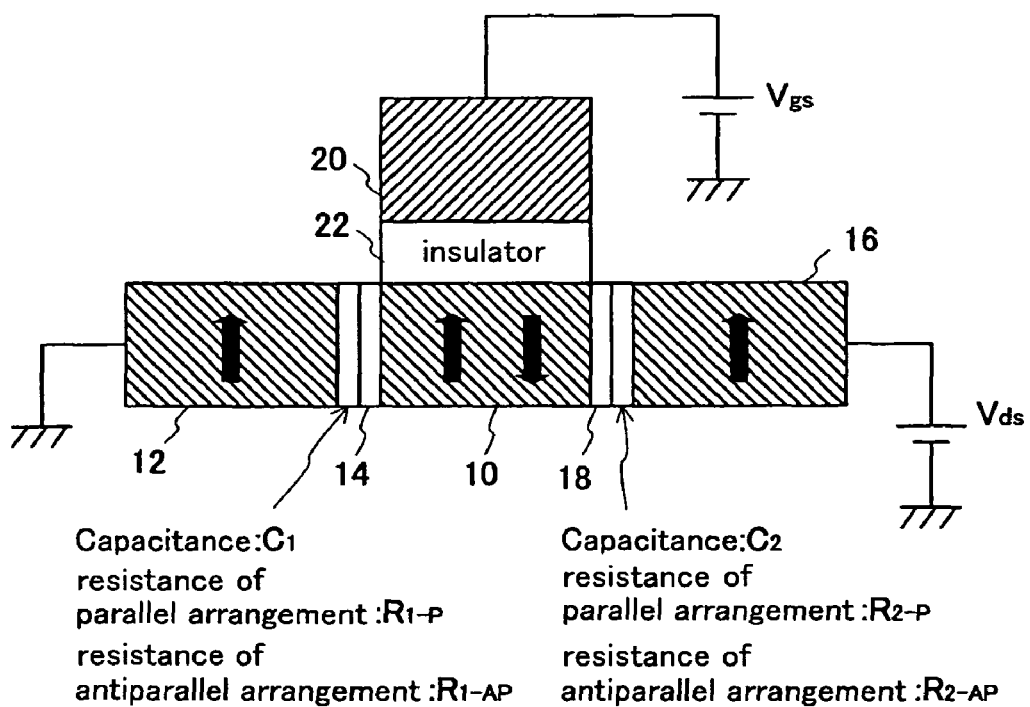
FIG. 1 is a schematic view of the structure of a single-electron spin transistor (SEST) used in embodiments of the present invention.

FIG. 1 is a schematic view of a SEST. A SEST is a single-electron transistor (hereinafter referred to as a SET) using ferromagnetic material. First, a SET that does not include a ferromagnetic material is described. A SET includes a source 12, a drain 16, an island 10 that is provided between the source 12 and the drain 16 and has tunnel junctions 14 and 18 between the island 10 and the source 12 and the drain 16, respectively, and a gate 20 that is connected to the island 10 via a gate capacitance (capacitance value $C_g$) formed with an insulating film 22 (or a space). Here, the tunnel functions 14 and 18 are formed with insulating films of approximately 2 nm, for example, and have capacitance values $C_1$ and $C_2$, respectively. As the cross section and film thickness of each of the tunnel junctions 14 and 18 of the SET are very small, the capacitance values $C_1$ and $C_2$ can be made very small. With this arrangement, the electrons in the island 10 can be controlled one by one by the capacitance gate 20. Accordingly, the power consumption can be made very small. Also, since a very small island is used, the area of the transistor can also be made very small.

A SEST can be realized by making at least one of the source 12, the drain 16, and the island 10 of the SET contain a ferromagnetic material with reversible magnetization. An example case where the source 12 and the drain 16 include ferromagnetic materials magnetized in the same direction, and the island 10 includes a ferromagnetic material having a variable magnetization direction, as shown in FIG. 1, is described. Where the island 10 is magnetized in the same direction as the magnetization direction of the source 12 and the drain 16 (parallel arrangement), the resistance values $R_{1-p}$ and $R_{2-p}$ of the tunnel junctions 14 and 18 can be made smaller by the tunnel magnetoresistance effect. Where the island 10 is magnetized in the opposite direction from the magnetization direction of the source 12 and the drain 16 (antiparallel arrangement), the resistance values $R_{1-ap}$ and $R_{2-ap}$ of the tunnel junctions 14 and 18 can be made larger by the tunnel magnetoresistance effect. By varying the magnetization direction of the ferromagnetic material having a variable magnetization direction in this manner, the conductance between the source 12 and the drain 16 can be controlled in a nonvolatile fashion.

In a different structure from the above, the conductance between the source and the drain can be controlled by making one of the island 10, the source 12, and the drain 16 include a ferromagnetic material having a fixed magnetization direction, making one of the others include a ferromagnetic material having a variable magnetization direction, and changing the magnetization direction of the ferromagnetic material having a variable magnetization direction.

In the structure in which the source 12 and the drain 16 include ferromagnetic materials magnetized in the same direction, and the island 10 include a ferromagnetic material having a variable magnetization direction, the resistance values of the tunnel junctions 14 and 18 can be changed by varying the magnetization direction. Accordingly, the conductance can be certainly controlled by varying the magnetization direction of the island, and the function of a logic circuit is reconfigured. Thus, a preferred transistor structure can be realized.

Figure 2:
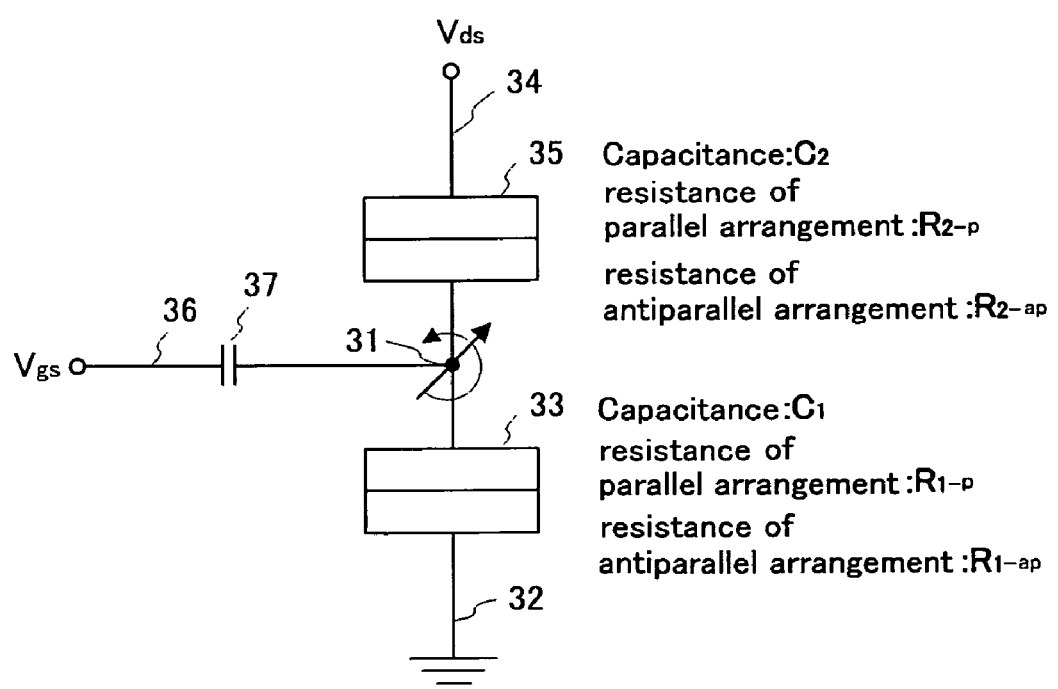
FIG. 2 shows the circuit symbols of a single-electron spin transistor (SEST) used in embodiments of the present invention.

FIG. 2 shows the circuit symbols of the SEST of FIG. 1. Reference numeral 31 indicates the island, reference numeral 32 indicates the source, reference numeral 33 indicates the tunnel junction having the capacitance value $C_1$, the resistance value $R_{1-p}$ in the parallel arrangement, and the resistance value $R_{1-ap}$ in the antiparallel arrangement, reference numeral 34 indicates the drain, the reference numeral 35 indicates the tunnel junction having the capacitance value $C_2$, the resistance value $R_{2-p}$ in the parallel arrangement, and the resistance value $R_{2-ap}$ in the antiparallel arrangement, reference numeral 36 indicates the gate, and reference numeral 37 indicates the gate capacitance having the capacitance value $C_g$.

Figure 3:
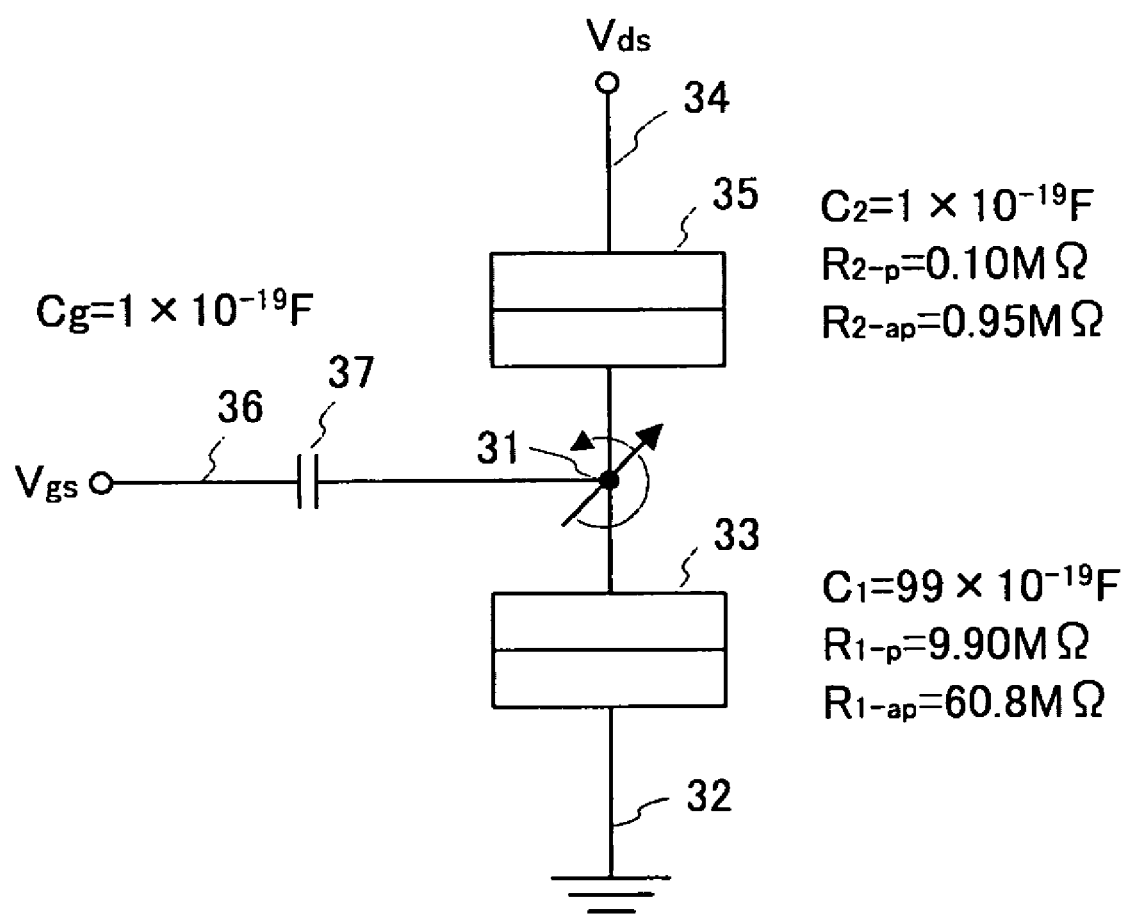
FIG. 3 is a circuit diagram showing the resistance values and the capacitance values of a single-electron spin transistor (SEST), with a simulation of the current-voltage characteristics being performed.
Figure 4:
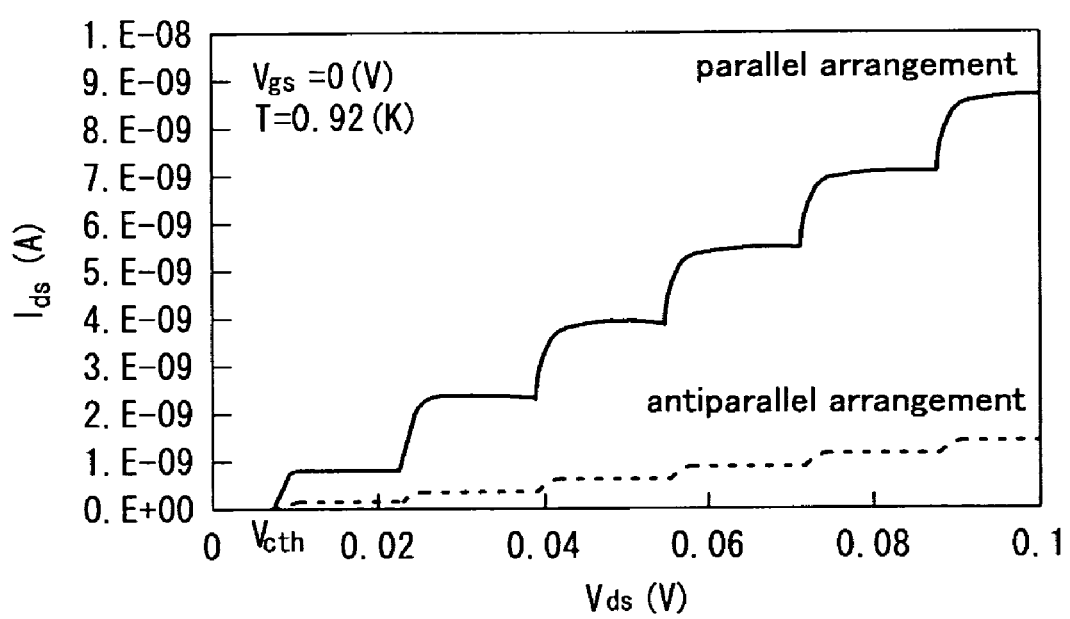
FIG. 4 shows the results of a simulation of the characteristics of the drain current and the drain voltage of a single-electron spin transistor (SEST)
Figure 5:
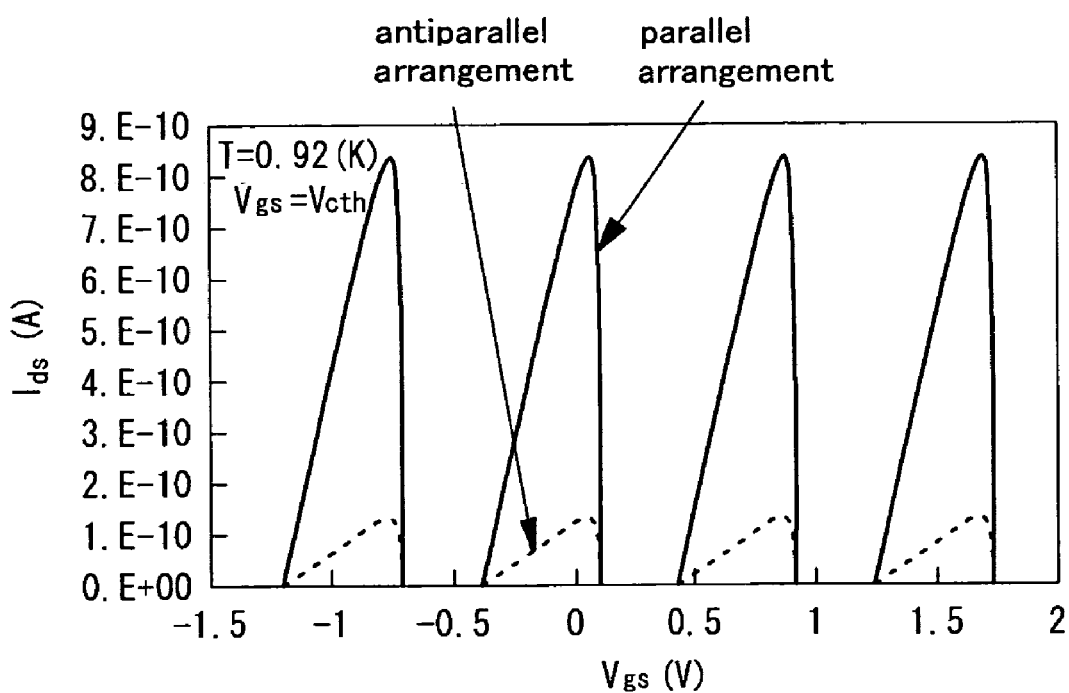
FIG. 5 shows the results of a simulation of the characteristics of the drain current and the gate voltage of a single-electron spin transistor (SEST)

For example, $C_g$ is $1\times10^{-19}$ F, $C_1$, $R_{1-p}$, and $R_{1-ap}$ are $99\times10^{-19}$ F, 9.9 MΩ, 60.8 MΩ, respectively, and $C_2$, $R_{2-p}$, and $R_{2-ap}$ are $1\times^{-19}$ F, 0.1 MΩ, 0.95 MΩ, respectively, as shown in FIG. 3. FIGS. 4 and 5 show the current-voltage characteristics as the results of simulations performed with those values.

FIG. 4 shows the drain current $I_{ds}$-drain voltage $V_{ds}$ characteristics observed where the gate voltage is 0 V, and the temperature is 0.92 K. In FIG. 4, the solid line indicates the drain current in the case of parallel arrangement, and the broken line indicates the drain current in the case of the antiparallel arrangement. When the drain voltage $V_{ds}$ is equal to or lower than the Coulomb threshold value ($V_{Cth}$), There is not a current flowing. This is because electron tunneling is prohibited by a Coulomb blockade effect. The stepwise increase in drain current caused by the application of a drain voltage shows that the number of electrons flowing in the island 10 increases one by one. In the case of the parallel arrangement, the drain current is higher and the conductance is smaller than in the case of the antiparallel arrangement. In this manner, the magnetization direction (the magnetization arrangement) is switched between the parallel arrangement and the antiparallel arrangement, the conductance between the source 32 and the drain 34 can be controlled. The magnetization direction is maintained until the next change in the magnetization direction. Thus, the conductance can be controlled in a nonvolatile fashion.

FIG. 5 shows the drain current $I_{ds}$-gate voltage $V_{gs}$ characteristics observed where the drain voltage is $V_{Cth}$, and the temperature is 0.92 K. Due to a Coulomb blockade effect, a drain current appears periodically. By adjusting the gate voltage (or the control gate voltage) and the gate capacitance (or the control gate capacitance) in this manner, the current flowing state can be switched between a state in which a drain current flows and a state in which a drain current does not flow. As in FIG. 4, in the case of the parallel arrangement, the drain current is higher than in the case of antiparallel arrangement.

Figure 6:
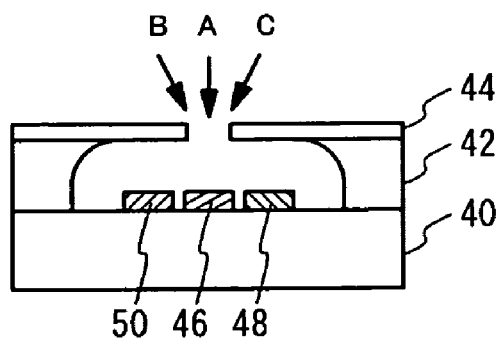
FIG. 6 is a schematic cross-sectional view illustrating the method for manufacturing a single-electron spin transistor (SEST) to be used in embodiments.

Referring now to FIG. 6, an example of a method for manufacturing a SEST is described. FIG. 6 is a cross-sectional view showing a step during the manufacturing process. For example, a lower-layer resist 42 and an upper-layer resist 44 are applied as two-layer resists onto an insulator substrate 40, and a predetermined pattern is formed with an electron beam exposure device. Iron or cobalt as a ferromagnetic material is deposited onto the middle of the substrate from the direction denoted by A in FIG. 6, so as to form regions 46. After that, a 2-nm insulating film to be the tunnel junctions is formed. Further, irons or cobalt, for example, is deposited from the directions denoted by B and C, so as to form regions 48 and regions 50.

Figure 7:
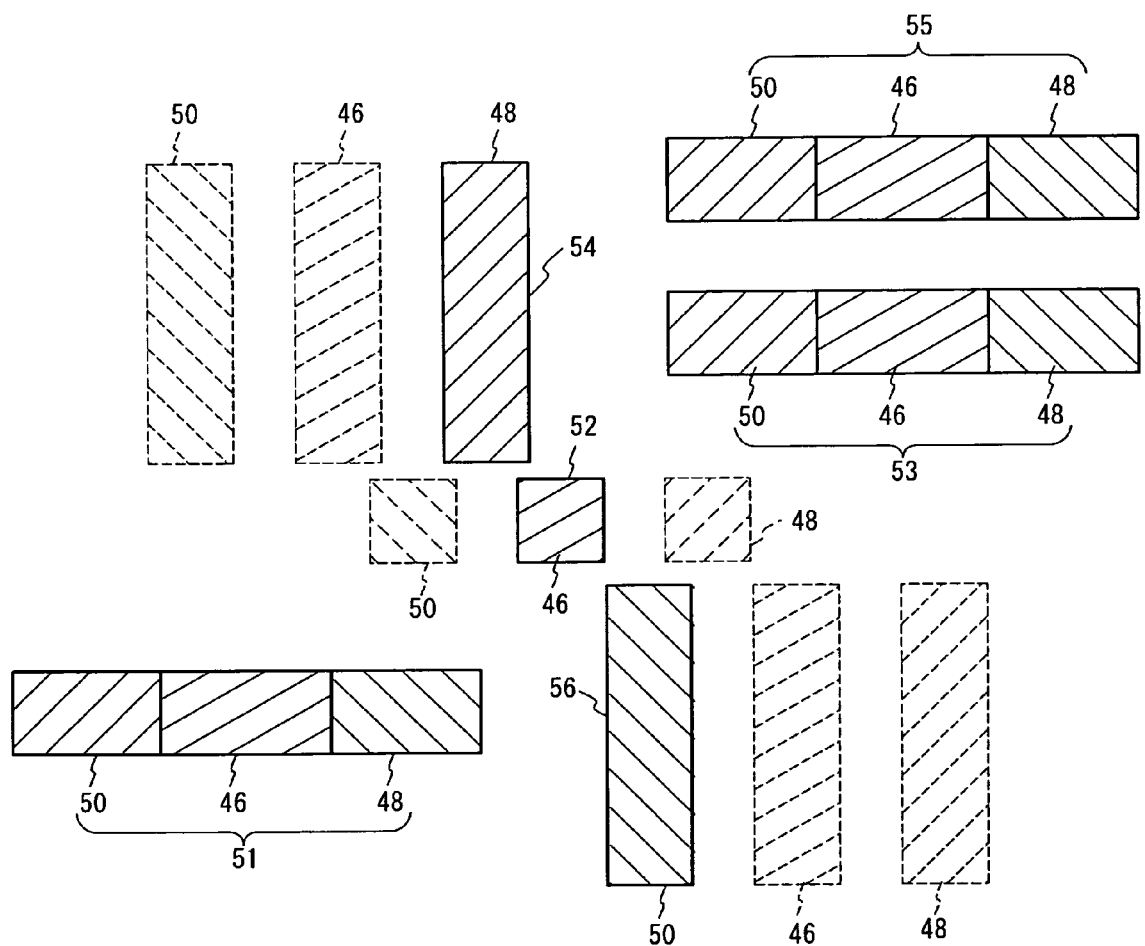
FIG. 7 is a top view showing the structure of a single-electron spin transistor (SEST) to be used in embodiments.

In the above manner, the pattern shown in the top view of FIG. 7 is completed. In FIG. 7, the regions 46, 48, and 50 that do not constitute the SEST are indicated by broken lines. Those regions indicated by the broken lines are removed by etching. An island 52 formed with a region 46, a source 54 formed with a region 48, and a drain 56 formed with a region 50 are formed on the substrate 40. Insulating films (not shown) to be the tunnel junctions are formed between the island 52 and the source 54 and between the island 52 and the drain 56. Further, a first gate 51, a second gate 53, and a control gate 55 are formed on the substrate 40. In this structure, the source 54, the drain 56, and the gates 51, 53, and 55 are formed on the sides of the island 52. Here, the portions between the island 52 and the gates 51, 53, and 55 may be covered with insulating films, or may be hollows. In this manner, the gates 51, 53, and 55 are capacitively coupled to the island 52 via the space formed by the insulating films or hollows existing between the island 52 and the gates 51, 53, and 55. The capacitance of the space formed by the insulating films or hollows is the gate capacitance (or the control gate capacitance).

As the island 52 can be made very small, the SEST having the above structure can have very small gate capacitance. Accordingly, an analog input can be realized with a very small area. The gate may be formed on the island via an insulating film, or under the substrate 40 through the substrate 40. In either case, a gate capacitively coupled to the island can be formed.

Figure 8A:
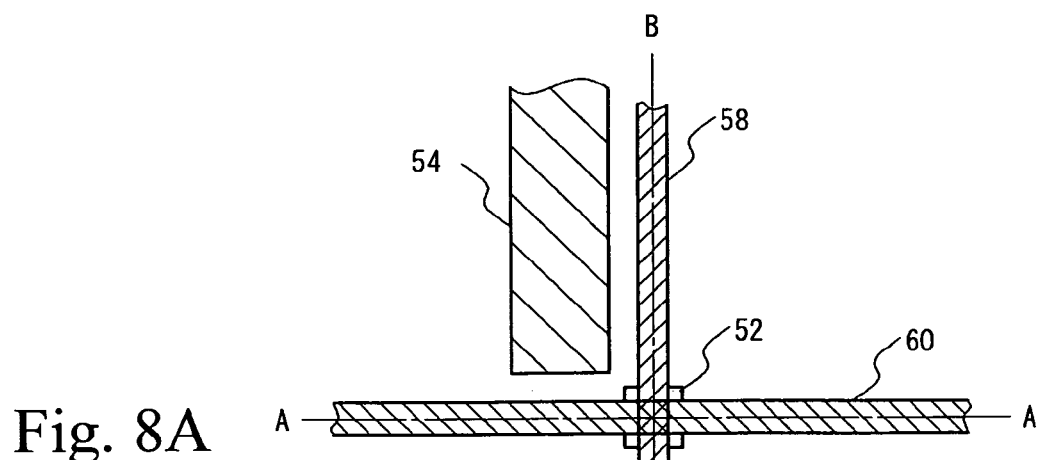
FIG. 8A is a top view illustrating the mechanism of changing the magnetization arrangement of a single-electron spin transistor (SEST) to be used in the first through fourth embodiments.
Figure 8B:
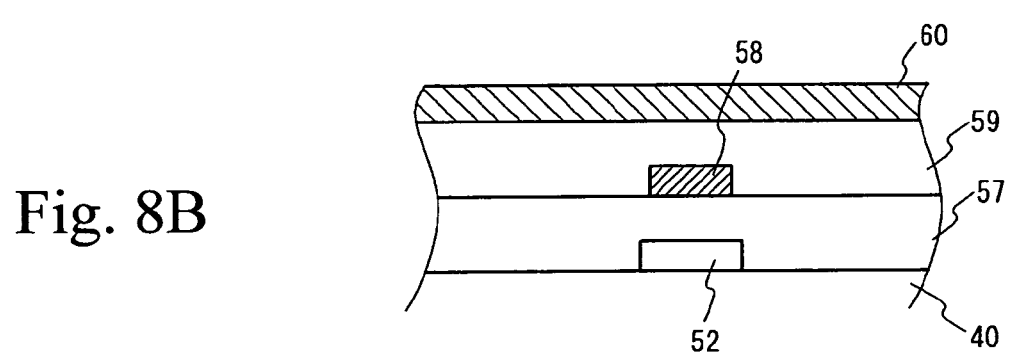
FIG. 8B is a cross-sectional view of the structure, taken along the line A-A of FIG. 8A.
Figure 8C:
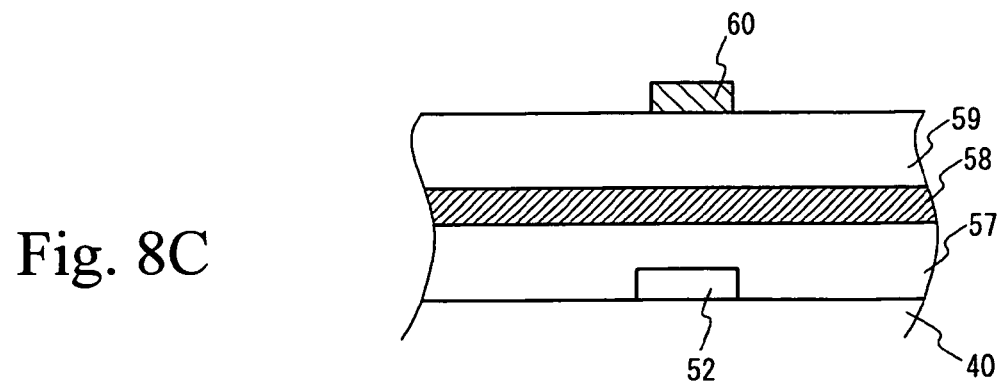
FIG. 8C is a cross-sectional view of the structure, taken along the line B-B of FIG. 8A.

FIGS. 8A through 8C illustrate an example of the mechanism of varying the magnetization direction (the magnetization arrangement) of the island. FIG. 8A is a top view. FIG. 8B is a cross-sectional view, taken along the line A-A of FIG. 8A. FIG. 8C is a cross-sectional view, taken along the line B-B of FIG. 8A. In FIG. 8A, the island 52, the source 54, and the drain 56 are arranged in the same manner as in FIG. 7. As shown in FIGS. 8B and 8C, an interlayer insulating film 57, a wire 58, an interlayer insulating film 59, and a wire 60 are formed on a transistor. The wire 58 and the wire 60 cross each other on the island 52. By applying a pulse current to the wire 50 and the wire 60, a magnetic field is induced in the island 52, and the magnetization direction (the magnetization arrangement) of the island 52 can be varied.

Figure 9A:
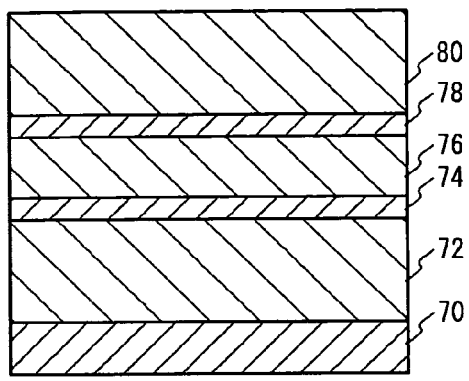
FIGS. 9A through 9F are cross-sectional views illustrating another example structure of a single-electron spin transistor (SEST) and a method for manufacturing the single-electron spin transistor.
Figure 9D:
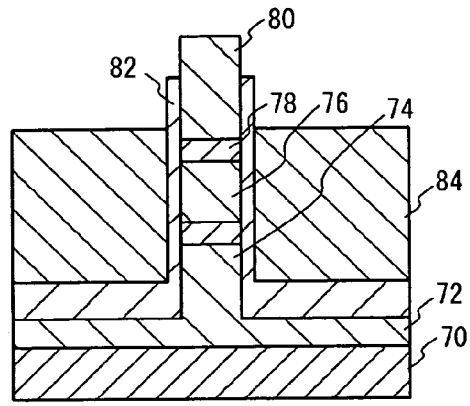
Figure 9B:
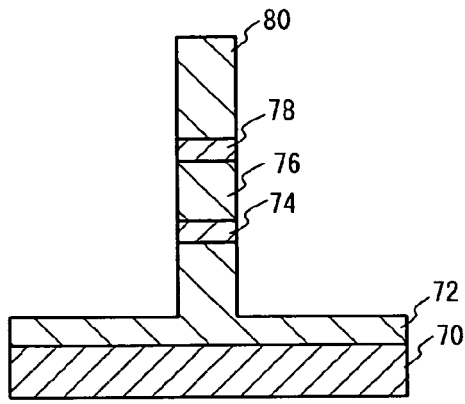
Figure 9E:
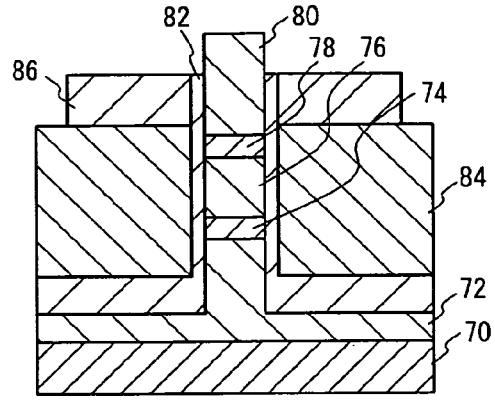
Figure 9C:
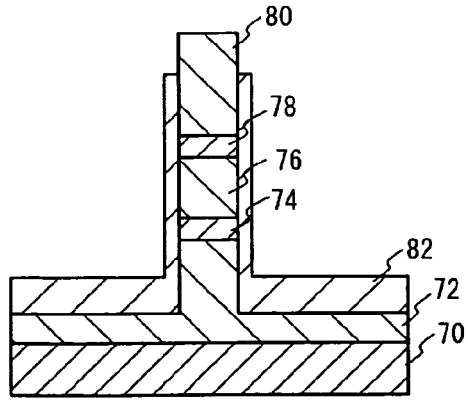
Figure 9F:
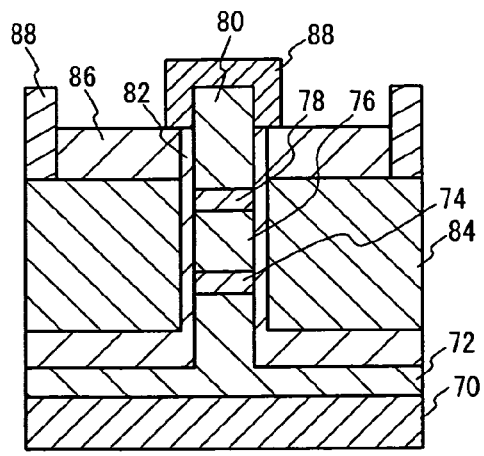

Referring now to FIGS. 9A through 9F, another example structure of a SEST and a method for manufacturing the SEST are described. As shown in FIG. 9A, an iron (Fe) film as a source 72, a magnesium oxide (MgO) film as a tunnel junction 74, an iron (Fe) film as an island 76, a magnesium oxide (MgO) film as a tunnel junction 78, and an iron (Fe) film as a drain 80 are stacked to form a hetero structure on a magnesium oxide (MgO) substrate 70 by MBE, for example. Etching is then performed as deep as the source 72 of the stacked films, except for a predetermined region, by electron beam exposure and the ion milling technique. In this manner, a pillar structure is formed (FIG. 9B). An insulating film 82 to form a gate capacitance is formed with a silicon nitride film by plasma CVD (FIG. 9C). A gate 84 is formed with aluminum (Al) by a deposition technique (FIG. 9D). A silicon nitride film 86 is formed by plasma CVD, so as to form contact holes in predetermined regions (FIG. 9E). A wiring layer 88 is formed with aluminum (Al) by a deposition technique (FIG. 9F).

In the above described manner, the source 72, the island 76, and the drain 80 are stacked on the substrate 70, and the gate 84 is formed on a side of the island 76. The gate 84 is capacitively coupled to the island 76 via the space formed by the insulating film existing between the island 76 and the gate 84. In this case, the silicon nitride film 82 between the island 76 and the gate 84 serves as the gate capacitance. As the island 76 is very thin, the gate capacitance can be made very small. Accordingly, an analog input can be realized with a very small area. In this manner, a SEST having the source 72, the island 76, and the drain 80 that include a ferromagnetic material can be formed.

As described above, each SEST deals with a single electron, and the power consumption of the transistor is small. Accordingly, the area of the transistor can be made small. Furthermore, as each SEST deals with one or two electrons flowing through the island, the charge amount to be controlled is small. By connecting the gate capacitively coupled to the island to an input terminal, an analog input to a logic circuit can be realized. More specifically, analog inputs from input terminals to SESTs are weighted with the gate capacitance connected from each input terminal to the gate of each SEST, so as to realize an analog input to the logic circuit. Accordingly, a large-area floating gate that has been required conventionally becomes unnecessary. Thus, the circuit area of the logic circuit including SESTs can be made very small. As described with reference to FIG. 7 and FIGS. 9A through 9F, in a SEST, the gate capacitance of the gate capacitively coupled to the island can be made very small, and the circuit area can be further reduced accordingly.

First Embodiment

A first embodiment is an example of an inverter circuit that can control the logic threshold value in a nonvolatile manner, by varying the variable magnetization direction of each SEST.

Figure 10:
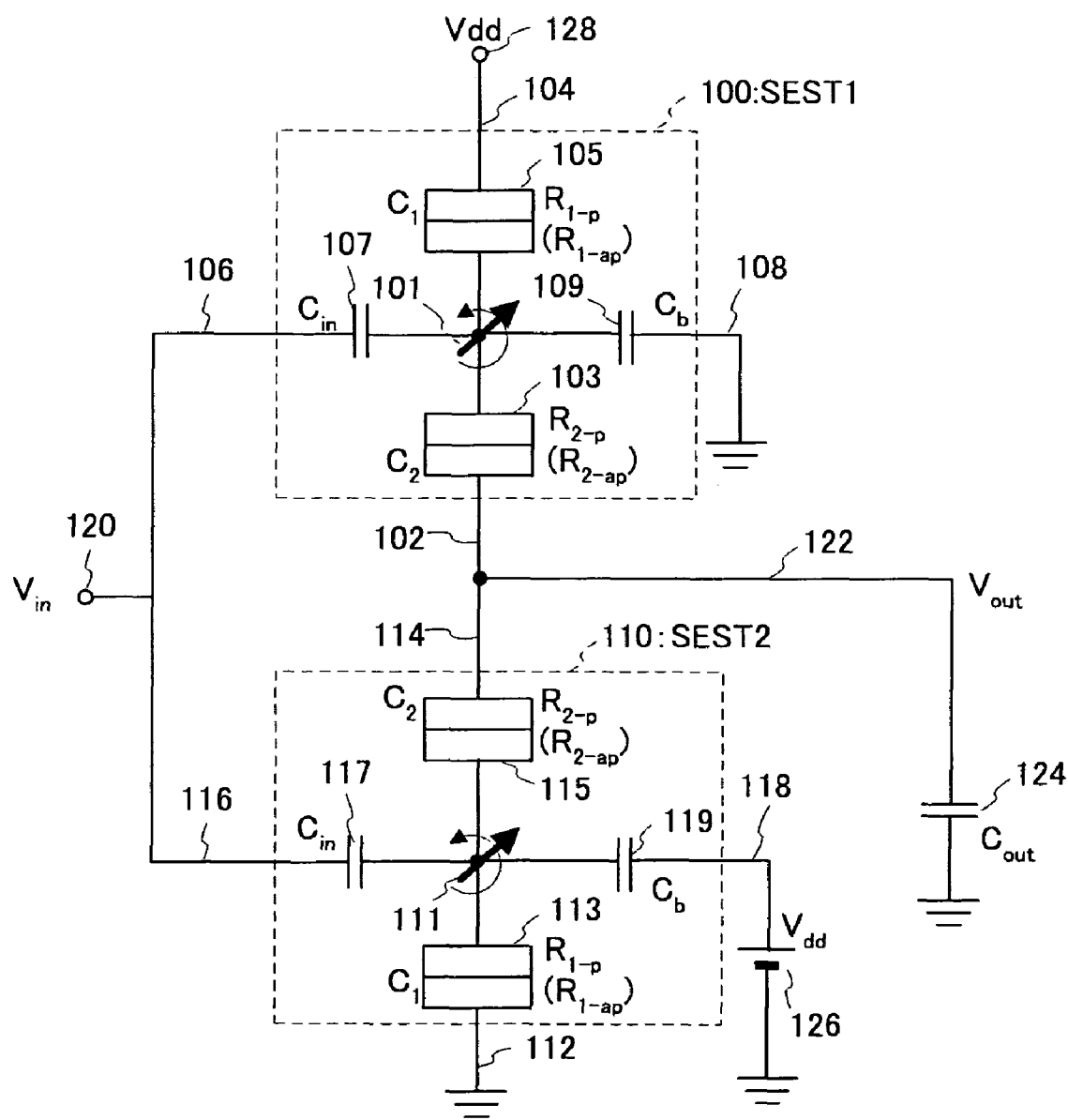
FIG. 10 is a circuit diagram of an inverter circuit in accordance with a first embodiment.

FIG. 10 shows a circuit diagram of the inverter circuit in accordance with the first embodiment. This inverter circuit (the first inverter circuit) includes a SEST1 (100) and a SEST2 (110). The source 102 of the SEST1 (100) is connected to an output terminal 122, and the drain 104 is connected to a first power supply terminal 128. Tunnel junctions 103 and 105 are provided between an island 101 and the source 102 and between the island 101 and the drain 104, respectively. The tunnel junctions 103 and 105 have capacitance values $C_2$ and $C_1$, resistance values $R_{2-p}$ and $R_{1-p}$ in the parallel arrangement, and resistance values $R_{2-ap}$ and $R_{1-ap}$ in the antiparallel arrangement. A gate 106 is connected to an input terminal 120. A control gate 108 is grounded. The capacitance value of a gate capacitance 107 between the island 101 and the gate 106 is $C_{in}$, and the capacitance value of a control gate capacitance 109 between the island 101 and the control gate 108 is $C_b$.

The source 112 of the SEST2 (110) is grounded (or connected to the second power supply terminal), and the drain 114 is connected to the output terminal 122. Tunnel junctions 113 and 115 are provided between an island 111 and the source 112 and between the island 111 and the drain 114, respectively. The tunnel junctions 113 and 115 have capacitance values $C_1$ and $C_2$, resistance values $R_{1-p}$ and $R_{2-p}$ in the parallel arrangement, and resistance values $R_{1-ap}$ and $R_{2-ap}$ in the antiparallel arrangement. A gate 116 is connected to the input terminal 120. A control gate 118 is connected to a power supply $V_{dd}$ 126. The capacitance value of a gate capacitance 117 between the island 111 and the gate 116 is $C_{in}$, and the capacitance value of a control gate capacitance 119 between the island 111 and the control gate 118 is $C_b$. The output terminal 122 is grounded via a capacitance 124.

The function of this inverter is now described. The SEST1 (100) is switched on when an input $V_{in}$ of the input terminal 120 is "0" (low level), and is switched off when the input $V_{in}$ of the input terminal 120 is "1" (high level). The SEST2 (110) is switched off when the input terminal 120 is "0", and is switched on when the input terminal 120 is "1". The following is the reason that the SEST1 (100) and the SEST2 (110) operate in the opposite manners. Different voltages (ground and $V_{dd}$) are applied to the control gates 108 and 118 of the respective SESTs. With those voltages, the SEST1 (100) and the SEST2 (110) have different Coulomb threshold voltages so as to perform the opposite operations.

Figure 11:
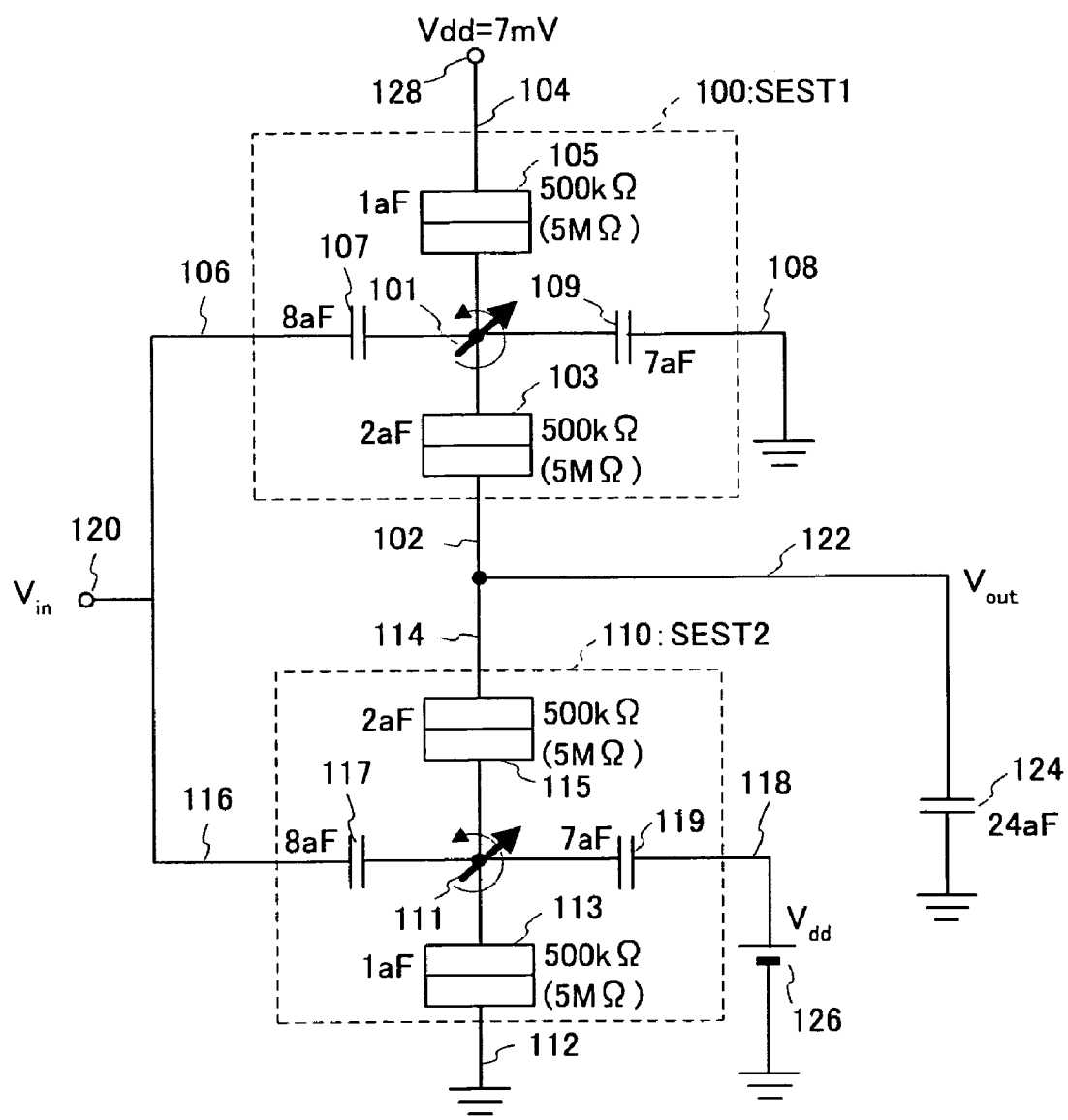
FIG. 11 is a circuit diagram showing the resistance values, the capacitance values and the voltage values used in a simulation of the input/output characteristics of the inverter circuit in accordance with the first embodiment.
Figure 12:
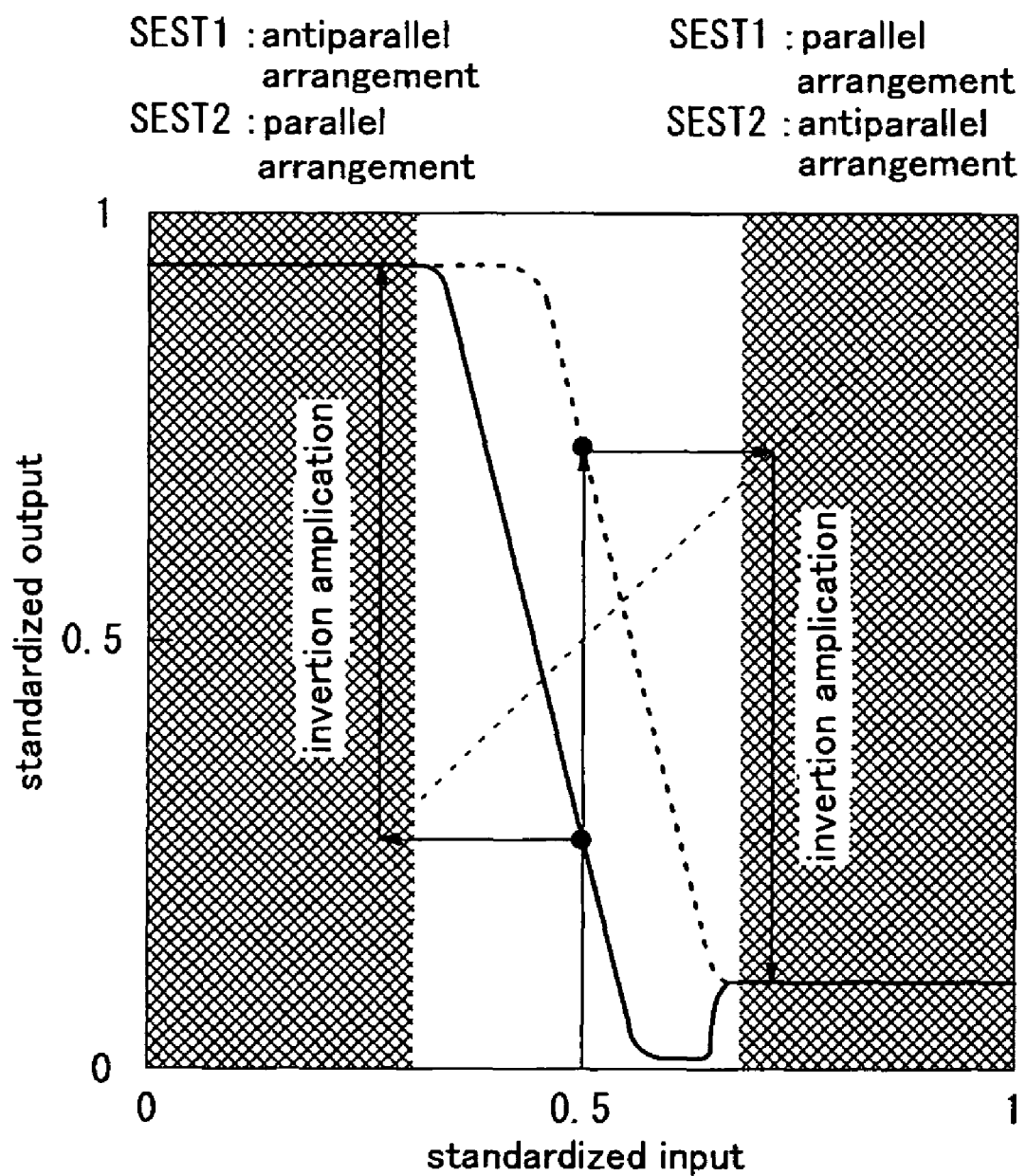
FIG. 12 shows the results of the simulation of the input/output characteristics of the inverter circuit in accordance with the first embodiment.

A simulation was performed on the input/output characteristics of the first embodiment. FIG. 11 shows the capacitance values, the resistance values, and the voltages used in the simulation. The capacitance unit aF represents $1\times10^{-18}$ F. FIG. 12 shows the results of the input/output characteristics simulation. In FIG. 12, the abscissa axis indicates standardized inputs, and the ordinate axis indicates standardized outputs. The hatching portions indicate the ranges in which the low level "0" or the high level "1" is output in response to a standardized input.

Since the SEST1 (100) is switched on and the SEST2 (110) is switched off in the neighborhood of the point at which the input $V_{in}$ of the input terminal 120 is "0", an output $V_{out}$ of the output terminal 122 becomes high level, which is "1". Meanwhile, since the SEST1 (100) is switched off and the SEST2 (110) is switched on in the neighborhood of the point at which the input $V_{in}$ of the input terminal 120 is "1", the output $V_{out}$ of the output terminal 122 becomes low level, which is "0".

The SEST1 (100) and the SEST2 (110) are switched on in the vicinity of the point at which the $V_{in}$ is "0.5". Here, the output $V_{out}$ is determined by the resistance values of the tunnel junctions 103 and 105 of the SEST1 (100) and the tunnel junctions 113 and 115 of the SEST2 (110). If the resistance value of the tunnel junctions 103 and 105 of the SEST1 (100) is larger than the resistance value of the tunnel junctions 113 and 115 of the SEST2 (110), the output $V_{out}$ is almost "0". This can be achieved where the magnetization arrangement of the SEST1 (100) is the antiparallel arrangement while the magnetization arrangement of the SEST2 (110) is the parallel arrangement. The input/output curve of this case is indicated by the solid line in FIG. 12. The standardized output is approximately "0.25". An inverter circuit having an A-D converter function is provided in the next stage, so as to perform inverting amplification. In this manner, the high level "1" can be output (as indicated by the arrow extending leftward from the solid line and then extending upward in FIG. 12).

If the resistance value of the tunnel junctions 103 and 105 of the SEST1 (100) is smaller than the resistance value of the tunnel junctions 113 and 115 of the SEST2 (110), the output $V_{out}$ is almost "1". This can be achieved where the magnetization arrangement of the SEST1 (100) is the parallel arrangement while the magnetization arrangement of the SEST2 (110) is the antiparallel arrangement. The input/output curve of this case is indicated by the dotted line in FIG. 12. The standardized output is approximately "0.75". An inverter circuit having an A-D converter function is also provided in the next stage, so as to perform inverting amplification. In this manner, the low level "0" can be output (as indicated by the arrow extending rightward from the dotted line and then extending downward in FIG. 12).

By varying the magnetization direction of each SEST in the above manner, the logic threshold value of the inverter circuit can be changed. Accordingly, the output $V_{out}$ of the output terminal 122 can be adjusted to almost "0" or "1", where the input $V_{in}$ of the input terminal 120 is "0.5". As described above, in accordance with the first embodiment, the logic threshold value can be controlled by varying the magnetization direction, as in the conventional technique 1. More specifically, the logic threshold value can be controlled in a nonvolatile manner by varying the magnetization directions of ferromagnetic islands having a variable magnetization direction. In other words, the function of a logic circuit can be reconfigured in a nonvolatile manner.

As described above, in accordance with the first embodiment, the logic threshold value of an inverter circuit can be controlled in a nonvolatile manner by varying the magnetization direction of ferromagnetic islands having a variable magnetization direction. Furthermore, as SESTs are used as transistors, the power consumption and area of each transistor can be made smaller, and the power consumption and circuit area of the logic circuit can be made smaller, accordingly.

Second Embodiment

Figure 13:
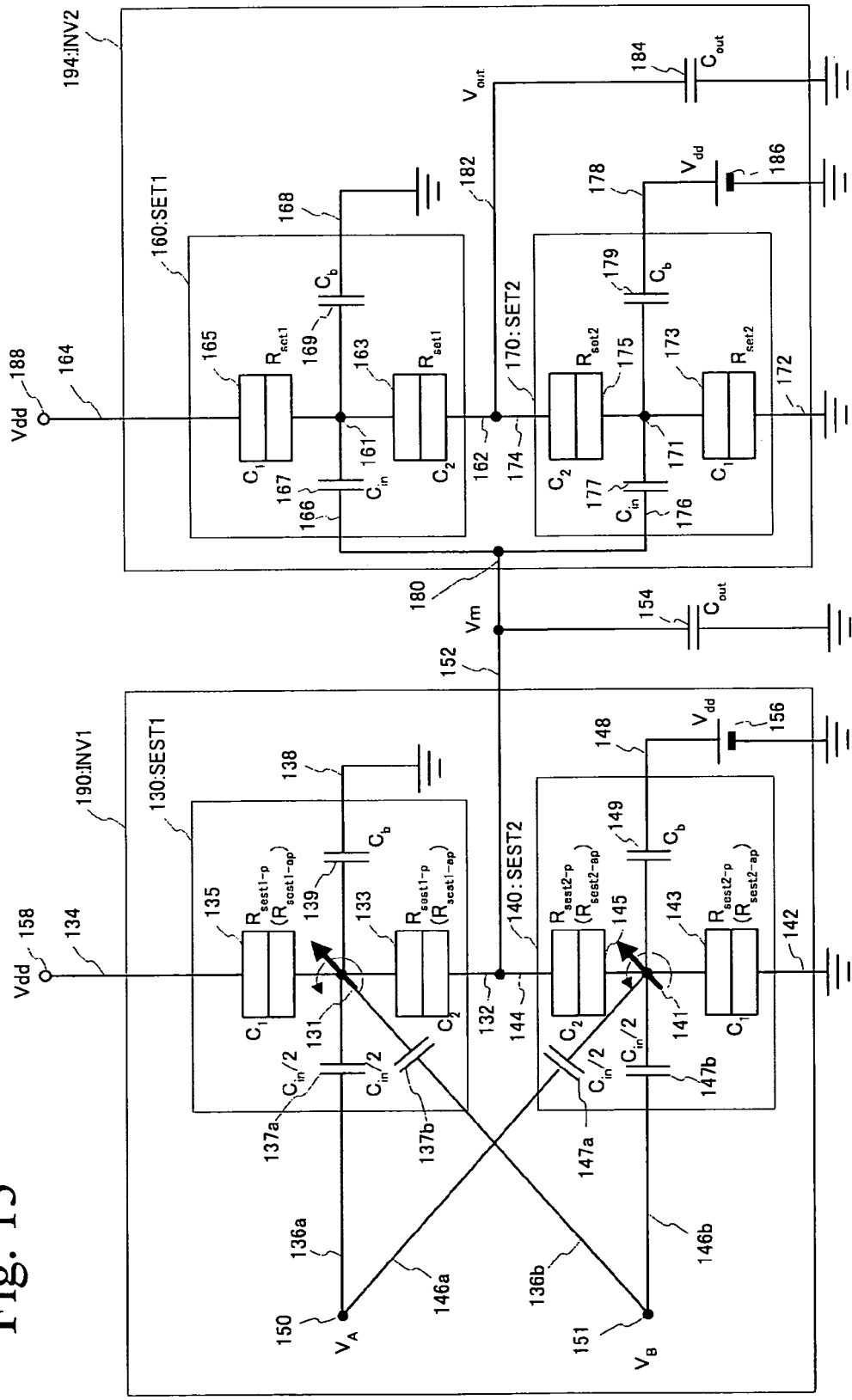
FIG. 13 is a circuit diagram of a logic circuit in accordance with a second embodiment.

A second embodiment is an example of a logic circuit that can reconfigure an OR/AND circuit function using SESTs in a nonvolatile manner. FIG. 13 is a circuit diagram of the logic circuit in accordance with the second embodiment. This logic circuit includes a first inverter circuit (INV1) 190 and a second inverter circuit (INV2) 194. The first inverter circuit (INV1) 190 includes a SEST1 (130) and a SEST2 (140). The INV1 (190) has the same circuit structure and functions as the inverter circuit of the first embodiment, except that a first input terminal and a second input terminal are provided, and an analog input is to be input.

The structure of the logic circuit is now described in greater detail. The source 132 of the SEST1 (130) is connected to an output terminal 152 of the INV1 (190), and the drain 134 is connected to a first power supply terminal 158. Tunnel junctions 133 and 135 are provided between an island 131 and the source 132 and between the island 131 and the drain 134, respectively. The tunnel junctions 133 and 135 have capacitance values $C_2$ and $C_1$, a resistance value $R_{sest1-p}$ in the parallel arrangement, and a resistance value $R_{sest1-ap}$ in the antiparallel arrangement. A first gate 136a is connected to the first input terminal 150, and a second gate 136b is connected to the second input terminal 151. A control gate 138 is grounded. The capacitance values of a first gate capacitance 137a between the island 131 and the first gate 136a, and a second gate capacitance 137b between the island 131 and the second gate 136b are $C_{in}/2$. The capacitance value of a control gate capacitance 139 between the island 131 and the control gate 138 is $C_b$.

The source 142 of the SEST2 (140) is grounded (or connected to the second power supply terminal), and the drain 144 is connected to the output terminal 152 of the INV1 (190). Tunnel junctions 143 and 145 are provided between an island 141 and the source 142 and between the island 141 and the drain 144, respectively. The tunnel junctions 143 and 145 have capacitance values $C_1$ and $C_2$, a resistance value $R_{sest2-p}$ in the parallel arrangement, and a resistance values $R_{sest2-ap}$ in the antiparallel arrangement. A first gate 146a is connected to the first input terminal 150, and a second gate 146b is connected to the second input terminal 151. A control gate 148 is connected to a power supply $V_{dd}$ 156. The capacitance values of a first gate capacitance 147a between the island 141 and the first gate 146a, and a second gate capacitance 147b between the island 141 and the second gate 146b are $C_{in}/2$. The output terminal 152 is grounded via a capacitance 154.

Further, the output terminal 152 of the INV1 (190) is connected to an input terminal 180 of the second inverter circuit (INV2) 194. The INV2 (194) is a Tucker-type inverter circuit, and includes a SET1 (160) and a SET2 (170) that are two single-electron transistors (SET). The source 162 of the SET1 (160) is connected to an output terminal 182, and the drain 164 is connected to a power supply $V_{dd}$ 188. Tunnel junctions 163 and 165 are provided between an island 161 and the source 162 and between the island 161 and the drain 164, respectively. The tunnel junctions 163 and 165 have capacitance values $C_2$ and $C_1$, and a resistance value $R_{set1}$. A gate 166 is connected to the output terminal 152 of the INV1 (190). A control gate 168 is grounded. The capacitance value of a gate capacitance 167 between the island 161 and the gate 166 is $C_{in}$. The capacitance value of a control gate capacitance 169 between the island 161 and the control gate 168 is $C_b$.

The source 172 of the SET2 (170) is grounded, and the drain 174 is connected to the output terminal 182. Tunnel junctions 173 and 175 are provided between an island 171 and the source 172 and between the island 171 and the drain 174, respectively. The tunnel junctions 173 and 175 have capacitance values $C_1$ and $C_2$, and a resistance value $R_{set2}$. A gate 176 is connected to the output terminal 152 of the INV1 (190). A control gate 178 is connected to a power supply $V_{dd}$ 186. The capacitance value of a gate capacitance 177 between the island 171 and the gate 176 is $C_{in}$. The output terminal 182 is grounded via a capacitance 184.

In the logic circuit in accordance with the second embodiment, the first input terminal 150 is capacitively coupled to the island 131 of the SEST1 (130) and the island 141 of the SEST2 (140) via the same capacitance value $C_{in}/2$, and the second input terminal 151 is also capacitively coupled to the island 131 of the SEST1 (130) and the island 141 of the SEST2 (140) via the same capacitance value $C_{in}/2$.

Accordingly, in the INV1 (190), the capacitance values of the first gate capacitance 137a of the SEST1 (130) and the first gate capacitance 147a of the SEST2 (140) are substantially the same, and the capacitance values of the second gate capacitance 137b of the SEST1 (130) and the second gate capacitance 147b of the SEST2 (140) are substantially the same. Further, the capacitance values of the first gate capacitance 137a of the SEST1 (130) and the first gate capacitance 147a of the SEST2 (140), and the capacitance values of the second gate capacitance 137b of the SEST1 (130) and the second gate capacitance 147b of the SEST2 (140) are substantially the same.

Accordingly, in the INV1 (190), the weights of analog inputs of an input $V_A$ from the first input terminal 150 to the SEST1 (130) and the SEST2 (140) are substantially the same, and the weights of analog inputs of an input $V_B$ from the second input terminal 151 to the SEST1 (130) and the SEST2 (140) are substantially the same. Further, the weights of the analog inputs of the input $V_A$ from the first input terminal 150 to the SEST1 (130) and the SEST2 (140) are substantially the same as the weights of the analog inputs of the input $V_B$ from the second input terminal 151 to the SEST1 (130) and the SEST2 (140).

Here, the substantially same capacitance values and the substantially same weights are within the range in which an input of approximately "0.5" is input to the INV1 (190). The input of approximately "0.5" is an input within a range in which the logic circuit in accordance with the second embodiment can reconfigure the two-input AND circuit function and the two-input OR circuit function in a nonvolatile manner by varying the magnetization direction of the ferromagnetic material in each SEST having a variable magnetization direction.

Table 1 shows a truth table of inputs. Where the input $V_A$ is "0" and the input $V_B$ is "0", the input $V_{in}$ of the INV1 (190) is "0". Where the input $V_A$ is "0" and the input $V_B$ is "1", the input $V_{in}$ of the INV1 (190) is "0.5". Where the input $V_A$ is "1" and the input $V_B$ is "0", the input $V_{in}$ of the INV1 (190) is "0.5". Where the input $V_A$ is "1" and the input $V_B$ is "1", the input $V_{in}$ of the INV1 (190) is "1". In this manner, analog inputs from the first input terminal 150 and the second input terminal 151 can be input to the first inverter circuit (INV1) 190.

TABLE 1

| $V_A$ | $V_B$ | $V_{in}$ |
|---|---|---|
| "0" | "0" | "0" |
| "0" | "1" | "0.5" |
| "1" | "0" | "0.5" |
| "1" | "1" | "1" |

The INV2 (194) has an A-D conversion function, and inverting-amplifies the output $V_m$ of the INV1 (190). More specifically, the INV2 (194) inverting-amplifies the output of almost "0" or "1" of the INV1 (190) to "1" or "0". Since the INV1 (190) includes SESTs, its output current is very small. Therefore, the second embodiment employs a Tucker-type inverter circuit as the INV2 (194) that includes SETs that can be driven even by a small input current. The INV2 (194) is driven by an output of an inverter circuit including SETs. It is possible to employ an inverter circuit having a different circuit structure from the above or including other transistors, as long as the inverter circuit has the same functions as the INV2 (194).

Table 2 shows a truth table of the logic circuit in accordance with the second embodiment. Here, the functions observed in a case where the magnetization arrangement of the SEST1 (130) is the parallel arrangement (P) and the magnetization arrangement of the SEST2 (140) is the antiparallel arrangement (AP) are described. Where the input $V_A$ is "0" and the input $V_B$ is "0", the output $V_m$ of the output terminal 152 of the INV1 (190) is "1", and the output $V_{out}$ of the output terminal 182 of the INV2 (194) is "0". Where the input $V_A$ is "1" and the input $V_B$ is "1", the output $V_m$ is "0", and the output $V_{out}$ is "1". Where the input $V_A$ is "0" and the input $V_B$ is "1", or the input $V_A$ is "1" and the input $V_B$ is "0", the output $V_m$ is almost "1", and the output $V_{out}$ is almost "0", since the input $V_{in}$ is "0.5". In this manner, the logic circuit in accordance with the second embodiment functions as a two-input AND circuit.

TABLE 2

|  |  |  | $V_m$ |  |  | $V_{out}$ |  |  |
|---|---|---|---|---|---|---|---|---|
| SEST1 | SEST2 | $V_A$<br>$V_B$ | 0<br>0 | 0/1<br>1/0 | 1<br>1 | (in order of Vm) |  | function |
| AP | P |  | "1" | "0" | "0" | "0" "1" "1" | | OR |
| P | AP |  | "1" | "1" | "0" | "0" "0" "1" | | AND |

The functions observed in a case where the magnetization arrangement of the SEST1 (130) is the antiparallel arrangement (AP) and the magnetization arrangement of the SEST2 (140) is the parallel arrangement (P) are now described. Where the input $V_A$ is "0" and the input $V_B$ is "0", the output $V_m$ of the output terminal 152 of the INV1 (190) is "1", and the output $V_{out}$ of the output terminal 182 of the INV2 (194) is "0". Where the input $V_A$ is "1" and the input $V_B$ is "1", the output $V_m$ is "0", and the output $V_{out}$ is "1". Where the input $V_A$ is "0" and the input $V_B$ is "1", or the input $V_A$ is "1" and the input $V_B$ is "0", the output $V_m$ is almost "0", and the output $V_{out}$ is almost "1", since the input $V_{in}$ is "0.5". In this manner, the logic circuit in accordance with the second embodiment functions as a two-input OR circuit.

Figure 14:
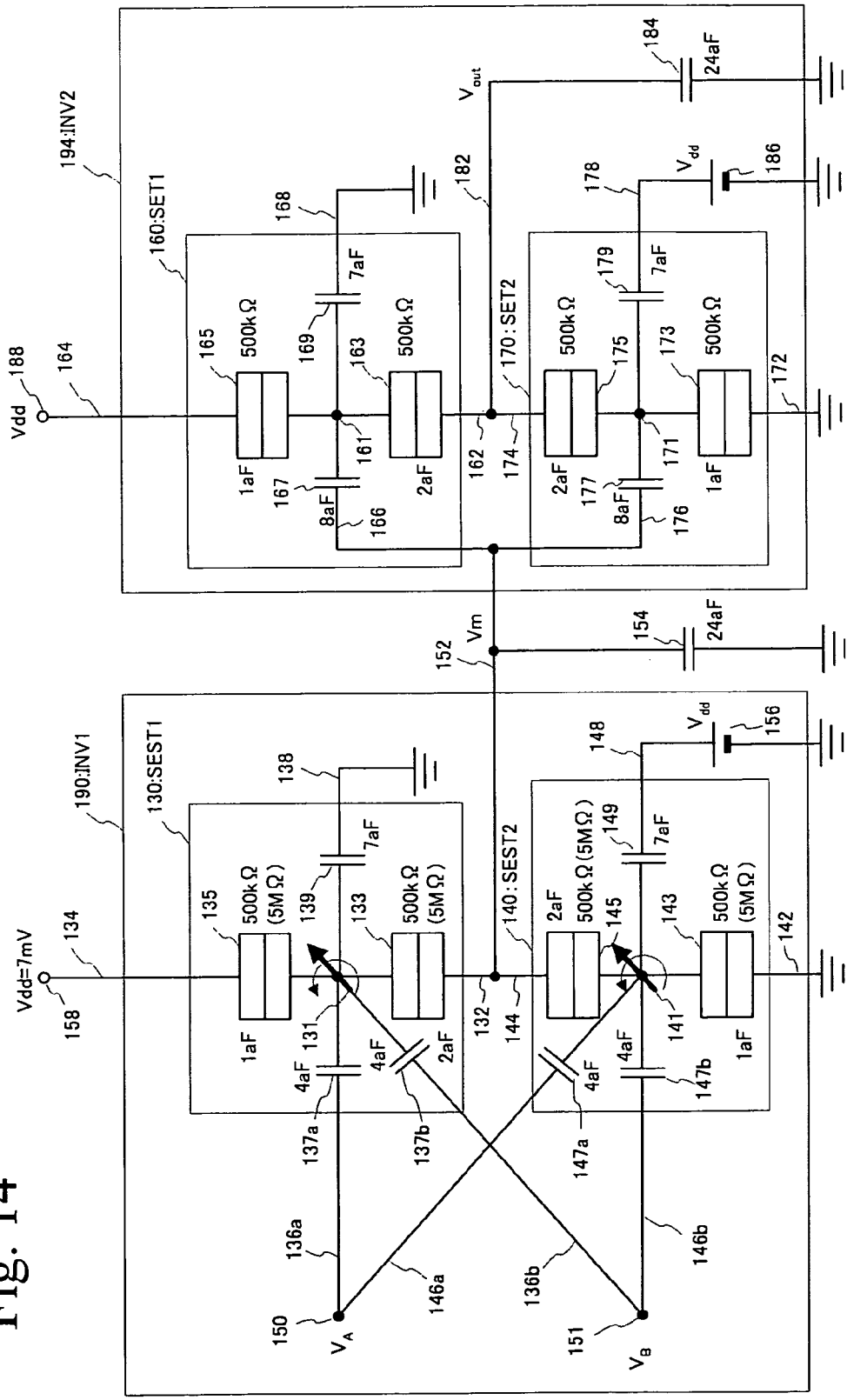
FIG. 14 is a circuit diagram showing the resistance values, the capacitance values and the voltage values used in simulations of the outputs of the logic circuit in accordance with the second embodiment.
Figure 15:
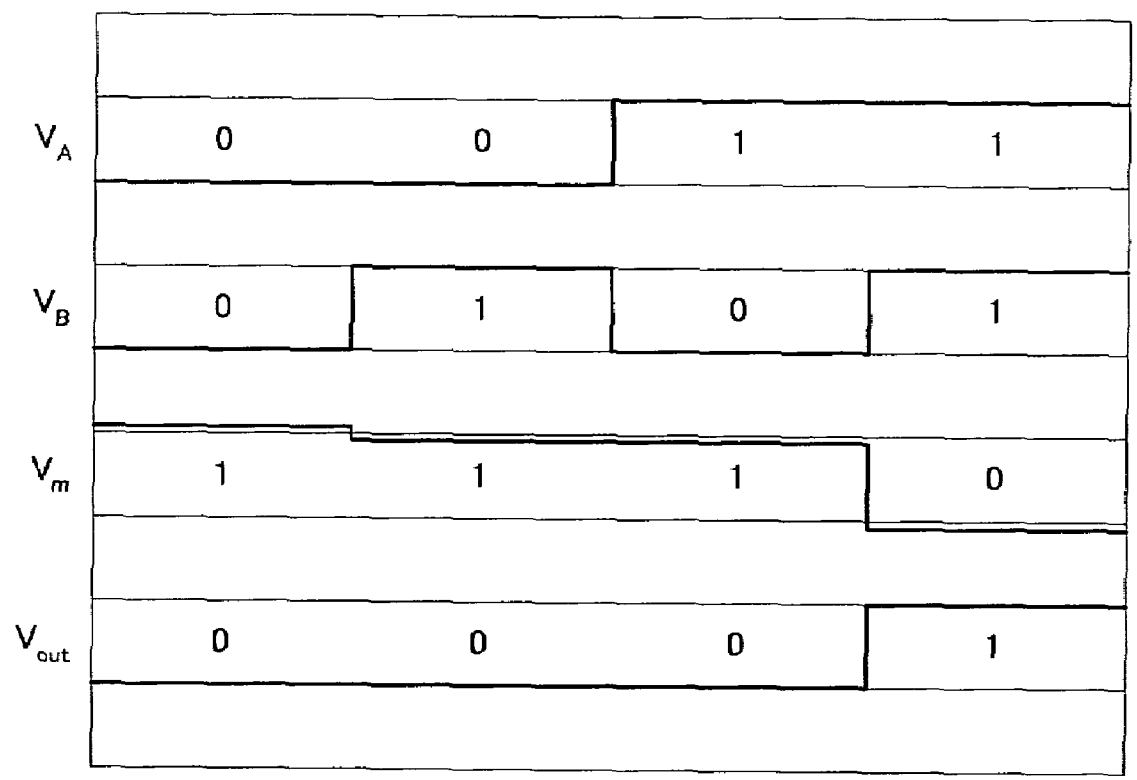
FIG. 15 shows the results of the simulation of the output of the AND function of the logic circuit in accordance with the second embodiment.
Figure 16:
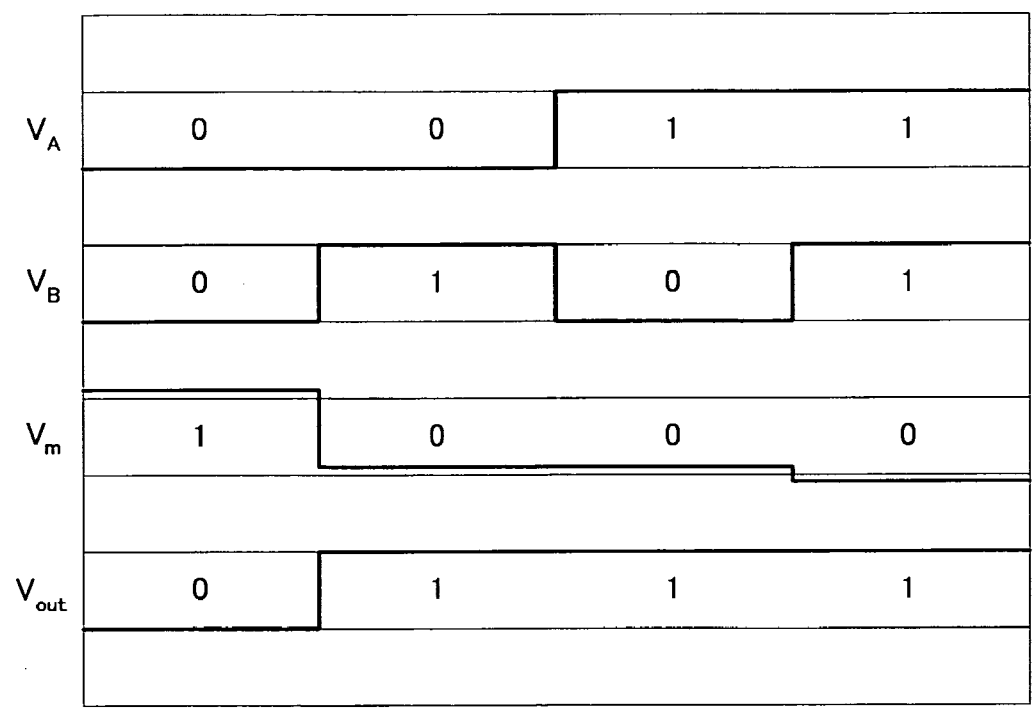
FIG. 16 shows the results of the simulation of the output of the OR function of the logic circuit in accordance with the second embodiment.

Simulations of the output $V_m$ of the INV1 (190) and the output $V_{out}$ of the INV2 (194) of the second embodiment were performed. FIG. 14 shows the capacitance values, the resistance values, and the voltage values used in the simulations. FIGS. 15 and 16 show the results of the simulations of the output $V_m$ and the output $V_{out}$. FIG. 15 shows the results obtained in a case where the magnetization arrangement of the SEST1 (130) is the parallel magnetization, and the magnetization arrangement of the SEST2 (140) is the antiparallel arrangement. FIG. 16 shows the results obtained in a case where the magnetization arrangement of the SEST1 (130) is the antiparallel magnetization, and the magnetization arrangement of the SEST2 (140) is the parallel arrangement. The abscissa axis indicates the outputs $V_m$ and $V_{out}$ in a case where the input $V_A$ and $V_B$ are "0" or "1", with the low level being "0" and the high level being "1" in standardization. The lower line of each of the outputs $V_m$ and $V_{out}$ represents "0", while the upper line of each of the outputs $V_m$ and $V_{out}$ represents "1".

In this manner, by varying the magnetization direction (the magnetization arrangement) of a ferromagnetic island having a variable magnetization direction (magnetization arrangement), a logic circuit that can reconfigure a two-input AND circuit function and a two-input OR circuit function in a nonvolatile manner can be realized.

As can be seen from Table 2, FIG. 15, and FIG. 16, the output $V_m$ of the INV1 (190) exhibits the function of a NOR circuit in a case where the magnetization arrangement of the SEST1 (130) is the antiparallel magnetization (AP), and the magnetization arrangement of the SEST2 (140) is the parallel arrangement (P), and exhibits the function of a NAND circuit in a case where the magnetization arrangement of the SEST1 (130) is the parallel magnetization (P), and the magnetization arrangement of the SEST2 (140) is the antiparallel arrangement (AP). In other words, a logic circuit that can reconfigure a Boolean logic circuit function can be achieved only with the INV1 of the second embodiment. However, to achieve outputs closer to "0" and "1", it is preferable that the INV2 (192) is provided as in the second embodiment.

As described above, in accordance with the second embodiment, by varying the magnetization direction of each ferromagnetic island having a variable magnetization direction, a two-input AND circuit function and a two-input OR circuit function can be reconfigured in a nonvolatile manner. Furthermore, as SESTs are used as transistors, the charge amount to be controlled is small. Accordingly, analog inputs can be made by combining the small gate capacitances between the islands and gates. With this structure, there is no need to use a floating gate that requires an area 100 or more times as large as the area of a transistor, as in the conventional technique 2. Accordingly, the circuit area can be made very small, compared with the circuit area obtained by the conventional technique 2. Further, the power consumption and the area of each SEST as a transistor are small. Thus, this embodiment can provide a logic circuit that can reconfigure an AND circuit function and an OR circuit function in a nonvolatile manner, and has a small circuit area and small power consumption.

Third Embodiment

Figure 17:
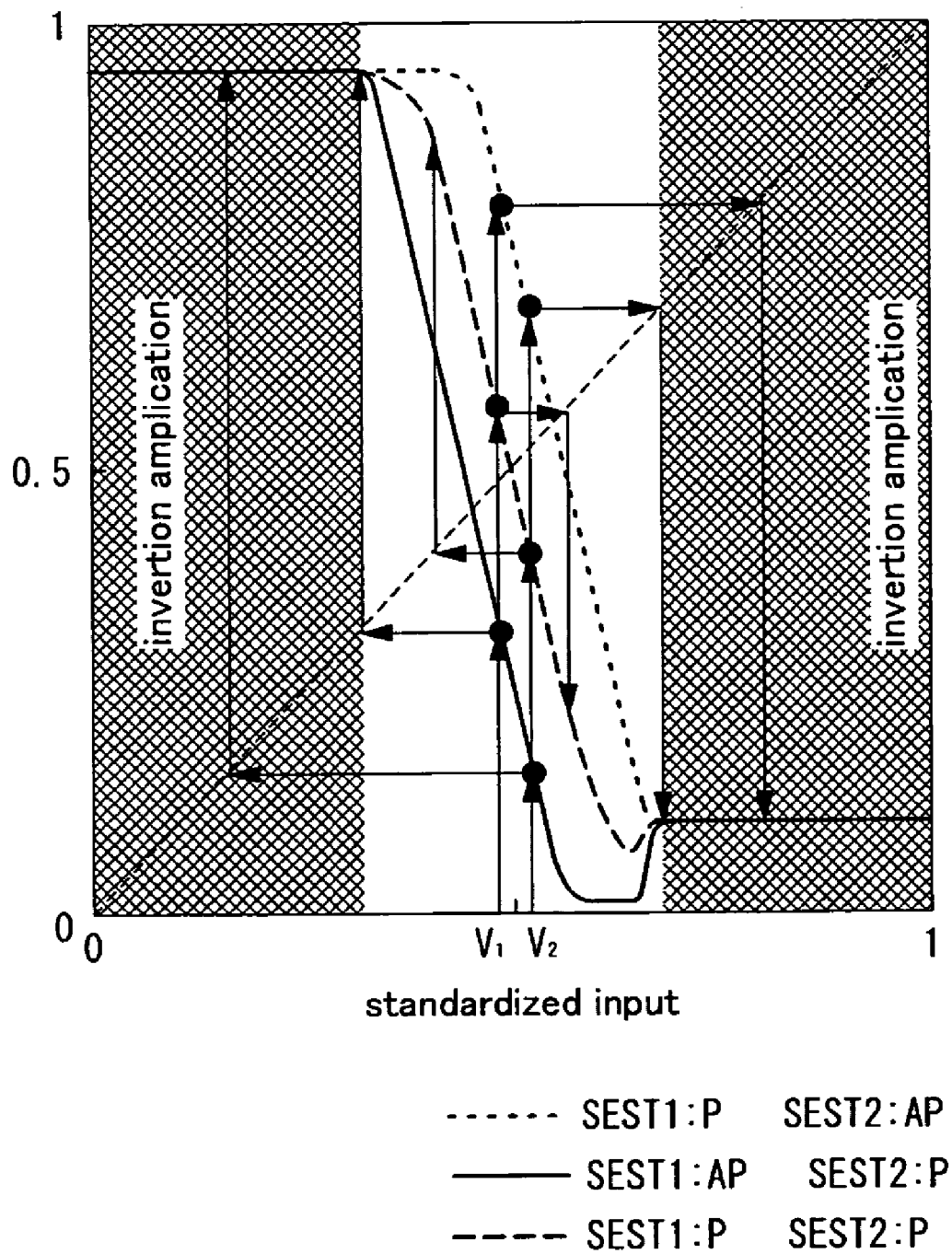
FIG. 17 shows the results of a simulation performed on the input/output characteristics of the inverter circuit of the first embodiment, with the input/output characteristics of a case where SEST1 and SEST2 both have the parallel arrangement being added.

A third embodiment is an example of an asymmetrical logic circuit including SESTs. First, the principles of this embodiment are described. The broken line in FIG. 17 indicates the input/output curve of the inverter circuit of the first embodiment shown in FIG. 11 in a case where the magnetization arrangement of each of the SEST1 (100) and the SEST2 (110) is the parallel arrangement (P). In such a case, the inverter circuit becomes an inverter having a logic threshold value of 0.5.

In a case where an input is equal to or smaller than "0.5" ($V_1$), the output is greater than "0.5". When an inverter circuit having an A-D converter function is connected in the next stage, almost "0" can be output. In a case where the input is equal to or greater than "0.5" ($V_2$), the output is smaller than "0.5". When an inverter circuit having an A-D converter function is connected in the next stage, almost "1" can be output.

In a case where the magnetization arrangement of the SEST1 (100) is the parallel arrangement (P) while the magnetization arrangement of the SEST2 (110) is the antiparallel arrangement (AP) (the dotted line in FIG. 17), the output is larger than "0.5" whether the input is $V_1$ or $V_2$, and almost "0" can be output by an inverter circuit having an A-D converter function in the next stage. On the other hand, in a case where the magnetization arrangement of the SEST1 (100) is the antiparallel arrangement (AP) while the magnetization arrangement of the SEST2 (110) is the parallel arrangement (P) (the solid line in FIG. 17), the output is smaller than "0.5"

whether the input is $V_1$ or $V_2$, and almost "1" can be output by an inverter circuit having an A-D converter function in the next stage.

Accordingly, a logic circuit that can reconfigure the function of an AND/OR/asymmetric function "1010" can be realized, if "0", $V_1$ (<"0.5"), $V_2$ (>"0.5"), and "1" can be realized as analog inputs.

The gate capacitances 137a and 147a connected to the first input terminal 150 of the circuit structure of the second embodiment shown in FIG. 13 are replaced with $xC_{in}$, and the gate capacitances 137b and 147b connected to the second input terminal 151 are replaced with $(1-x)C_{in}$. Here, x is greater than 0 and is smaller than 0.5.

Figure 18:
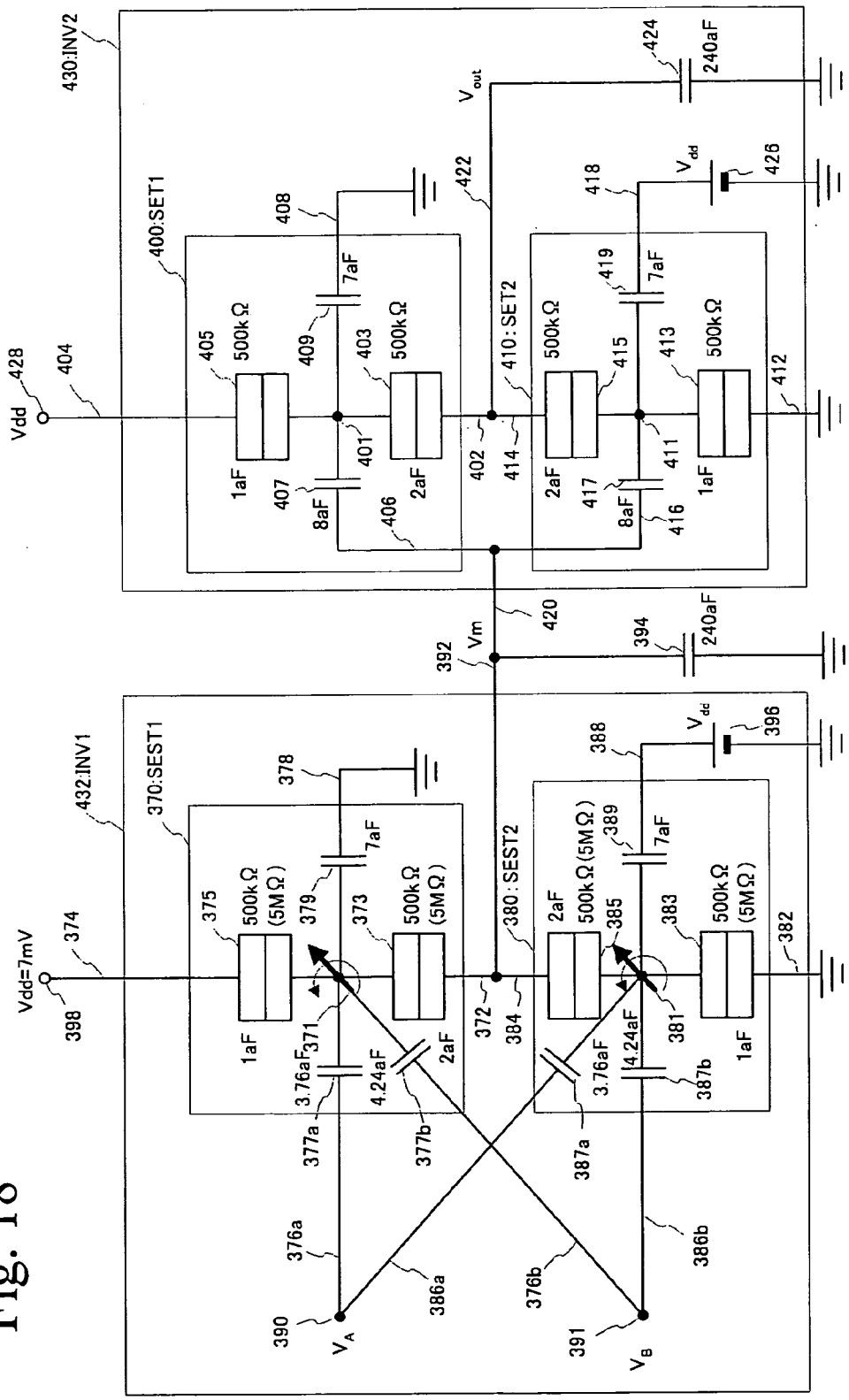
FIG. 18 is a circuit diagram showing the resistance values, the capacitance values and the voltage values used in simulations of the outputs of a logic circuit in accordance with a third embodiment.

FIG. 18 is a circuit diagram of the logic circuit in accordance with the third embodiment. The circuit structure is the same as that of the second embodiment, except for the capacitance values. A first inverter circuit INV1 (432) includes a SEST1 (370) and a SEST2 (380). The source 372 of the SEST1 (370) is connected to an output terminal 392 of the INV1 (432), and the drain 374 is connected to a first power supply terminal 398. Tunnel junctions 373 and 375 are provided between an island 371 and the source 372 and between the island 371 and the drain 374, respectively. A first gate 376a is connected to a first input terminal 390, and a second gate 376b is connected to a second input terminal 391. A control gate 378 is grounded. A first gate capacitance 377a exists between the island 371 and the first gate 376a, and a second gate capacitance 377b exists between the island 371 and the second gate 376b. A control gate capacitance 379 exists between the island 371 and the control gate 378.

The source 382 of the SEST2 (380) is grounded (or connected to the second power supply terminal), and the drain 384 is connected to the output terminal 392 of the INV1 (432). Tunnel junctions 383 and 385 are provided between an island 381 and the source 382 and between the island 381 and the drain 384, respectively. A first gate 386a is connected to the first input terminal 390, and a second gate 386b is connected to the second input terminal 391. A control gate 388 is connected to a power supply $V_{dd}$ 396. A first gate capacitance 387a exists between the island 381 and the first gate 386a, and a second gate capacitance 387b exists between the island 381 and the second gate 386b. The output terminal 392 is grounded via a capacitance 394.

Further, the output terminal 392 of the INV1 (432) is connected to an input terminal 420 of the second inverter circuit (INV2) 430. The INV2 (430) is a Tucker-type inverter circuit, and includes a SET1 (400) and a SET2 (410) that are two single-electron transistors (SET).

The source 402 of the SET1 (400) is connected to an output terminal 422, and the drain 404 is connected to a power supply $V_{dd}$ 428. Tunnel junctions 403 and 405 are provided between an island 401 and the source 402 and between the island 401 and the drain 404, respectively. A gate 406 is connected to the output terminal 392 of the INV1 (432). A control gate 408 is grounded. A gate capacitance 407 exists between the island 401 and the gate 406. A control gate capacitance 409 exists between the island 401 and the control gate 408.

The source 412 of the SET2 (410) is grounded, and the drain 414 is connected to the output terminal 422. Tunnel junctions 413 and 415 are provided between an island 411 and the source 412 and between the island 411 and the drain 414, respectively. A gate 416 is connected to the output terminal 392 of the INV1 (432). A control gate 418 is connected to a power supply $V_{dd}$ 426. A gate capacitance 417 exists between the island 411 and the gate 416. A control gate 419 is provided between the island 411 and the control gate 418. The output terminal 422 is grounded via a capacitance 424.

As described above, the circuit structure of the third embodiment is the same as that of the second embodiment, except that the SEST1 (370) and the SEST2 (380) have difference gate capacitances.

Figure 19:
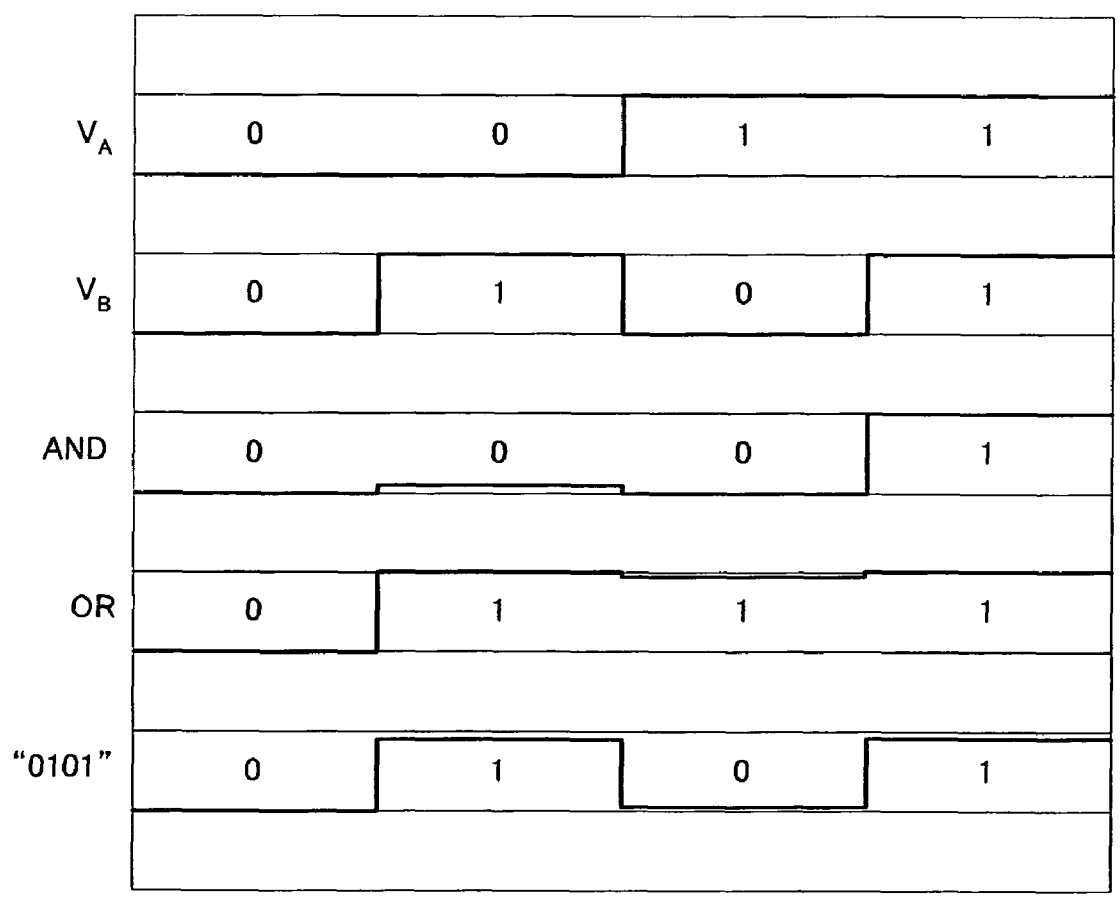
FIG. 19 shows the results of simulations performed on the outputs of an AND function, the OR function, and the "0101" function of the logic circuit in accordance with the third embodiment.

Table 3 shows a truth table of inputs to the logic circuit in accordance with the third embodiment. Table 4 is a truth table of the logic circuit in accordance with the third embodiment. Simulations of the output $V_{out}$ of the third embodiment were performed. FIG. 18 shows the capacitance values, the resistance values, and the voltage values that were used in the simulations. FIG. 19 shows the results of the $V_{out}$ simulations. FIG. 19 shows the output $V_{out}$ of the output terminal 422 of the INV2 (430) of each function (AND, OR, "0101") where the input $V_A$ of the first input terminal 390 and the input $V_B$ of the second input terminal 391 are "0" or "1". The low level is standardized as "0", and the high level is standardized as "1". The lower line of each of AND, OR, and "0101" indicates "0", and the upper line indicates "1".

TABLE 3

| $V_A$ | $V_B$ | Vin = XVA + (1 − X)VB |
|---|---|---|
| "0" | "0" | "0" |
| "0" | "1" | V2 = 1 − X > "0.5" |
| "1" | "0" | V1 = X < "0.5" |
| "1" | "1" | "1" |

TABLE 4

| | | | | | | $V_{out}$ | | | | |
|---|---|---|---|---|---|---|---|---|---|---|
| SEST1 | SEST2 | $V_A$ | 0 | 0 | 1 | 1 | $V_m$ (in order of Vm) | | | function |
| | | $V_B$ | 0 | 1 | 0 | 1 | | | | | |
| AP | P | | "1" | "0" | "0" | "0" | "0" | "1" | "1" | "1" | OR |
| P | AP | | "1" | "1" | "1" | "0" | "0" | "0" | "0" | "1" | AND |
| P | P | | "1" | "0" | "1" | "0" | "0" | "1" | "0" | "1" | "0101" |

In a case where the magnetization arrangement of the SEST1 (370) is the antiparallel arrangement (AP) and the magnetization arrangement of the SEST2 (380) is the parallel arrangement (P), the logic circuit in accordance with the third embodiment exhibits an OR circuit function. In a case where the magnetization arrangement of the SEST1 (370) is the parallel arrangement (P) and the magnetization arrangement of the SEST2 (380) is the antiparallel arrangement (AP), the logic circuit in accordance with the third embodiment exhibits an AND circuit function. In a case where the magnetization arrangement of each of the SEST1 (370) and the SEST2 (380) is the parallel arrangement (P), the logic circuit in accordance with the third embodiment exhibits a "0101" function.

In the third embodiment, the first input terminal 390 is capacitively coupled to the island 371 of the SEST1 (370) and the island 381 of the SEST2 (380) via the gate capacitances 377a and 387a having the same capacitance value of 3.76 aF. The second input terminal 391 is capacitively coupled to the island 371 of the SEST1 (370) and the island 381 of the SEST2 (380) via the gate capacitances 377b and 387b having the same capacitance value of 4.24 aF.

In the INV1 (432), the capacitance values of the first gate capacitance 377a of the SEST1 (370) and the first gate capacitance 387a of the SEST2 (380) are substantially the same, and the capacitance values of the second gate capacitance 377b of the SEST1 (370) and the first gate capacitance 387b of the SEST2 (380) are substantially the same. However, the capacitance values of the first gate capacitance 377a of the SEST1 (370) and the first gate capacitance 387a of the SEST2 (380) are different from the capacitance values of the second gate capacitance 377b of the SEST1 (370) and the first gate capacitance 387b of the SEST2 (380).

Accordingly, in the INV1 (430), the weights of analog inputs of an input $V_A$ from the first input terminal 390 to the SEST1 (370) and the SEST2 (380) are substantially the same, and the weights of analog inputs of an input $V_B$ from the second input terminal 391 to the SEST1 (370) and the SEST2 (380) are substantially the same. However, the weights of the analog inputs of the input $V_A$ from the first input terminal 390 to the SEST1 (370) and the SEST2 (380) are different from the weights of the analog inputs of the input $V_B$ from the second input terminal 391 to the SEST1 (370) and the SEST2 (380).

Here, the substantially same capacitance values and the substantially same weights are within the range in which the logic circuit in accordance with the third embodiment can reconfigure a two-input AND circuit function and a two-input OR circuit function in a nonvolatile manner by varying the magnetization direction of a ferromagnetic island having a variable magnetization direction in each SEST. The different capacitance values and the different weights indicate that the inputs to the INV1 (432) are different between a case where the input $V_A$ is "1" and the input $V_B$ is "0" and a case where the input $V_A$ is "0" and the input $V_B$ is "1". The different inputs to the INV1 (432) are within the range in which the logic circuit in accordance with the third embodiment functions as a asymmetric Boolean function when the SEST1 (370) and the SEST2 (380) both have the parallel arrangement.

As described above, by inputting analog inputs to the INV1 (432) from the first input terminal 390 and the second input terminal 391, a logic circuit having a "0101" function that is a asymmetric Boolean function, as well as an AND circuit function and an OR circuit function, can be realized. In the third embodiment, a logic circuit having a NAND circuit function, a NOR circuit function, and a "1010" function can be formed without the INV2 (430). However, to achieve outputs closer to the low level "0" and the high level "1", it is preferable that the INV2 (430) having an inverting amplification function of A-D conversion is added.

As described above, in accordance with the third embodiment, by varying the magnetization direction of a ferromagnetic material having a variable magnetization direction, a two-input AND circuit function, a two-input OR circuit function, and a "0101" function that is a asymmetric Boolean function can be reconfigured in a nonvolatile manner. Further, by combining the small gate capacitances between the gates and the islands, analog inputs can be made, and the circuit area can be made very small. Furthermore, the power consumption and the area of each SEST as a transistor are small.

Thus, this embodiment can provide a logic circuit that can reconfigure an AND circuit function, an OR circuit function, and a "0101" function in a nonvolatile manner, and has a small circuit area and a small power consumption.

Fourth Embodiment

Figure 20:
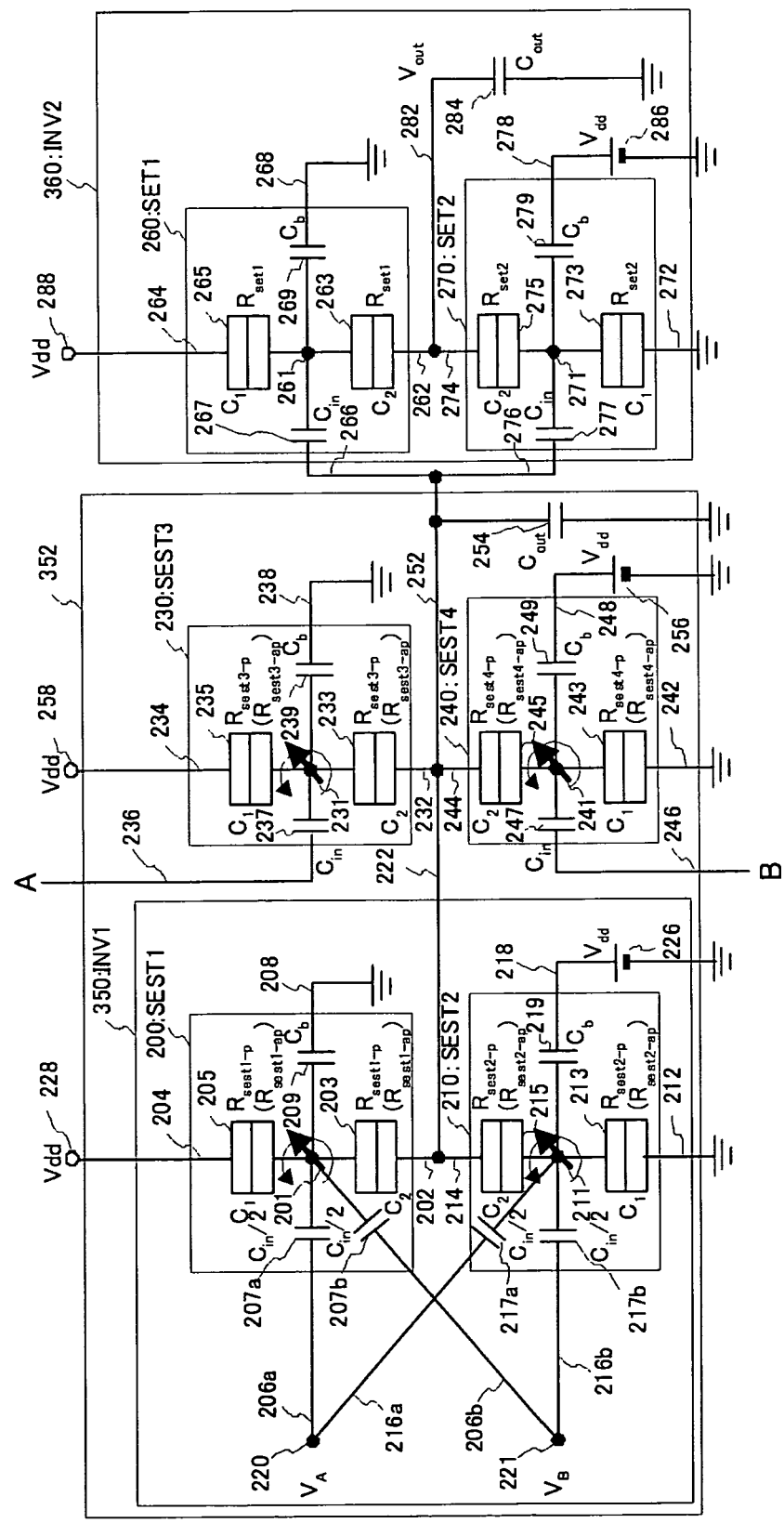
FIG. 20 is a circuit diagram (1) of a logic circuit in accordance with a fourth embodiment, where the line A is connected to the line A of FIG. 21, and the line B is connected to the line B of FIG. 22.
Figure 21:
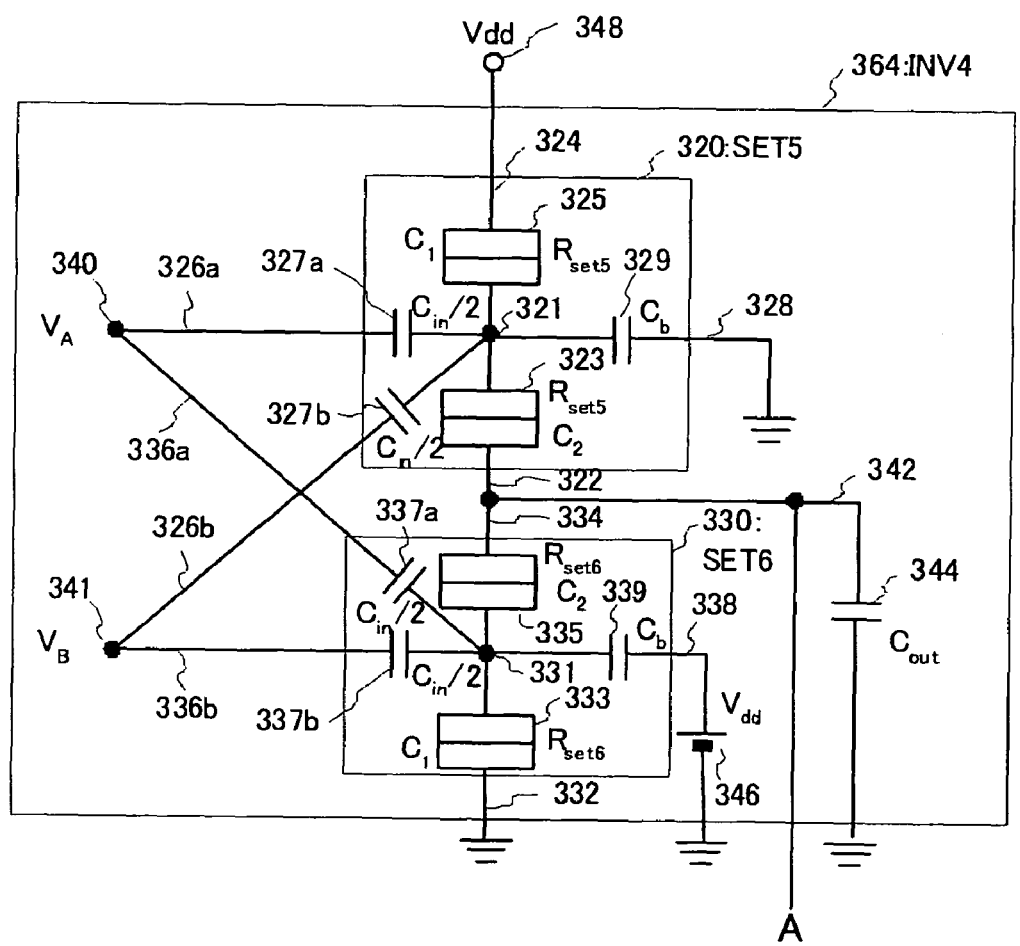
FIG. 21 is a circuit diagram (2) of the logic circuit in accordance with the fourth embodiment, where the line A is connected to the line A of FIG. 20.
Figure 22:
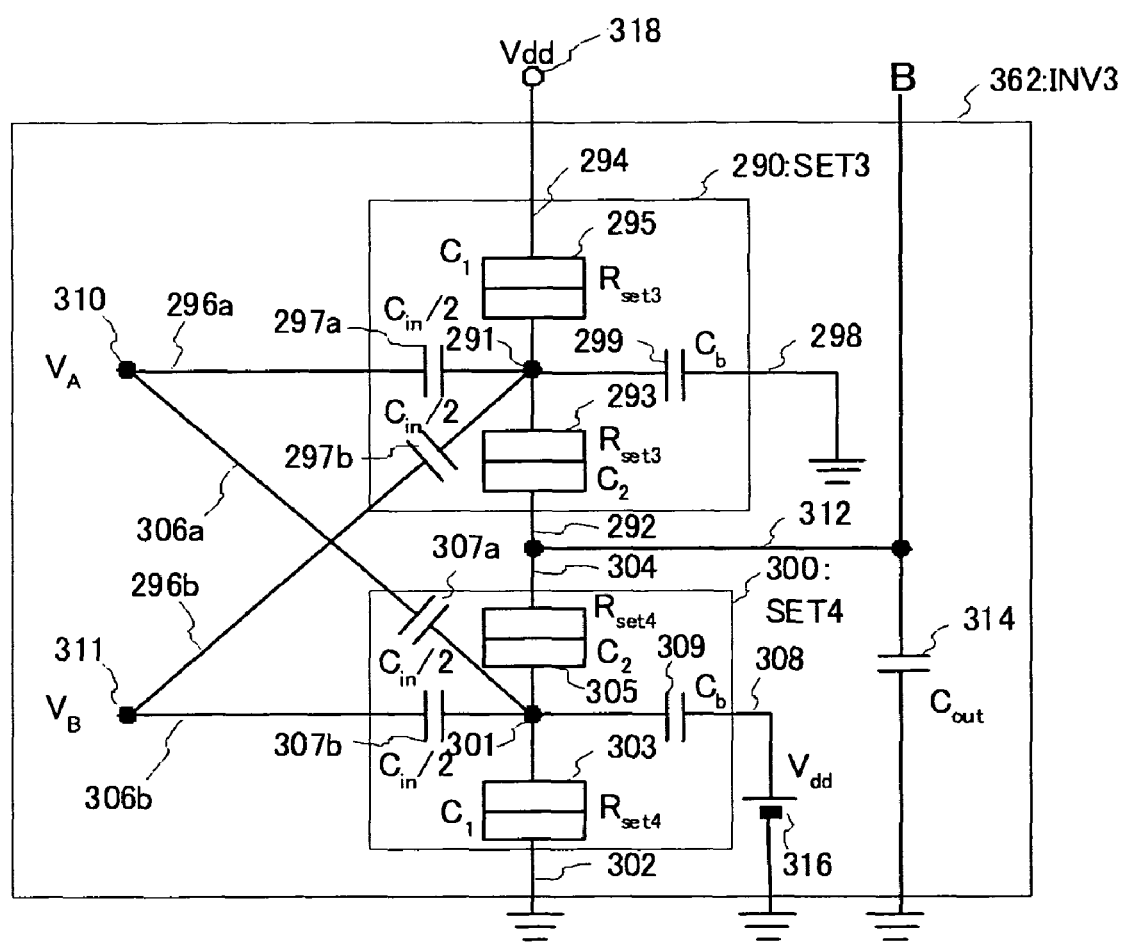
FIG. 22 is a circuit diagram (3) of the logic circuit in accordance with the fourth embodiment, where the line B is connected to the line B of FIG. 20.

A fourth embodiment is an example of a logic circuit that can reconfigure all the symmetric Boolean functions by varying the magnetization direction of a ferromagnetic island having a variable magnetization direction in each SEST. FIGS. 20, 21, and 22 are circuit diagrams of the logic circuit in accordance with the fourth embodiment. The line A of FIG. 20 is connected to the line A of FIG. 21, and the line B is connected to the line B of FIG. 22. This logic circuit includes a first inverter circuit INV1 (350), a SEST3 (230), a SEST4 (240), a second inverter circuit INV2 (360), a third inverter circuit INV3 (362), and a fourth inverter circuit INV4 (364). The INV1 (350), the SEST3 (230), and the SEST4 (240) are shown in FIG. 20. The INV3 (362) is shown in FIG. 22, and the INV4 (364) is shown in FIG. 21. The first inverter circuit (INV1) 350 has the same circuit structure as the first inverter circuit 190 of the second embodiment.

As shown in FIG. 20, the first inverter circuit INV1 (350) includes two SESTs of a SEST1 (200) and a SEST2 (210). The source 202 of the SEST1 (200) is connected to an output terminal 222 of the INV1 (350), and the drain 204 is connected to a first power supply terminal 228. Tunnel junctions 203 and 205 are provided between an island 201 and the source 202 and between the island 201 and the drain 204, respectively. The tunnel junctions 203 and 205 have capacitance values $C_2$ and $C_1$, a resistance value $R_{sest1-p}$ in the parallel arrangement, and a resistance value $R_{sest1-ap}$ in the antiparallel arrangement. A first gate 206a is connected to the first input terminal 220, and a second gate 206b is connected to the second input terminal 221. A control gate 208 is grounded. The capacitance values of a first gate capacitance 207a between the island 201 and the first gate 206a, and a second gate capacitance 207b between the island 201 and the second gate 206b are $C_{in}/2$. The capacitance value of a control gate capacitance 209 between the island 201 and the control gate 208 is $C_b$.

The source 212 of the SEST2 (210) is grounded (or connected to the second power supply terminal), and the drain 214 is connected to the output terminal 222 of the INV1 (350). Tunnel junctions 213 and 215 are provided between an island 211 and the source 212 and between the island 211 and the drain 214, respectively. The tunnel junctions 213 and 215 have capacitance values $C_1$ and $C_2$, a resistance value $R_{sest2-p}$ in the parallel arrangement, and a resistance values $R_{sest2-ap}$ in the antiparallel arrangement. A first gate 216a is connected to the first input terminal 220, and a second gate 216b is connected to the second input terminal 221. A control gate 218 is connected to a power supply $V_{dd}$ 226. The capacitance values of a first gate capacitance 217a between the island 211 and the first gate 216a, and a second gate capacitance 217b between the island 211 and the second gate 216b are $C_{in}/2$.

The source 232 of the SEST3 (230) is connected to the output terminal 222 and a terminal 252 of the INV1 (350), and the drain 234 is connected to a third power supply terminal 258. Tunnel junctions 233 and 235 are provided between an island 231 and the source 232 and between the island 231 and the drain 234, respectively. The tunnel junctions 233 and 235 have capacitance values $C_2$ and $C_1$, a resistance value $R_{sest3-p}$ in the parallel arrangement, and a resistance value $R_{sest3-ap}$ in the antiparallel arrangement. A gate 236 is connected to an output terminal 342 of the INV4 (364). A control gate 238 is grounded. The capacitance value of a gate capacitance 237 between the island 231 and the gate 236 is $C_{in}$. The capacitance value of a control gate capacitance 239 between the island 231 and the control gate 238 is $C_b$.

The source 242 of the SEST4 (240) is grounded (or connected to the fourth power supply terminal), and the drain 244 is connected to the terminals 222 and 252 as the output terminals of the INV1 (350). Tunnel junctions 243 and 245 are provided between an island 241 and the source 242 and between the island 241 and the drain 244, respectively. The tunnel junctions 243 and 245 have capacitance values $C_1$ and $C_2$, a resistance value $R_{sest4-p}$ in the parallel arrangement, and a resistance values $R_{sest4-ap}$ in the antiparallel arrangement. A gate 246 is connected to an output terminal 312 of the INV3 (362). A control gate 248 is connected to a power supply $V_{dd}$ 256. The capacitance value of a gate capacitance 247 between the island 241 and the gate 246 is $C_{in}$. The terminal 252 is grounded via a capacitance 254.

The SEST3 (230) is switched on when the gate 236 is "0" (low level), and is switched off when the gate 236 is "1" (high level). The SEST4 (240) is switched off when the gate 246 is "0", and is switched on when the gate 246 is "1". Different voltages (ground and $V_{dd}$) are applied to the control gates 238 and 248 of the respective SESTs. With those voltages, the SEST3 (230) and the SEST4 (240) have different Coulomb threshold voltages. With those threshold voltages, adjustment is made with the control gate capacitances 239 and 249, so as to perform the opposite operations.

The INV2 (360) includes a SET1 (260) and a SET2 (270). The source 262 of the SET1 (260) is connected to an output terminal 282, and the drain 264 is connected to a power supply $V_{dd}$ 288. Tunnel junctions 263 and 265 have capacitance values $C_2$ and $C_1$, and a resistance value $R_{set1}$. A gate 266 is connected to the output terminal 222 of the INV1 (350). A control gate 268 is grounded. The capacitance value of a gate capacitance 267 between the island 261 and the gate 266 is $C_{in}$. The capacitance value of a control gate capacitance 269 between the island 261 and the control gate 268 is $C_b$.

The source 272 of the SET2 (270) is grounded, and the drain 274 is connected to the output terminal 282. Tunnel junctions 273 and 275 have capacitance values $C_1$ and $C_2$, and a resistance value $R_{set2}$. A gate 276 is connected to the output terminal 222 of the INV1 (350). A control gate 278 is connected to a power supply $V_{dd}$ 286. The capacitance value of a gate capacitance 277 between the island 271 and the gate 276 is $C_{in}$. The output terminal 282 is grounded via a capacitance 284.

As shown in FIG. 22, the INV3 (362) includes a SET3 (290) and a SET4 (300). The source 292 of the SET3 (290) is connected to an output terminal 312, and the drain 294 is connected to a power supply $V_{dd}$ 318. Tunnel junctions 293 and 295 have capacitance values $C_2$ and $C_1$, and a resistance value $R_{set3}$. A first gate 296a is connected to the first input terminal 310, and a second gate 296b is connected to the second input terminal 311. A control gate 298 is grounded. The capacitance values of a first gate capacitance 297a between the island 291 and the first gate 296a and a second gate capacitance 297b between the island 291 and the second gate 296b are $C_{in}/2$. The capacitance value of a control gate capacitance 299 between the island 291 and the control gate 298 is $C_b$.

The source 302 of the SET4 (300) is grounded, and the drain 304 is connected to the output terminal 312. Tunnel junctions 303 and 305 have capacitance values $C_1$ and $C_2$, and a resistance value $R_{set4}$. A first gate 306a is connected to the first input terminal 310, and a second gate 306b is connected to the second input terminal 311. A control gate 308 is connected to a power supply $V_{dd}$ 316. The capacitance values of a first gate capacitance 307a between the island 301 and the first gate 306a and a second gate capacitance 307b between the island 301 and the second gate 306b are $C_{in}/2$. The output terminal 312 is grounded via a capacitance 314, and is also connected to the gate 246 of the SEST4. The third inverter circuit (INV3) 362 is designed to have a logic threshold value Vth smaller than 0.5.

As shown in FIG. 21, the INV4 (364) includes a SET5 (320) and a SET6 (330). The source 322 of the SET5 (320) is connected to an output terminal 342, and the drain 324 is connected to a power supply $V_{dd}$ 348. Tunnel junctions 323 and 325 have capacitance values $C_2$ and $C_1$, and a resistance value $R_{set5}$. A first gate 326a is connected to the first input terminal 340, and a second gate 326b is connected to the second input terminal 341. A control gate 328 is grounded. The capacitance values of a first gate capacitance 327a between the island 321 and the first gate 326a and a second gate capacitance 327b between the island 321 and the second gate 326b are $C_{in}/2$. The capacitance value of a control gate capacitance 329 between the island 321 and the control gate 328 is $C_b$.

The source 332 of the SET6 (330) is grounded, and the drain 334 is connected to the output terminal 332. Tunnel junctions 333 and 335 have capacitance values $C_1$ and $C_2$, and a resistance value $R_{set6}$. A first gate 336a is connected to the first input terminal 340, and a second gate 336b is connected to the second input terminal 341. A control gate 338 is connected to a power supply $V_{dd}$ 346. The capacitance values of a first gate capacitance 337a between the island 331 and the first gate 336a and a second gate capacitance 337b between the island 331 and the second gate 336b are $C_{in}/2$. The output terminal 342 is grounded via a capacitance 344, and is also connected to the gate 236 of the SEST3 (230). The fourth inverter circuit (INV4) 264 is designed to have a logic threshold value Vth larger than 0.5.

In the fourth embodiment, the first power supply terminal 228 and the third power supply terminal 258 are connected to the same $V_{dd}$. The second power supply terminal 212 and the fourth power supply terminal 242 are grounded. However, when the logic circuit 352 functions, the first power supply terminal 228 and the third power supply terminal 258 may be connected to different power supplies, and the second power supply terminal 212 and the fourth power supply terminal 228 may be connected to different power supplies.

The second inverter circuit (INV2) 360 is a Tucker-type inverter that includes SETs. The second inverter circuit INV2 has an A-D converter function, and inverting-amplifies the output $V_m$ of the first inverter circuit INV1 (350). As long as those functions are satisfied, the second inverter circuit INV2 is not necessarily an inverter circuit including SETs. However, since the output current of the logic circuit 352 is very small, it is preferable that an inverter circuit including SETs that can drive even by a small output current is used.

In the fourth embodiment, the third inverter circuit (INV3) 362 and the fourth inverter circuit (INV4) 364 are Tucker-type inverter circuits that include SETs, and have a logic threshold value of 0.5 or smaller and a logic threshold value of 0.5 or larger, respectively. The third inverter circuit (INV3) 362 can function as long as the logic threshold value is equal to 0.5 or smaller, and the fourth inverter circuit (INV4) 364 can function as long as the logic threshold value is equal to 0.5 or larger. For example, the third inverter circuit (INV3) 362 and the fourth inverter circuit (INV4) 364 may be inverter circuits that include conventional MOSFETs. In such a case, however, it is necessary to prepare a floating gate for analog inputs. Also, the power consumption becomes larger. Therefore, to reduce the circuit area and the power consumption, it is preferable to use SETs as in the fourth embodiment.

The first input terminal 310 of the INV3 (362) and the first input terminal 340 of the INV4 (364) are connected to the input $V_A$, to which the first input terminal 220 of the INV1 (350) is also connected. The second input terminal 311 of the INV3 (362) and the second input terminal 341 of the INV4 (364) are connected to the input $V_B$, to which the second input terminal 221 of the INV1 (350) is also connected.

Accordingly, the input terminals of the INV3 (362) are connected to the first input terminal 220 and the second input terminal 221 of the INV1 (350). Also, the input terminals of the INV4 (364) are connected to the first input terminal 220 and the second input terminal 221 of the INV1 (350).

The capacitance values of the first gate capacitance 297a and the second gate capacitance 297b of the SET3 and the first gate capacitance 307a and the second gate capacitance 307b of the SET4 of the INV3 (362) are substantially the same. The capacitance values of the first gate capacitance 327a and the second gate capacitance 327b of the SET5 and the first gate capacitance 337a and the second gate capacitance 337b of the SET6 of the INV4 (364) are substantially the same. Further, the capacitance values of the first gate capacitance 207a and the second gate capacitance 207b of the SEST1 and the first gate capacitance 217a and the second gate capacitance 217b of the SEST2 of the INV1 (350) are substantially the same.

Accordingly, the weights of analog inputs from the first input terminal 310 and the second input terminal 311 to the INV3 (362), and the weights of analog inputs from the first input terminal 340 and the second input terminal 341 to the INV4 (364) are substantially the same as the weights of the analog inputs from the first input terminal 220 and the second input terminal 221 to the INV1 (350).

Here, the substantially same capacitance values and the substantially same weights are within the range in which the logic circuit in accordance with the fourth embodiment can reconfigure all the symmetric Boolean functions by varying the magnetization direction of the ferromagnetic island in each SEST having a variable magnetization direction.

In the above manner, the analog inputs "0", "0.5", and "1" to the INV1 (350), the INV3 (362), and the INV4 (364) are realized as in the second embodiment. Having a logic threshold value of 0.5 or smaller, the INV3 (362) outputs "1", "0", and "0" (output $V_{Inv3-out}$) in response to the input $V_{in}$ "0", "0.5", and "1", respectively. On the other hand, having a logic threshold value of 0.5 or greater, the INV4 (364) outputs "1", "1", and "0" (output $V_{Inv4-out}$) in response to the input $V_{in}$ "0", "0.5", and "1", respectively.

Figure 23:
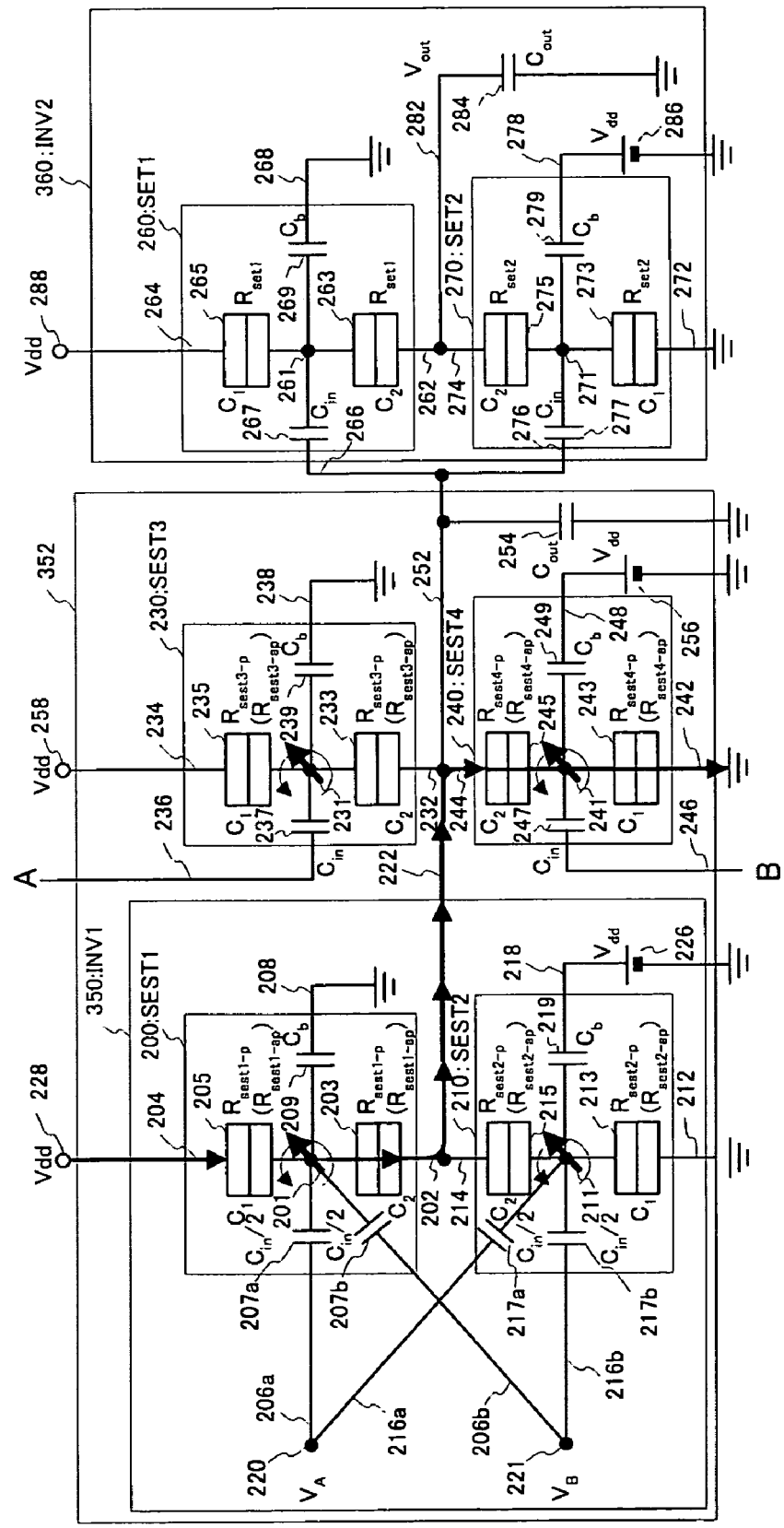
FIG. 23 is a circuit diagram for explaining an operation to be performed in a case where "0" is input to the logic circuit in accordance with the fourth embodiment.

Next, operations of the logic circuit in accordance with the fourth embodiment are described. Referring first to FIG. 23, a case where the input $V_A$ is "0" and the input $V_B$ is "0" is described. The INV3 (362) is the same as the structure shown in FIG. 22, and the INV4 (364) is the same as the structure shown in FIG. 21. As the input $V_{in}$ is "0", the SEST1 (200) is switched on, and the SEST2 (210) is switched off. As the output $V_{Inv4-out}$ of the INV4 (364) is "1", the SEST3 (230) is switched off. As the output $V_{Inv3-out}$ of the INV3 (362) is "1", the SEST4 (240) is switched on. Accordingly, as indicated by the arrows in FIG. 23, a current flows from the first power supply terminal 228 to the ground via the SEST1 (200), the output terminal 222 of the INV1 (350), and the SEST4 (240). Here, the output $V_{out}$ of the logic circuit in accordance with the fourth embodiment is varied by changing the resistance values of the SEST1 (200) and the SEST4 (240).

If the resistance value of the SEST1 (200) is greater than the resistance value of the SEST4 (240), the output $V_m$ of the terminal 252 is almost "0", and the output $V_{out}$ is "1". If the resistance value of the SEST1 (200) is smaller than the resistance value of the SEST4 (240), the output $V_m$ of the terminal 252 is almost "1", and the output $V_{out}$ is "0". If the resistance values of the tunnel junctions in the SEST1 (200) and the SEST4 (240) are designed to satisfy $R_{sest4-p}<R_{sest1-p}<R_{sest1-ap}<R_{sest4-ap}$, the output can be reconfigured by changing the magnetization arrangement of the SEST4 (240). When the magnetization arrangement of the SEST4 (240) is the parallel arrangement (P), the output $V_{out}$ is "1". When the magnetization arrangement of the SEST4 (240) is the antiparallel arrangement (AP), the output $V_{out}$ is "0".

Figure 24:
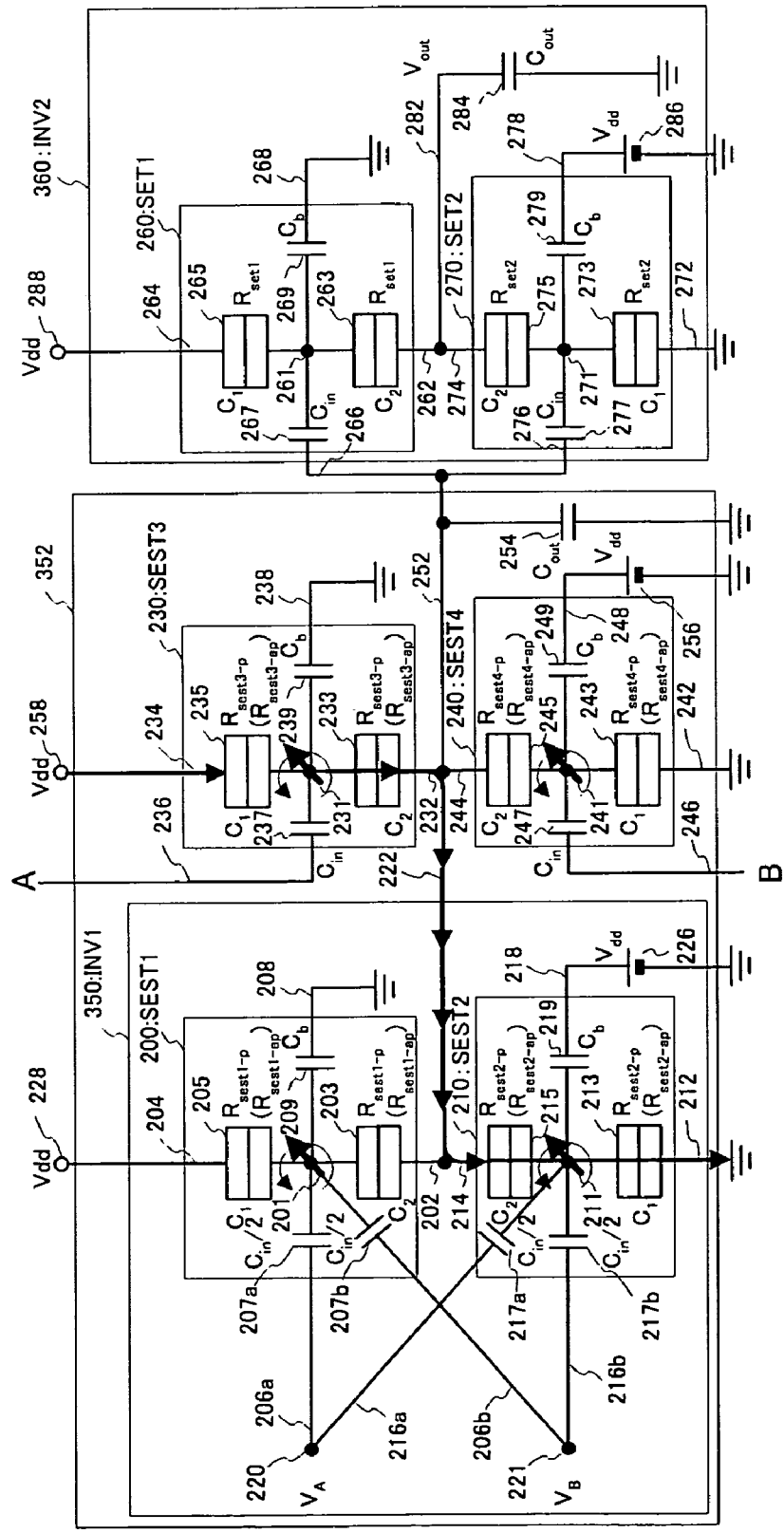
FIG. 24 is a circuit diagram for explaining an operation to be performed in a case where "1" is input to the logic circuit in accordance with the fourth embodiment.

Referring now to FIG. 24, a case where the input $V_A$ is "1" and the input $V_B$ is "1" is described. The INV3 (362) is the same as the structure shown in FIG. 22, and the INV4 (364) is the same as the structure shown in FIG. 21. As the input $V_{in}$ is "1", the SEST1 (200) is switched off, and the SEST2 (210) is switched on. As the output $V_{Inv4-out}$ of the INV4 (364) is "0", the SEST3 (230) is switched on. As the output $V_{Inv3-out}$ of the INV3 (362) is "0", the SEST4 (240) is switched off. Accordingly, as indicated by the arrows in FIG. 24, a current flows from the third power supply terminal 258 to the ground via the SEST3 (230), the output terminal 222 of the INV1 (350), and the SEST2 (210). Here, the output $V_{out}$ of the logic circuit in accordance with the fourth embodiment is varied by changing the resistance values of the SEST2 (210) and the SEST3 (230).

If the resistance value of the SEST2 (210) is greater than the resistance value of the SEST3 (230), the output $V_m$ of the terminal 252 is almost "1", and the output $V_{out}$ is "0". If the resistance value of the SEST2 (210) is smaller than the resistance value of the SEST3 (230), the output $V_m$ of the terminal 252 is almost "0", and the output $V_{out}$ is "1". If the resistance values of the tunnel junctions in the SEST2 (210) and the SEST3 (230) are designed to satisfy $R_{sest3-p}<R_{sest2-p}<R_{sest2-ap}<R_{sest3-ap}$, the output can be reconfigured by changing the magnetization arrangement of the SEST3 (230). When the magnetization arrangement of the SEST3 (230) is the parallel arrangement (P), the output $V_{out}$ is "0". When the magnetization arrangement of the SEST3 (230) is the antiparallel arrangement (AP), the output $V_{out}$ is "1".

Figure 25:
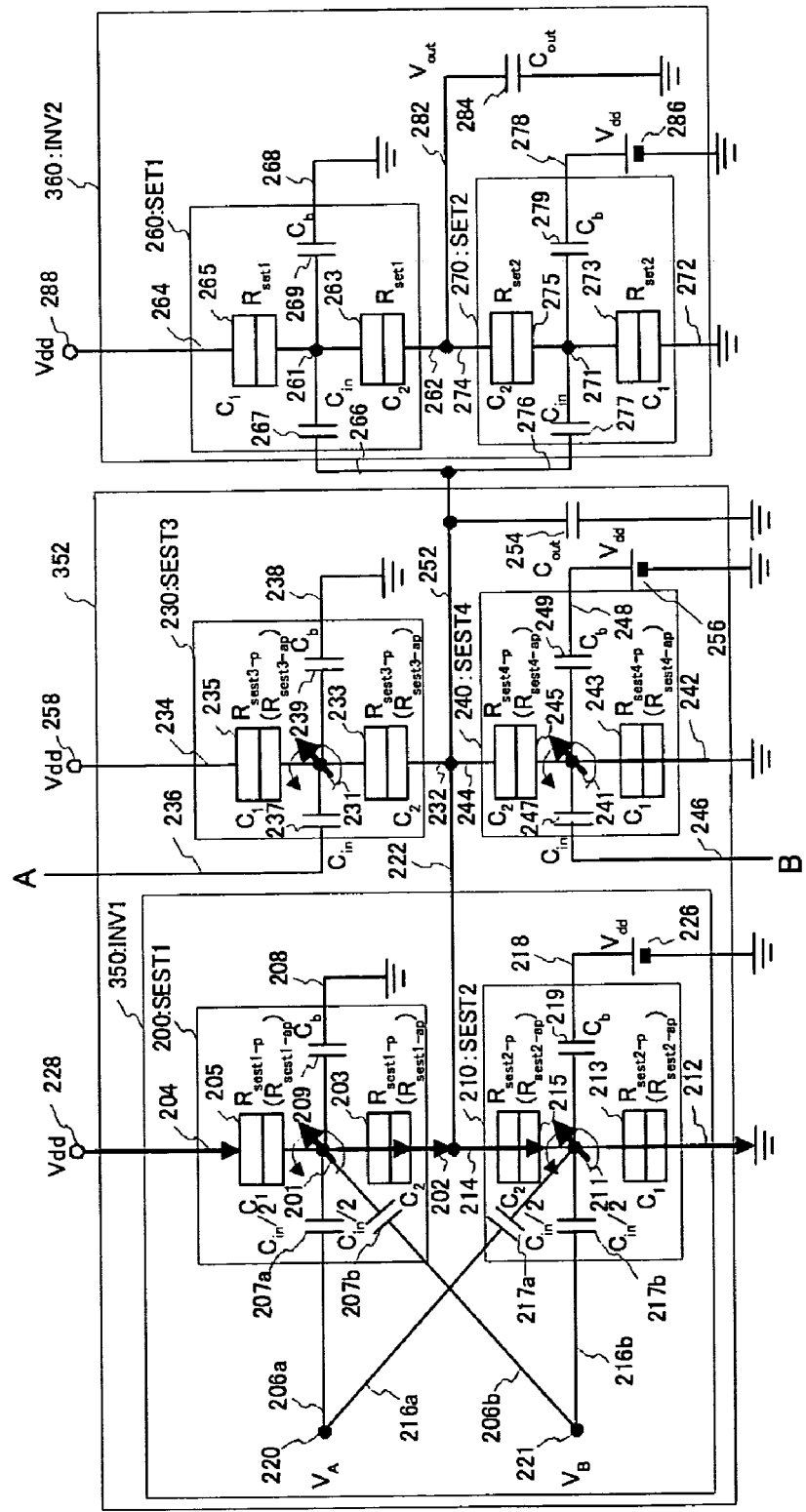
FIG. 25 is a circuit diagram for explaining an operation to be performed in a case where "0.5" is input to the logic circuit in accordance with the fourth embodiment.

Referring now to FIG. 25, a case where the input $V_A$ is "0" and the input $V_B$ is "1", or the input $V_A$ is "1" and the input $V_B$ is "0" is described. The INV3 (362) is the same as the structure shown in FIG. 22, and the INV4 (364) is the same as the structure shown in FIG. 21. As the input $V_{in}$ is "0.5", the SEST1 (200) and the SEST2 (210) are both switched on. Since the logic threshold value of the INV4 (364) is greater than 0.5, the output $V_{Inv4-out}$ becomes "1", the SEST3 (230) is switched off. Since the logic threshold value of the INV3 (362) is smaller than 0.5, the output $V_{Inv3-out}$ becomes "0", and the SEST4 (240) is switched off. Accordingly, as indicated by the arrows in FIG. 24, a current flows from the first power supply terminal 228 to the ground via the SEST1 (200) and the SEST2 (210). Here, the output $V_{out}$ of the logic circuit in accordance with the fourth embodiment is varied by changing the resistance values of the SEST1 (200) and the SEST2 (210).

If the resistance value of the SEST1 (200) is greater than the resistance value of the SEST2 (210), the output $V_m$ of the terminal 252 is almost "0", and the output $V_{out}$ is "1". If the resistance value of the SEST1 (200) is smaller than the resistance value of the SEST2 (210), the output $V_m$ of the terminal 252 is almost "1", and the output $V_{out}$ is "0". If the resistance values of the tunnel junctions in the SEST1 (200) and the SEST2 (210) are designed to satisfy $R_{sest1-p}=R_{sest2-p}<R_{sest1-ap}=R_{sest2-ap}$, the output can be reconfigured by changing the magnetization arrangements of the SEST1 (200) and the SEST2 (210). When the magnetization arrangement of the SEST1 (200) is the parallel arrangement (P) and the magnetization arrangement of the SEST2 (210) is the antiparallel arrangement (AP), the output $V_{out}$ is "0". When the magnetization arrangement of the SEST1 (200) is the antiparallel arrangement (AP) and the magnetization arrangement of the SEST2 (210) is the antiparallel arrangement (AP), the output $V_{out}$ is "1".

Figure 26:
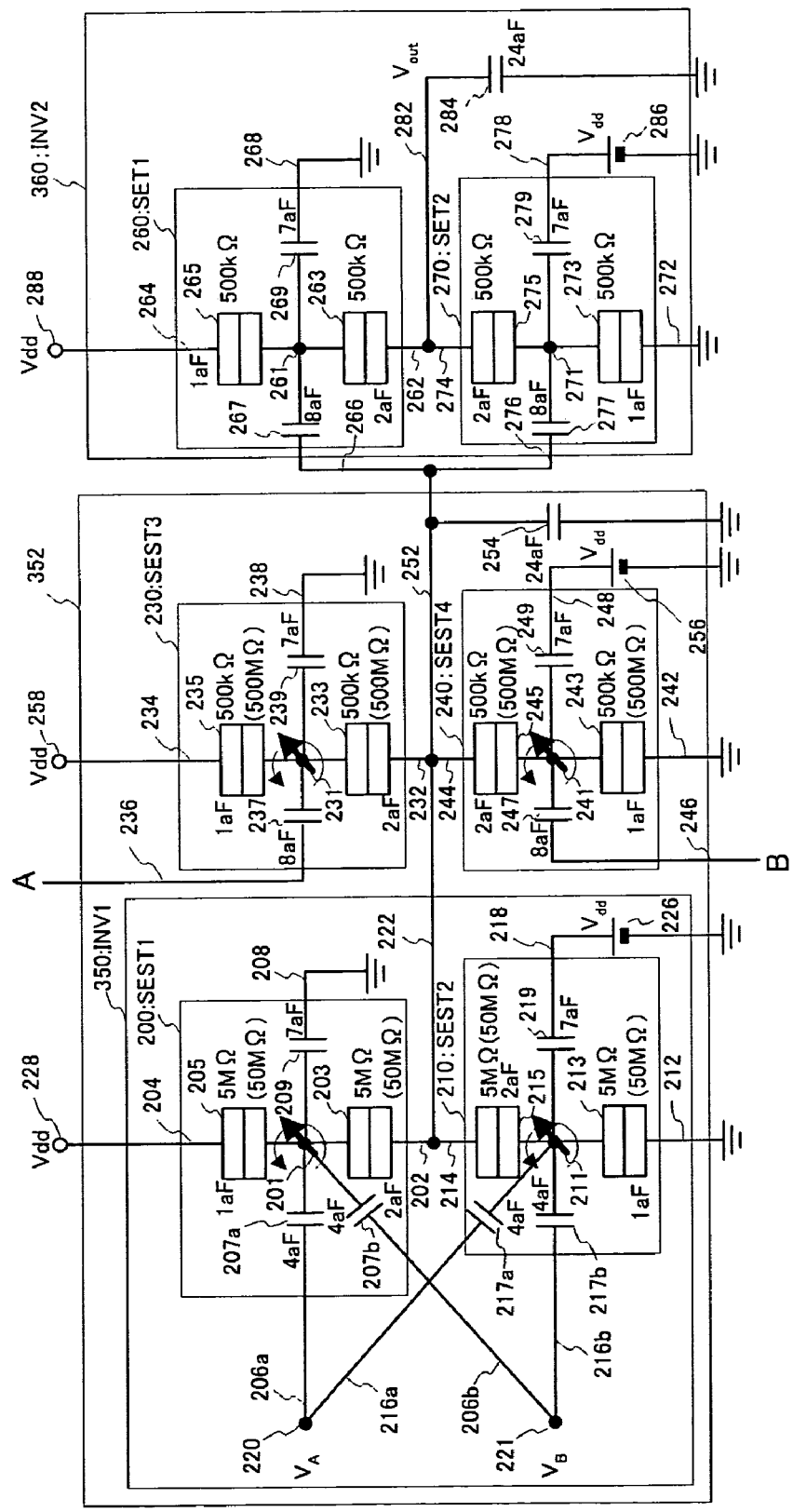
FIG. 26 is a circuit diagram (1) showing the resistance values, the capacitance values, and the voltage values used in simulations of the outputs of the logic circuit in accordance with the fourth embodiment, where the line A is connected to the line A of FIG. 27, and the line B is connected to the line B of FIG. 28.
Figure 27:
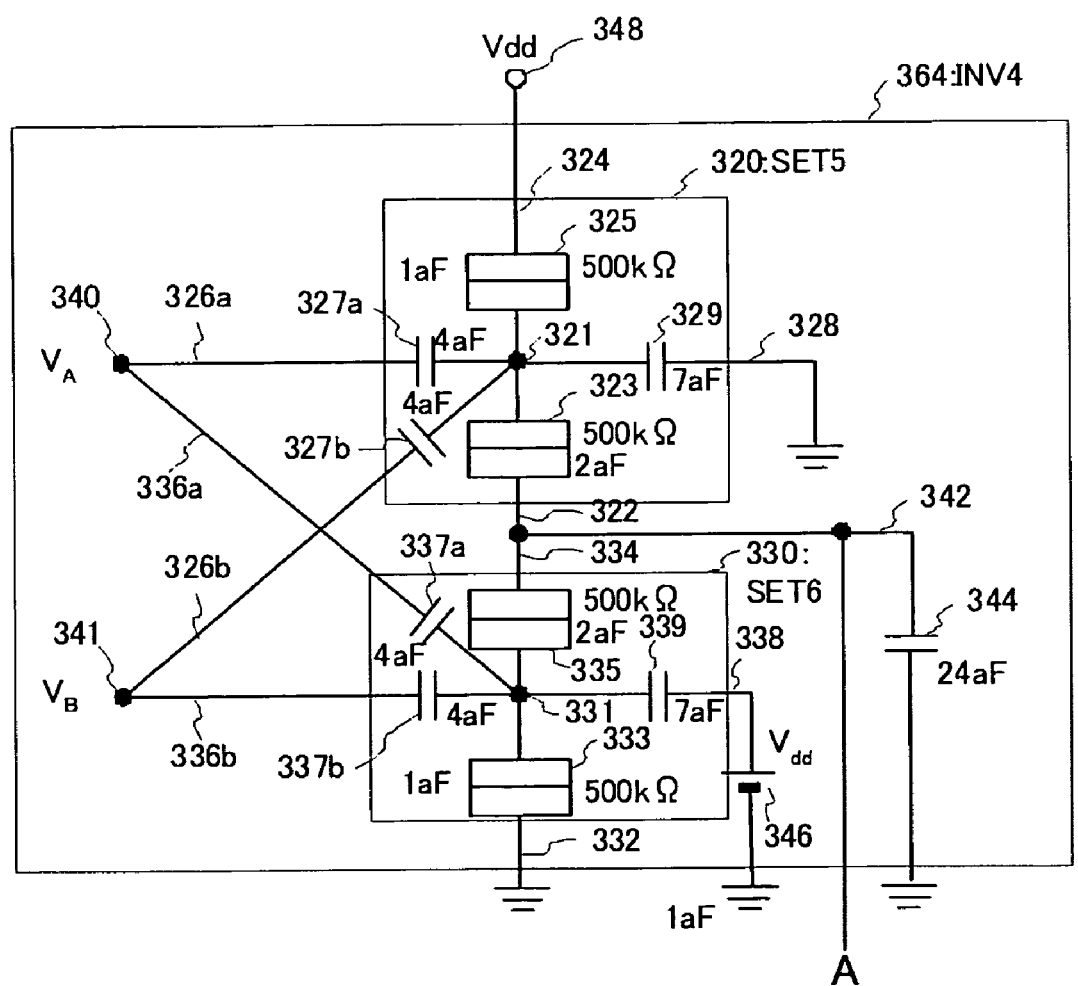
FIG. 27 is a circuit diagram (2) showing the resistance values, the capacitance values, and the voltage values used in the simulations of the outputs of the logic circuit in accordance with the fourth embodiment, where the line A is connected to the line A of FIG. 26.
Figure 28:
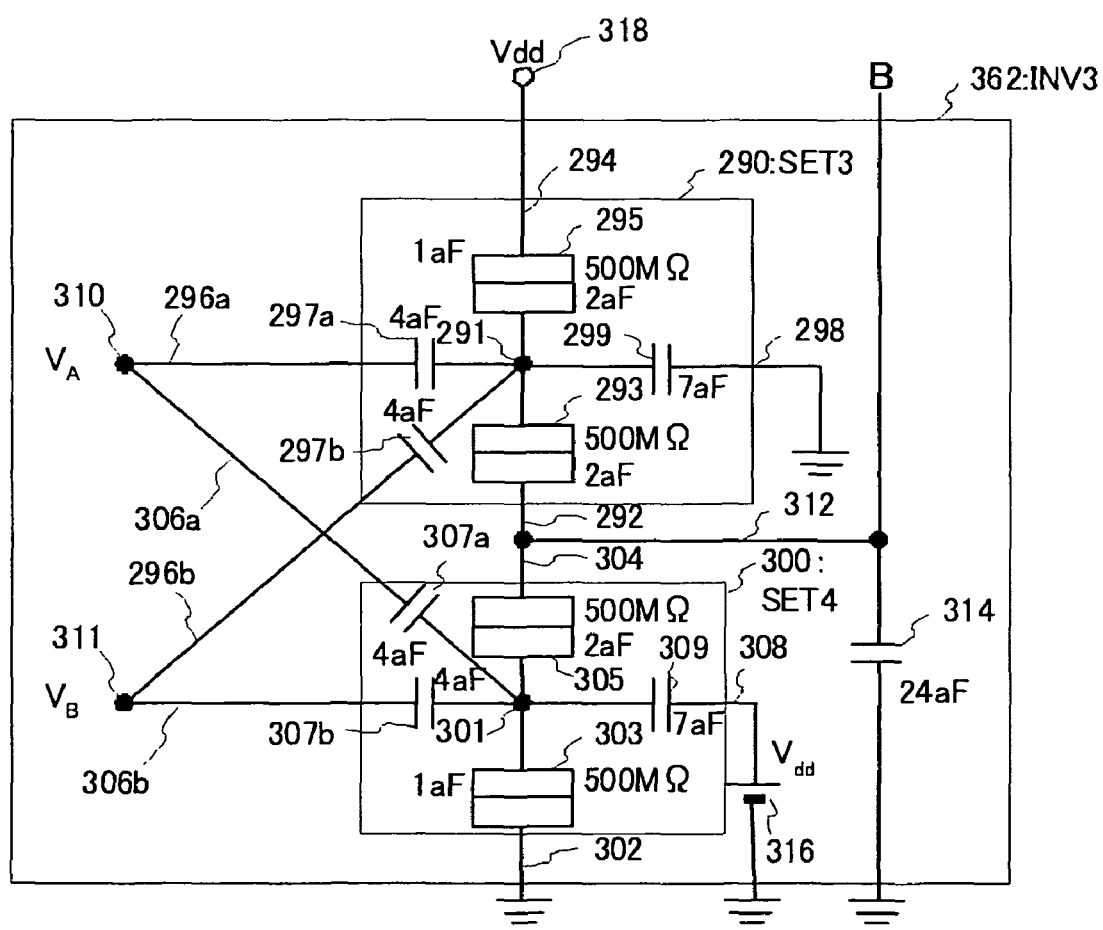
FIG. 28 is a circuit diagram (3) showing the resistance values, the capacitance values, and the voltage values used in the simulations of the outputs of the logic circuit in accordance with the fourth embodiment, where the line B is connected to the line B of FIG. 26.
Figure 29:
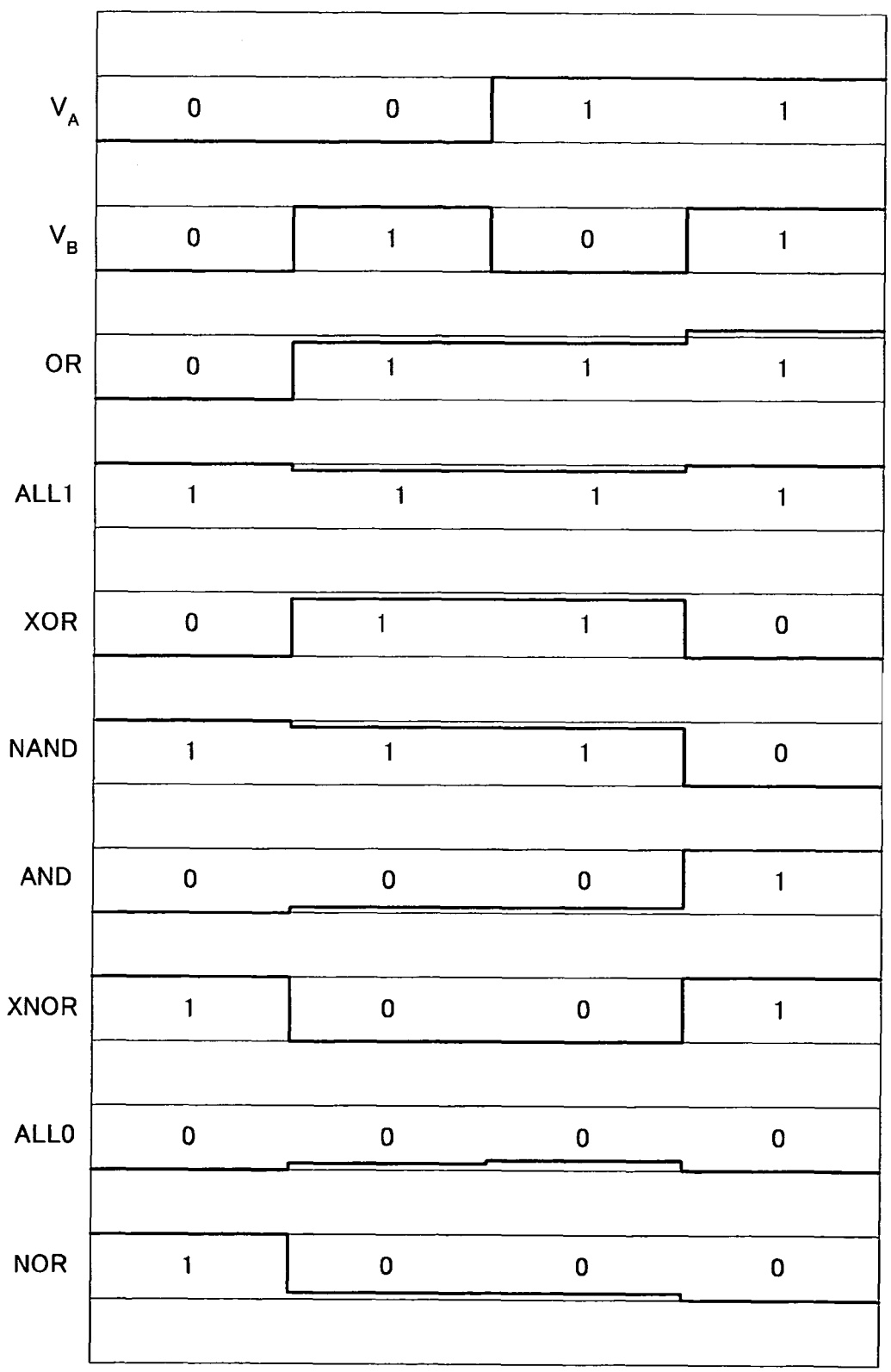
FIG. 29 shows the results of simulations performed on the outputs of all the symmetric Boolean functions of the logic circuit in accordance with the fourth embodiment.

Table 5 shows a truth table of the logic circuit in accordance with the fourth embodiment. Simulations of the output $V_{out}$ of the fourth embodiment were carried out. FIG. 26, FIG. 27, and FIG. 28 show the resistance values, the capacitance values, and the voltage values that were used in the simulations. The line A of FIG. 26 is connected to the line A of FIG. 27, and the line B of FIG. 26 is connected to the line B of FIG. 28. FIG. 29 shows the results of the simulations. More specifically, FIG. 29 shows the output $V_{out}$ of the output terminal 282 of the INV2 (360) of each function (OR, ALL1, XOR, NAND, AND, XNOR, ALL0, and NOR) observed when the input $V_A$ of the first input terminal 220 and the input $V_B$ of the second input terminal 221 are "0" or "1". With the low level being standardized with "0" and the high level being standardized with "1", the lower line of each of OR, ALL1, XOR, NAND, AND, XNOR, ALL0, and NOR indicates "0", and the upper line indicates "1".

TABLE 5

| | | | | | | | | $V_m$ | | | |
|---|---|---|---|---|---|---|---|---|---|---|---|
| SEST1 | SEST2 | SEST3 | SEST4 | $V_A$ $V_B$ | 0 0 | 0/1 1/0 | 1 1 | $V_{out}$ (in order of Vm) | | | function |
| AP | P  | AP | AP | | "1" | "0" | "0" | "0" | "1" | "1" | OR |
| AP | P  | AP | P  | | "0" | "0" | "0" | "1" | "1" | "1" | ALL1 |
| AP | P  | P  | AP | | "1" | "0" | "1" | "0" | "1" | "0" | XOR |
| AP | P  | P  | P  | | "0" | "0" | "1" | "1" | "1" | "0" | NAND |
| P  | AP | AP | AP | | "1" | "1" | "0" | "0" | "0" | "1" | AND |
| P  | AP | AP | P  | | "0" | "1" | "0" | "1" | "0" | "1" | XNOR |
| P  | AP | P  | AP | | "1" | "1" | "1" | "0" | "0" | "0" | ALL0 |
| P  | AP | P  | P  | | "0" | "1" | "1" | "1" | "0" | "0" | NOR |

By switching the magnetization arrangement of the SEST1 (200), SEST2 (210), SEST3 (230), and SEST4 (240) between the parallel arrangement (P) and the antiparallel arrangement (AP), or in other words by changing the magnetization direction of each ferromagnetic island having a variable magnetization direction, it is possible to realize a logic circuit that can reconfigure all the symmetric Boolean functions (OR, ALL1, XOR, NAND, AND, XNOR, ALL0, and NOR) in a nonvolatile manner. Further, as in the third embodiment, by varying the weights of the analog inputs from the first input terminal and the second input terminal to the first inverter circuit, the third inverter circuit, and the fourth inverter circuit, it is possible to reconfigure a asymmetric Boolean function in a nonvolatile manner.

As can be seen from Table 5, all the symmetric Boolean functions can be reconfigured with the output $V_m$ of the output terminal 222 of the INV1 (350) that does not pass through the INV2 (360).

As described above, in accordance with the fourth embodiment, by varying the magnetization direction of each ferromagnetic island having a variable magnetization direction, all the symmetric Boolean functions can be reconfigured in a nonvolatile manner. Furthermore, as SESTs are used as transistors, the charge amount to be controlled is small. Accordingly, analog inputs can be made by combining the small gate capacitances between the islands and gates. With this structure, there is no need to use a floating gate that requires an area 100 or more times as large as the area of a transistor, as in the conventional technique 3.

Accordingly, to achieve the same functions, the circuit area can be made very small, compared with the circuit area obtained by the conventional technique 3. Further, the power consumption and the area of each SEST as a transistor are small. Thus, this embodiment can provide a logic circuit that can reconfigure all the symmetric Boolean functions in a nonvolatile manner, and has a small circuit area and small power consumption.

Fifth Embodiment

Figure 30A:
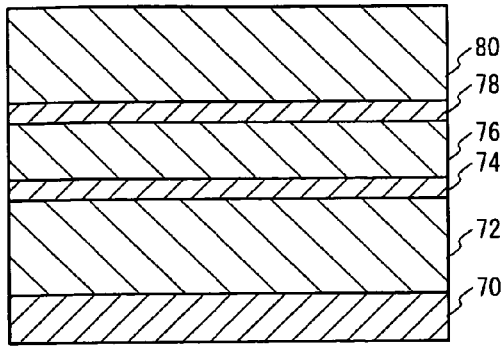
FIGS. 30A through 30F are cross-sectional views illustrating the method for manufacturing a SEST in accordance with a fifth embodiment.
Figure 30D:
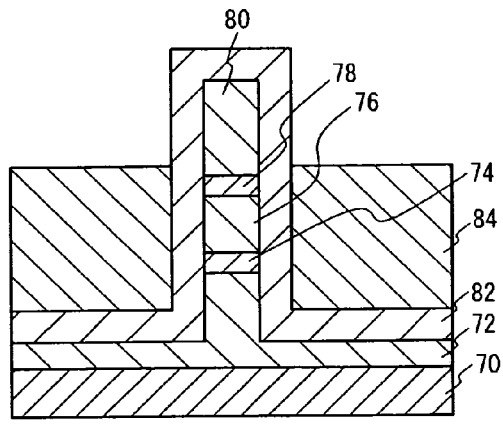
Figure 30B:
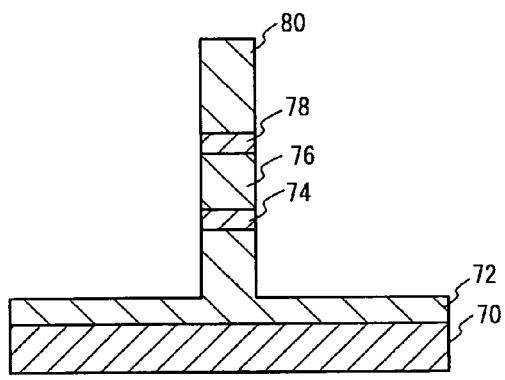
Figure 30E:
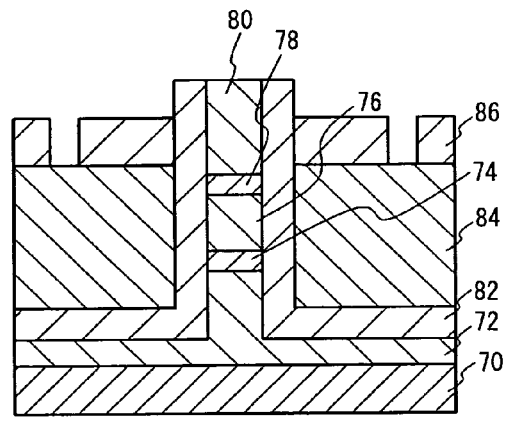
Figure 30C:
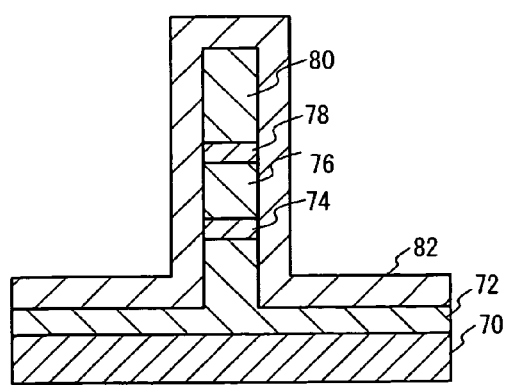
Figure 30F:
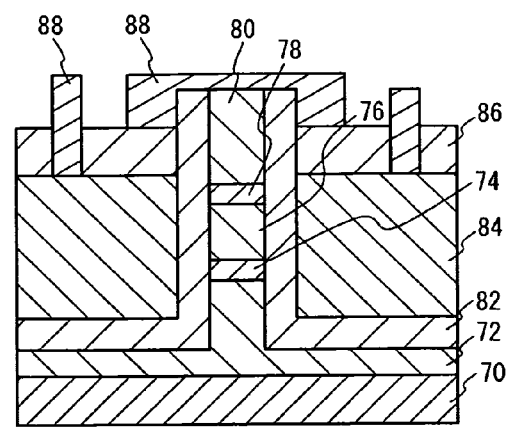

A fifth embodiment is the SEST described with reference to FIGS. 9A through 9F. Referring now to FIGS. 30A through 30F, the method for manufacturing the SEST in accordance with the fifth embodiment is described in detail. An 20-nm thick iron (Fe) film as the source 72, a 2.5-nm thick magnesium oxide (MgO) film as the tunnel junction 74, a 5-nm thick iron (Fe) film as the island 76, a 2.5-nm thick magnesium oxide (MgO) film as the tunnel junction 78, and a 50-nm thick iron (Fe) film as a drain 80 are stacked to form a hetero structure on a magnesium oxide (MgO) substrate 70 by MBE, for example (FIG. 30A). Etching is then performed on the stacked films to reach the source 72, except for a predetermined region, by electron beam exposure and the ion milling technique. In this manner, a pillar structure of 50 nm×100 nm is formed (FIG. 30B). As the insulating film 82 to form a gate capacitance, a 10-nm thick silicon nitride film is formed by plasma CVD. By isotropically forming a silicon nitride film, the 10-nm silicon nitride film can be formed on the sides of the pillar (FIG. 30C). As the gate 84, a 20-nm thick aluminum (Al) film is formed by a deposition technique (FIG. 30D). The aluminum film is deposited in an oblique direction. The 40-nm thick silicon nitride film 86 is formed by plasma CVD, so as to form contact holes at predetermined spots (FIG. 30E). The wiring layer 88 is formed with aluminum (Al) by a deposition technique (FIG. 30F).

As described above, since each film is formed by MBE, plasma CVD, or the deposition technique, the film thickness of each film can be accurately controlled in the film formation. Particularly, a film thickness can be controlled by the atomic layer (approximately 0.2 to 0.3 nm) by MBE. Accordingly, the film thicknesses of the island 76 and the tunnel junctions 74 and 78 can be controlled by the atomic layer. Also, a film thickness can be controlled by the nanometer by plasma CVD. Accordingly, the film thickness of the insulating film 82 can be controlled by the nanometer. The material of each of the source 72, the island 76, and the drain 80 should be a ferromagnetic material, and may be a single metal such as iron or cobalt (Co), an alloy such as iron cobalt (FeCo), a compound metal such as manganese arsenide (MnAs) or chromium arsenide, or a ferromagnetic semiconductor such as GaMnAs or $Fe_3Si$. The material of each of the tunnel junctions 74 and 78 should be an insulating material, and may be an oxide such as MgO or a semiconductor such as GaAs or AlAs.

Referring now to FIGS. 31A through 32C, the method of changing the magnetization direction of the island 76 of the SEST by performing spin injection in accordance with the fifth embodiment (the spin-injection magnetization reversal method) is described. FIGS. 31A through 32C are schematic views of the source 72, the tunnel junction 74, the island 76, the tunnel junction 78, and the drain 80. The arrow of each electron 90 indicates the direction of the magnetic moment of the electron (carrier), the larger arrows indicate the magnetization directions of the source 72, the island 76, and the drain 80. The drain 80 is designed to have a greater film thickness or a higher spin polarization rate than the source 72.

First, referring to FIGS. 31A through 31C, the method of changing a magnetization direction from the antiparallel arrangement to the parallel arrangement is described. As shown in FIG. 31A, the source 72 and the drain 80 have the rightward magnetization direction, while the island 76 has the leftward magnetization direction. Accordingly, the magnetic moment of the electron spins in the source 72 and the drain 80 is rightward, and the magnetic moment caused by the electron spins in the island 76 is leftward. As shown in FIG. 31B, electrons are caused to flow from the drain 80 toward the source 72 in the direction indicated by arrows 95 drawn with broken lines. Since the drain 80 has the greater film thickness or the higher spin polarization, most of the electrons passing through the drain 80 have the rightward spin magnetic moment. Therefore, electrons having the rightward spin magnetic moment tunnel through the tunnel junction 78 and are injected into the island 76. Meanwhile, the electrons having the leftward spin magnetic moment in the island 76 pass through the source 72 and move to the outside. Since the source 72 has the smaller film thickness or the lower spin polarization, the electrons having the leftward spin magnetic moment are not easily reflected by the source 72, unlike in the case of the drain 80 shown in FIG. 32B. As shown in FIG. 31C, when the number of electrons having the rightward spin magnetic moment in the island 76 increases, the magnetization direction of the island 76 is affected by the magnetic moment of the spin-polarized electrons, and is changed to the rightward direction. In this manner, the magnetization direction of the island 76 can be changed from the antiparallel arrangement to the parallel arrangement.

Referring now to FIGS. 32A through 32C, the method of changing a magnetization direction from the parallel arrangement to the antiparallel arrangement is described. As shown in FIG. 32A, the island 76 has the rightward magnetization direction, like the source 72 and the drain 80. Accordingly, the electrons in the island 76 have the rightward spin magnetic moment. As shown in FIG. 32B, electrons are caused to flow from the source 72 toward the drain 80 in the direction indicated by arrows 96 drawn with broken lines. Most of the electrons passing through the source 72 have the rightward spin magnetic moment. However, the source 72 has the smaller film thickness or the lower spin polarization rate, the electrons passing through the source 72 include electrons that are spin-polarized leftward. As indicated by an arrow 92, the electrons having the rightward spin magnetic moment among the electrons injected from the source 72 tunnel through the tunnel junction 78 and enter the drain 80. However, as indicated by an arrow 93, the electrons having the leftward spin magnetic moment are reflected by the magnetization of the drain 80, and return to the island 76. As shown in FIG. 32C, as the number of electrons having the leftward spin magnetic moment in the island 76 increases, the magnetization direction of the island 76 is changed to the leftward direction by the magnetic moment of the spin-polarized electrons. In this manner, the magnetization direction can be changed from the parallel arrangement to the antiparallel arrangement.

In the case where a pulse current is applied to the wires 58 and 60 as described with reference to FIGS. 8A through 8C, the coercivity increases as the island 52 becomes smaller. Accordingly, the current flowing through the wires 58 and 60 to invert the magnetization (the threshold current) becomes larger. In the spin-injection magnetization reversal method described with reference to FIGS. 31A through 32C, on the other hand, the threshold current for reversing magnetization depends on the volume of the island 76. Accordingly, as the island 76 becomes smaller, the threshold current becomes smaller. Therefore, the spin-injection magnetization reversal method is suitable for higher integration. For example, in a case of an island that is made of cobalt and has an oval shape of 2 nm in thickness and 60 nm×180 nm in size, the coercivity of this island is 150 Oe. In a case where this island is to be reversed with the use of the wires 58 and 60 shown in FIGS. 8A through 8D, and the wires 58 and 60 are located at a distance of 600 nm from the island, the threshold current is 45 mA. In the case where the spin-injection magnetization reversal method is utilized for the same island, the threshold current is approximately 4 mA. In this manner, the threshold current for magnetization reversal can be made smaller, and the power consumption for changing the magnetization direction can be restricted by the spin-injection magnetization reversal method. Furthermore, the wires 58 and 60 become unnecessary, and the circuit structure can be simplified.

Figure 33:
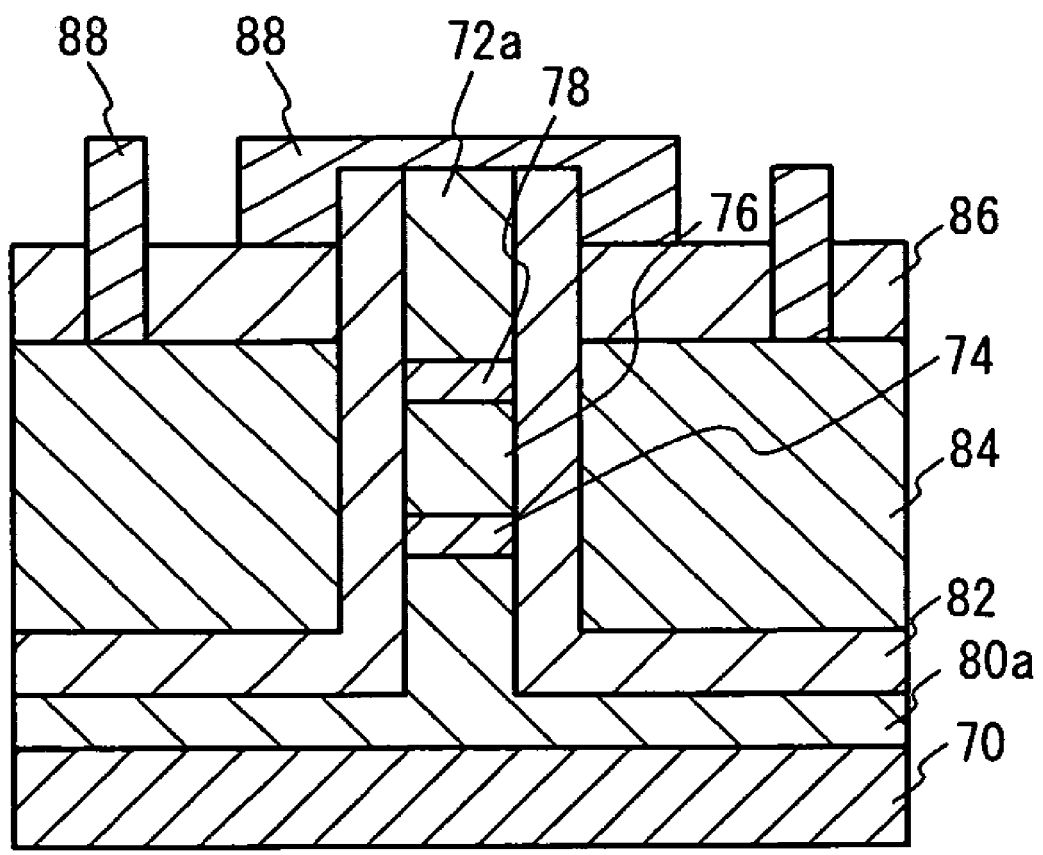
FIG. 33 is a cross-sectional view of a SEST in accordance with a modification of the fifth embodiment.

FIG. 33 is a cross-sectional view of a SEST in accordance with a modification of the fifth embodiment. The SEST of this modification has the same structure as the SEST of the fifth embodiment shown in FIG. 30F, except that the positions of a drain 80a and a source 72a are the opposite of the positions of the drain and the source shown in FIG. 30F. The other aspects of the structure of this modification are the same as those of the fifth embodiment shown in FIG. 30F. Therefore, the same components as those shown in FIG. 30F are denoted by the same reference numerals as those in FIG. 30F, and explanation of them is omitted here. In this manner, the drain 80a may be located on the side of the substrate 70, and the source 72a may be located on the surface side.

The SEST in accordance with the fifth embodiment includes the substrate 70, the source 72 formed on the substrate 70, the island 76 that is formed on the source 72 and has the tunnel junction 74 between the source 72 and the island 76, and the drain 80 that is formed on the island 76 and has the tunnel junction 78 between the island 76 and the drain 80. The SEST further includes the gate 84 that is formed on a side of the island 76 and is capacitively coupled to the island 76 via the insulating film 82 filling the space between the island 76 and the gate 84. At least one of the source 72, the drain 80, and the island 76 includes a ferromagnetic material having a variable magnetization direction, so that the structure can function as a single-electron spin transistor. In this manner, the source 72, the tunnel junction 74, the island 76, the tunnel junction 78, and the drain 80 are stacked in the vertical direction, so that the film thickness of each layer can be accurately controlled. Thus, the degree of freedom in transistor design is increased, and the desired characteristics can be easily obtained. Also, since the transistor is formed in the vertical direction, the transistor area can be made smaller, and higher integration can be achieved. As in the modification of the fifth embodiment, a SEST may include the drain 80a formed on the substrate 70, the island 76 that is formed on the drain 80a and has the tunnel junction 74 between the drain 80a and the island 76, and the source 72a that is formed on the island 76 and has the tunnel junction 78 between the island 76 and the source 72a.

As in the fifth embodiment, the source 72 and the drain 80 may include ferromagnetic materials magnetized in the same direction, and the island may include a ferromagnetic material having a variable magnetization direction. Accordingly, by the spin-injection magnetization reversal method described with reference to FIGS. 31A through 32C, the magnetization direction of the island 76 can be changed. In the SEST described with reference to FIG. 7, the thicknesses of the tunnel junctions (equivalent to the distance between the island 52 and the source 54, and the distance between the island 52 and the drain 56) and the volume of the island 52 are determined by the opening size of the upper-layer resist 44 shown in FIG. 6 and the angle of the deposition or the like. Therefore, it is difficult to control the thicknesses of the tunnel junctions, and the resistance values of the tunnel junctions vary. The volume of the island 52 also varies. As a result, when the spin-injection magnetization reversal method is utilized for the SEST shown in FIG. 7, the threshold current varies. In the SEST in accordance with the fifth embodiment, on the other hand, the film thicknesses of the tunnel junction 74 and the island 76 can be set with high precision. Accordingly, the variation in threshold current can be made smaller. In this manner, the SEST in accordance with the fifth embodiment can restrain the variation in threshold variation when the spin-injection magnetization reversal method is utilized.

Further, the magnetization direction of the island 76 can be changed by injecting carriers (electrons) from the drain 80 into the island 76. In this manner, by the spin-injection magnetization reversal method, the power consumption for changing the magnetization direction of the island 76 can be reduced as described above.

Also, since the drain 80 has a greater film thickness than the source 72 or has a higher spin polarization rate than the source 72, the magnetization direction of the island 76 can be changed from the antiparallel arrangement to the parallel arrangement when electrons are caused to flow from the drain 80 to the source 72, as shown in FIGS. 31A through 31C. Also, the magnetization direction of the island 76 can be changed from the parallel arrangement to the antiparallel arrangement when electrons are caused to flow from the source 72 to the drain 80, as shown in FIGS. 32A through 32C.

In the example cases shown in FIGS. 31A through 32C, carriers are used as electrons. However, it is possible to use holes. Also, in those example cases, the drain 80 has a greater film thickness or a higher spin polarization than the source 72. However, the source 72 may have a greater film thickness or a higher spin polarization than the drain 80.

Sixth Embodiment

Figure 34A:
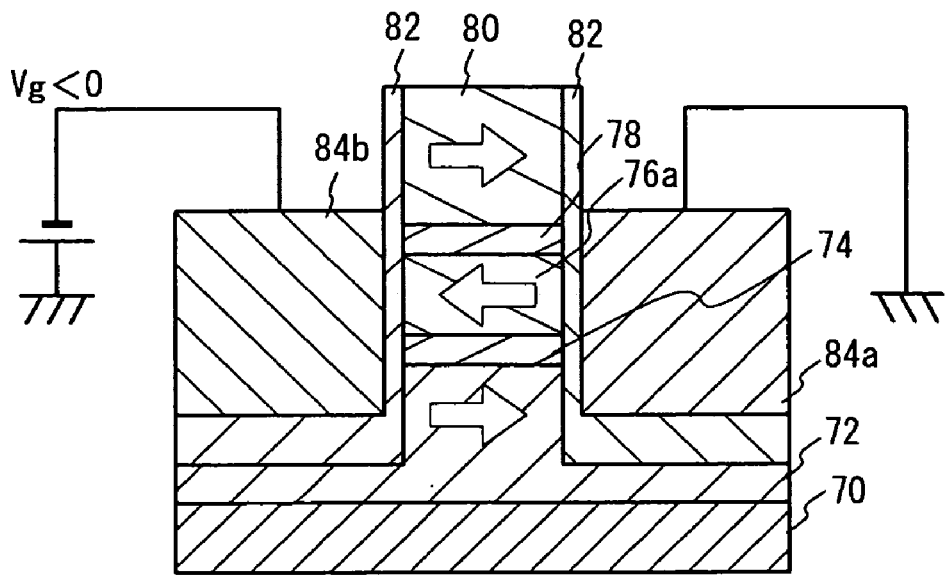
FIGS. 34A and 34B illustrate the method of varying the magnetization intensity of the island of a SEST in accordance with a sixth embodiment.
Figure 34B:
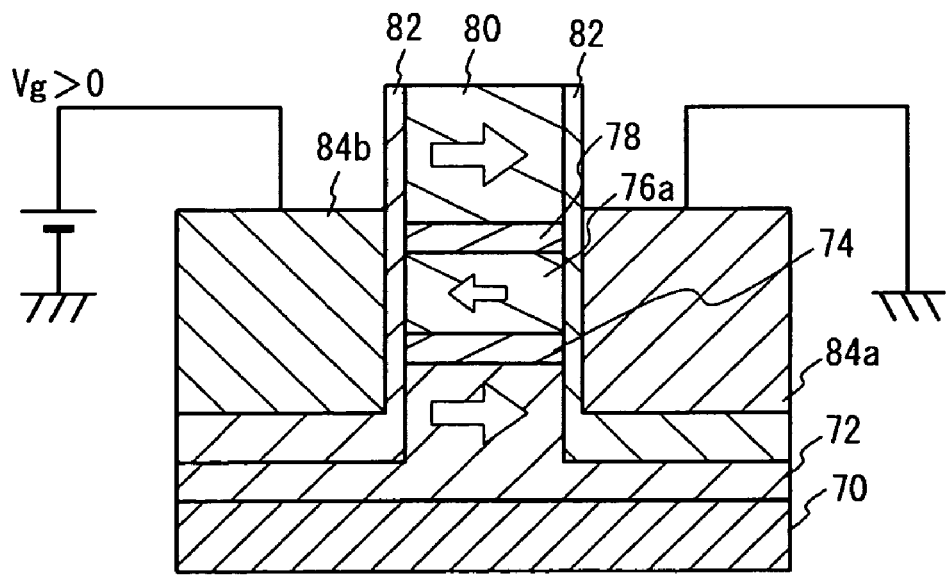

A sixth embodiment is an example of a SEST having a carrier-induced ferromagnetic semiconductor as the island. A carrier-induced ferromagnetic semiconductor is a semiconductor in which magnetization is induced by the carriers existing therein. The magnetization of a carrier-induced ferromagnetic semiconductor becomes stronger, as the carrier density becomes higher. The magnetization of a carrier-induced ferromagnetic semiconductor becomes weaker, as the carrier density becomes lower. A carrier-induced ferromagnetic semiconductor may be GaMnAs or InMaAs, for example. As shown in FIGS. 34A and 34B, the SEST in accordance with the sixth embodiment has an island 76a formed with a carrier-induced ferromagnetic semiconductor. The other aspects of this embodiment are the same as those of the fifth embodiment. Therefore, the same components as those of the fifth embodiment are denoted by the same reference numerals as those used in the fifth embodiment, and explanation of them is omitted here. As shown in FIG. 34A, a gate 84a on the right-hand side is grounded, and a gate 84b on the left-hand side has a negative voltage applied thereto or is left floating. Here, the hole density in the island 76a is high and has stronger ferromagnetism. In FIG. 34B, on the other hand, the gate 84a on the right-hand side is grounded, and the gate 84b on the left-hand side has a positive voltage applied thereto. Due to the electric field generated in the island 76a, the hole density in the island 76a becomes lower. As a result, the magnetization of the island 76a becomes weaker. With the magnetization of the island 76a being weakened, the threshold current for changing the magnetization direction can be made 100 or more times smaller by the spin-injection magnetization reversal method.

In accordance with the sixth embodiment, the island 76a is a carrier-induced ferromagnetic semiconductor film. Accordingly, the carrier density in the island 76a can be changed by the electric field induced in the island 76a, and the magnetization of the island 76a can be changed. Also, the gates 84a and 84b are formed on both sides of the island 76a. The magnetization direction of the island 76a is changed by applying a voltage between the gates 84a and 84b, and injecting carriers (holes) from the drain 72 into the island 76a. The voltage applied between the gates 84a and 84b is such a voltage as to reduce the carries in the island 76a. In this manner, the magnetization direction of the island 76a is changed by reducing the carrier density in the island 76a and the magnetization of the island 76a. Thus, the power consumption required for changing the magnetization direction of the island 76a can be made even smaller than the power consumption required for changing the magnetization direction in the fifth embodiment.

In the sixth embodiment, the carrier-induced ferromagnetic semiconductor forming the island 76a is a semiconductor that has its magnetization induced by the hole density. However, it is possible to use a semiconductor that has its magnetization induced by electron density.

Although a few preferred embodiments of the present invention have been shown and described, the present invention is not limited to those embodiments, and various changes and modifications may be made to them without departing from the principles and spirit of the invention, the scope of which is defined in the claims and their equivalents.

The invention claimed is:

1. A logic circuit comprising:
   a single-electron spin transistor that includes:
     a source, a drain, an island that is provided between the source and the drain, a gate that is capacitively coupled to the island, a tunnel junction being provided between the source and the island, and another tunnel junction being provided between the drain and the island,
   at least one of the source, the drain, and the island including a ferromagnetic material having a variable magnetization direction,
   wherein a logic threshold value of an inverter circuit including the single-electron spin transistor is reconfigured in a nonvolatile manner by changing the variable magnetization direction of the ferromagnetic material of the single-electron spin transistor.

2. The logic circuit as claimed in claim 1, wherein:
   the source and the drain of the single-electron spin transistor include ferromagnetic materials magnetized in the same direction; and the island includes the ferromagnetic material having the variable magnetization direction.

3. The logic circuit as claimed in claim 1, wherein:
the single-electron spin transistor further includes a substrate;
the island, the source, the drain, and the gate are formed on the substrate;
the source, the drain, and the gate are formed on sides of the island; and
the gate is capacitively coupled to the island via a space existing between the gate and the island.

4. A logic circuit comprising:
a single-electron spin transistor that includes:
a source, a drain, an island that is provided between the source and the drain, a gate that is capacitively coupled to the island, a tunnel junction being provided between the source and the island, and another tunnel junction being provided between the drain and the island, at least one of the source, the drain, and the island including a ferromagnetic material having a variable magnetization direction,
wherein:
the single-electron spin transistor further includes a substrate;
the source, the drain, and the island are stacked on the substrate;
the gate is formed on a side of the island; and
the gate is capacitively coupled to the island via a space existing between the gate and the island.

5. A logic circuit comprising:
a single-electron spin transistor that includes:
a source, a drain, an island that is provided between the source and the drain, a gate that is capacitively coupled to the island, a tunnel junction being provided between the source and the island, and another tunnel junction being provided between the drain and the island,
at least one of the source, the drain, and the island including a ferromagnetic material having a variable magnetization direction,
wherein a function of a Boolean logic circuit is reconfigured in a nonvolatile manner by changing the variable magnetization direction of the ferromagnetic material of the single-electron spin transistor.

6. A logic circuit comprising:
a plurality of single-electron spin transistors, each of the plurality of single-electron spin transistors including a source, a drain, an island that is provided between the source and the drain, a gate that is capacitively coupled to the island, a tunnel junction being provided between the source and the island, and another tunnel junction being provided between the drain and the island, at least one of the source, the drain, and the island including a ferromagnetic material having a variable magnetization direction; and
a plurality of input terminals,
weighting of analog inputs from the plurality of input terminals to the plurality of single-electron spin transistors is performed with a plurality of gate capacitances of the respective single-electron spin transistors connected to the respective input terminals.

7. A logic circuit comprising:
a first inverter circuit that includes: a first single-electron spin transistor that has a source connected to an output terminal, a gate connected to an input terminal, and a drain connected to a first power supply terminal; and
a second single-electron spin transistor that has a drain connected to the output terminal, a gate connected to the input terminal, and a source connected to a second power supply terminal,
wherein each of the first single-electron spin transistor and the second single-electron spin transistor includes:
an island provided between the source and the drain, the gate is capacitively coupled to the island;
a tunnel junction provided between the source and the island; and
another tunnel junction provided between the drain and the island, at least one of the source, the drain, and the island including a ferromagnetic material having a variable magnetization direction.

8. The logic circuit as claimed in claim 7, wherein:
when "0" is input to the input terminal, the first single-electron spin transistor is switched on, and the second single-electron spin transistor is switched off; and
when "1" is input to the input terminal, the first single-electron spin transistor is switched off, and the second single-electron spin transistor is switched on.

9. The logic circuit as claimed in claim 7, wherein the first inverter circuit switches logic threshold values between a case where a magnetization arrangement of the first single-electron spin transistor is a parallel arrangement while a magnetization arrangement of the second single-electron spin transistor is an antiparallel arrangement, and a case where the magnetization arrangement of the first single-electron spin transistor is an antiparallel arrangement while the magnetization arrangement of the second single-electron spin transistor is a parallel arrangement.

10. The logic circuit as claimed in claim 7, wherein:
in the first inverter circuit,
the input terminal includes a first input terminal and a second input terminal; and
a combination of an input to the first input terminal and an input to the second input terminal is analog inputs to the first inverter circuit.

11. The logic circuit as claimed in claim 10, wherein:
in the first inverter circuit,
the first input terminal is connected to a first gate of the first single-electron spin transistor and to a first gate of the second single-electron spin transistor; and
the second input terminal is connected to a second gate of the first single-electron spin transistor and to a second gate of the second single-electron spin transistor.

12. The logic circuit as claimed in claim 9, wherein:
in the first inverter circuit,
weighting of an analog input of an input from the first input terminal to the first single-electron spin transistor is substantially the same as weighting of an analog input of the input from the first input terminal to the second single-electron spin transistor; and
weighting of an analog input of an input from the second input terminal to the first single-electron spin transistor is substantially the same as weighting of an analog input of the input from the second input terminal to the second single-electron spin transistor.

13. The logic circuit as claimed in claim 11, wherein:
in the first inverter circuit,
a capacitance value of a first gate capacitance of the first single-electron spin transistor is substantially the same as a capacitance value of a first gate capacitance of the second single-electron spin transistor; and
a capacitance value of a second gate capacitance of the first single-electron spin transistor is substantially the same as a capacitance value of a second gate capacitance of the second single-electron spin transistor.

14. The logic circuit as claimed in claim 12, wherein, in the first inverter circuit, the weighting of the analog inputs of the input from the first input terminal to the first single-electron spin transistor and the second single-electron spin transistor is substantially the same as the weighting of the analog inputs of the input from the second input terminal to the first single-electron spin transistor and the second single-electron spin transistor.

15. The logic circuit as claimed in claim 13, wherein:
in the first inverter circuit,
the capacitance values of the first gate capacitance of the first single-electron spin transistor is substantially the same as the first gate capacitance of the second single-electron spin transistor;
the capacitance values of the second gate capacitance of the first single-electron spin transistor is substantially same as the second gate capacitance of the second single-electron spin transistor.

16. The logic circuit as claimed in claim 14, wherein, in the first inverter circuit, the weighting of the analog inputs of the input from the first input terminal to the first single-electron spin transistor and the second single-electron spin transistor is different from the weighting of the analog inputs from the second input terminal to the first single-electron spin transistor and the second single-electron spin transistor.

17. The logic circuit as claimed in claim 15, wherein, in the first inverter circuit, the capacitance values of the first gate capacitance of the first single-electron spin transistor and the first gate capacitance of the second single-electron spin transistor are different from the capacitance values of the second gate capacitance of the first single-electron spin transistor and the second gate capacitance of the second single-electron spin transistor.

18. The logic circuit as claimed in claim 10, wherein:
the first inverter circuit has a function of a two-input NOR circuit in a case where the magnetization arrangement of the first single-electron spin transistor is the antiparallel arrangement while the magnetization arrangement of the second single-electron spin transistor is the parallel arrangement; and
the first inverter circuit has a function of a two-input NAND circuit in a case where the magnetization arrangement of the first single-electron spin transistor is the parallel arrangement while the magnetization arrangement of the second single-electron spin transistor is the antiparallel arrangement.

19. The logic circuit as claimed in claim 10, wherein the output terminal of the first inverter circuit is connected to an input terminal of a second inverter circuit, to form a two-input OR circuit function and a two-input AND circuit function.

20. The logic circuit as claimed in claim 19, wherein the second inverter circuit is an inverter circuit including a single-electron transistor.

21. The logic circuit as claimed in claim 10, comprising:
the first inverter circuit;
a third single-electron spin transistor that has a source connected to the output terminal of the first inverter circuit and a drain connected to a third power supply terminal; and
a fourth single-electron spin transistor that has a drain connected to the output terminal of the first inverter circuit and a source connected to a fourth power supply terminal,
wherein each of the third single-electron spin transistor and the fourth single-electron spin transistor includes:
an island provided between the source and the drain, the gate is capacitively coupled to the island;
a tunnel junction provided between the source and the island; and
another tunnel junction provided between the drain and the island, at least one of the source, the drain and the island including a ferromagnetic material having a variable magnetization direction.

22. The logic circuit as claimed in claim 21, wherein:
when "0" is output from the first inverter circuit, the third single-electron spin transistor is switched on, and the fourth single-electron spin transistor is switched off; and
when "1" is output from the first inverter circuit, the third single-electron spin transistor is switched off, and the fourth single-electron spin transistor is switched on.

23. The logic circuit as claimed in claim 21, further comprising:
a third inverter circuit that has an input terminal connected to the first input terminal and the second input terminal of the first inverter circuit, an output terminal connected to a gate of the third single-electron spin transistor, and has a logic threshold value greater than 0.5; and
a fourth inverter circuit that has an input terminal connected to the first input terminal and the second input terminal of the first inverter circuit, an output terminal connected to a gate of the fourth single-electron spin transistor, and has a logic threshold value smaller than 0.5.

24. The logic circuit as claimed in claim 23, wherein weighting of analog inputs from the first input terminal and the second input terminal to the third inverter circuit, and weighting of analog inputs from the first input terminal and the second input terminal to the fourth inverter circuit are substantially the same as weighting of analog inputs from the first input terminal and the second input terminal to the first inverter circuit.

25. The logic circuit as claimed in claim 23, wherein each of the third inverter circuit and the fourth inverter circuit is an inverter circuit including a single-electron transistor.

26. The logic circuit as claimed claim 21, further comprising a fifth inverter circuit that has an input terminal connected to the output terminal of the first inverter circuit.

27. The logic circuit as claimed in claim 26, wherein the fifth inverter circuit is an inverter circuit including a single-electron transistor.

28. The logic circuit as claimed in claim 21, which has a circuit that can realize all Boolean symmetrical functions by switching the magnetization arrangement of each of the first single-electron spin transistor, the second single-electron spin transistor, the third single-electron spin transistor, and the fourth single-electron spin transistor, between the parallel arrangement and the antiparallel arrangement.

29. A single-electron spin transistor comprising:
a substrate;
a source that is formed on the substrate;
an island that is formed on the source and has a tunnel junction between the source and the island;
a drain that is formed on the island and has a tunnel junction between the island and the drain; and
a gate that is formed on a side of the island, and is capacitively coupled to the island via a space existing between the island and the gate,
wherein at least one of the source, the drain, and the island includes a ferromagnetic material having a variable magnetization direction.

30. A single-electron spin transistor comprising:
a substrate;
a drain that is formed on the substrate;
an island that is formed on the drain and has a tunnel junction between the drain and the island;
a source that is formed on the island and has a tunnel junction between the island and the source; and
a gate that is formed on a side of the island, and is capacitively coupled to the island via a space existing between the island and the gate,
wherein at least one of the source, the drain, and the island includes a ferromagnetic material having a variable magnetization direction.

31. The single-electron spin transistor as claimed in claim 29, wherein:
the source and the drain include ferromagnetic materials magnetized in the same direction; and
the island includes the ferromagnetic material having the variable magnetization direction.

32. The single-electron spin transistor as claimed in claim 31, wherein the magnetization direction of the island is changed by injecting carriers from the source or the drain into the island.

33. The single-electron spin transistor as claimed in claim 32, wherein one of the source and the drain has a greater film thickness than the other one of the source and the drain.

34. The single-electron spin transistor as claimed in claim 32, wherein one of the source and the drain has a higher spin polarization than the other one of the source and the drain.

35. The single-electron spin transistor as claimed in claim 31, wherein the island is a carrier-induced ferromagnetic semiconductor film.

36. The single-electron spin transistor as claimed in claim 33, wherein:
the gate is provided on either side of the island; and
the magnetization direction of the island is changed by applying a voltage between the gates and injecting carriers from the source or the drain into the island.

37. The single-electron spin transistor as claimed in claim 36, wherein the voltage applied between the gates is such a voltage as to reduce carrier density in the island.

38. The single-electron spin transistor as claimed in claim 30, wherein:
the source and the drain include' ferromagnetic materials magnetized in the same direction; and
the island includes the ferromagnetic material having the variable magnetization direction.

39. The single-electron spin transistor as claimed in claim 38, wherein the magnetization direction of the island is changed by injecting carriers from the source or the drain into the island.

40. The single-electron spin transistor as claimed in claim 39, wherein one of the source and the drain has a greater film thickness than the other one of the source and the drain.

41. The single-electron spin transistor as claimed in claim 39, wherein one of the source and, the drain has a higher spin polarization than the other one of the source and the drain.

42. The single-electron spin transistor as claimed in claim 38, wherein the island is a carrier-induced ferromagnetic semiconductor film.

43. The single-electron spin transistor as claimed in claim 40, wherein:
the gate is provided on either side of the, island; and
the magnetization direction of the island is changed by applying a voltage between the gates and injecting carriers from the source or the drain into the island.

44. The single-electron spin transistor as claimed in claim 43, wherein the voltage applied between the sates is such a voltage as to reduce carrier density in the island.

* * * * *